United States Patent [19]

Matsugu et al.

[11] Patent Number: 5,481,363
[45] Date of Patent: Jan. 2, 1996

[54] POSITIONAL DEVIATION DETECTING METHOD

[75] Inventors: Masakazu Matsugu, Tokyo; Kenji Saitoh, Yokohama; Jun Hattori, Zama; Sakae Houryu, Hachiohji, all of Japan

[73] Assignee: Canon Kabushiki Kaisha, Tokyo, Japan

[21] Appl. No.: 242,066

[22] Filed: May 13, 1994

Related U.S. Application Data

[63] Continuation of Ser. No. 693,708, Apr. 30, 1991, abandoned.

[30] Foreign Application Priority Data

| May 1, 1990 | [JP] | Japan | 2-115445 |
| Oct. 11, 1990 | [JP] | Japan | 2-272926 |
| Oct. 11, 1990 | [JP] | Japan | 2-272927 |
| Oct. 11, 1990 | [JP] | Japan | 2-272928 |
| Oct. 11, 1990 | [JP] | Japan | 2-272929 |

[51] Int. Cl.$^6$ .................................................. G01B 11/00
[52] U.S. Cl. ............................................................ 356/401
[58] Field of Search .................................... 356/399–401; 355/43, 53

[56] References Cited

U.S. PATENT DOCUMENTS

| 4,037,969 | 7/1977 | Feldman et al. | 356/172 |
| 4,326,805 | 4/1982 | Feldman et al. | 356/399 |
| 4,514,858 | 4/1985 | Novak | 378/34 |
| 4,870,289 | 9/1989 | Sato et al. | 356/400 |
| 5,114,235 | 5/1992 | Suda et al. | 356/401 |
| 5,148,038 | 9/1992 | Nose et al. | 356/401 |
| 5,225,892 | 7/1993 | Matsugu et al. | 356/401 |

FOREIGN PATENT DOCUMENTS

| 0333326 | 9/1989 | European Pat. Off. . |
| 0358514 | 3/1990 | European Pat. Off. . |
| 56-157033 | 12/1981 | Japan . |

*Primary Examiner*—Richard A. Rosenberger
*Assistant Examiner*—K. P. Hantis
*Attorney, Agent, or Firm*—Fitzpatrick, Cella, Harper & Scinto

[57] ABSTRACT

A method of detecting a relative positional deviation of a first object having a first grating mark with an optical power and a second object having a second grating mark with an optical power, is disclosed, wherein a projected radiation beam is diffracted by the first and second grating marks in sequence and, on the basis of a position of convergence on a light receiving surface of plural diffraction beams produced by the diffraction through the first and second grating marks and including a signal beam having been diffracted at a predetermined order by each of the first and second grating marks, the relative positional deviation is determined, a detection zone is defined on the light receiving surface, the signal beam is converged upon the detection zone, and a predetermined diffraction beam of the plural diffraction beams which, for a relative positional deviation of the first and second objects, shows displacement different from that of the signal beam is substantially prevented from being converged upon the detection zone.

29 Claims, 18 Drawing Sheets

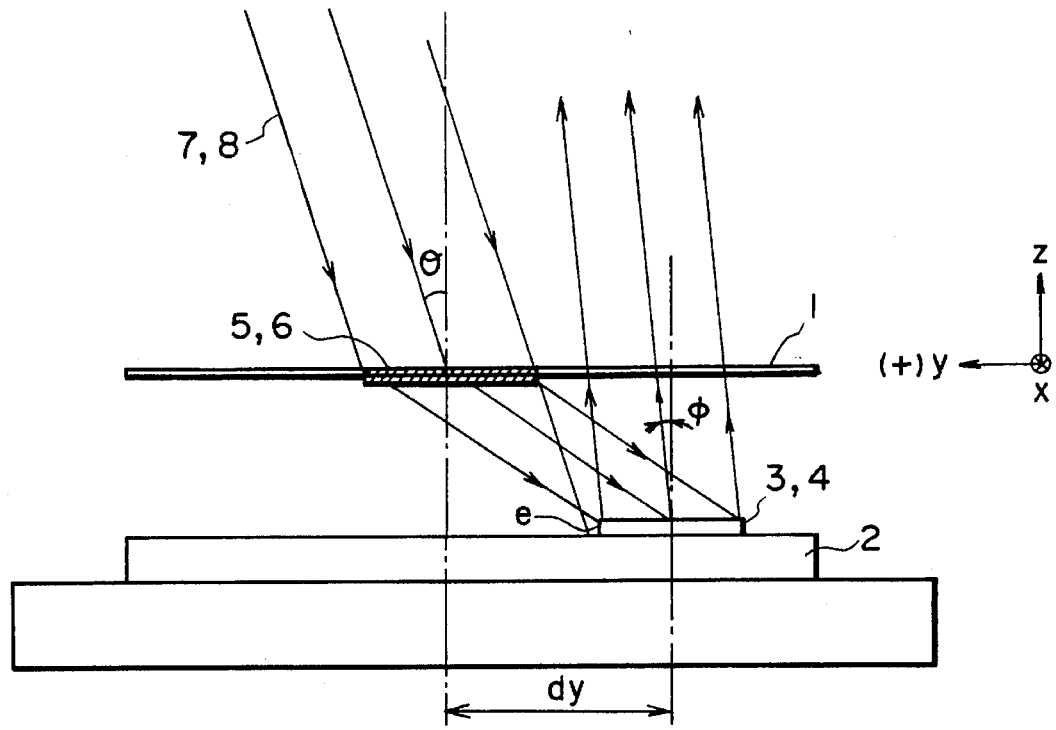
F I G. 15
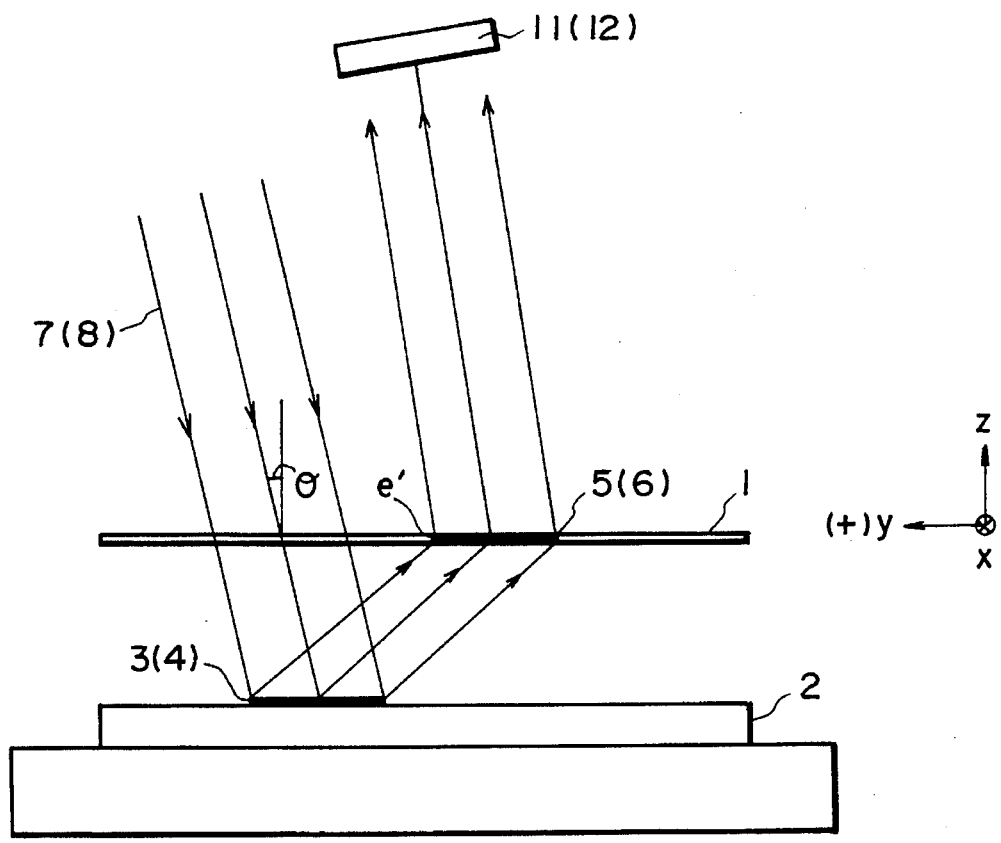
F I G. 16

POSITIONAL DEVIATION DETECTING METHOD

This application is a continuation of prior application, Ser. No. 07/693,708 filed Apr. 30, 1991, now abandoned.

FIELD OF THE INVENTION AND RELATED ART

This invention relates to a positional deviation detecting method usable in a semiconductor device manufacturing exposure apparatus for photolithographic transfer of a fine pattern such as a semiconductor integrated circuit, for detecting positional deviation or the like between a mask (reticle) and a wafer at high precision.

In exposure apparatuses for use in the manufacture of semiconductor devices, the relative alignment of a mask and a wafer is one important factor with respect to ensuring improved performance. Particularly, as for alignment systems employed in recent exposure apparatuses, submicron alignment accuracies or more strict accuracies are required in consideration of the demand for higher degrees of integration of semiconductor devices.

In many types of alignment systems, features called "alignment marks" are provided on a mask and a wafer and, by utilizing positional information obtainable from these marks, the mask and wafer are aligned. As for the manner of executing the alignment, as an example there is a method wherein the amount of relative deviation of these alignment patterns is detected on the basis of image processing. Another method is proposed in U.S. Pat. Nos. 4,037,969 and 4,514,858 and Japanese Laid-Open Patent Application, Laid-Open No. Sho 56-157033, wherein so-called zone plates are used as alignment marks upon which light is projected and wherein the positions of light spots formed on a predetermined plane by lights from the illuminated zone plates are detected.

Generally, an alignment method utilizing a zone plate is relatively insensitive to any defect of an alignment mark and therefore assures relatively high alignment accuracies, as compared with an alignment method simply using a traditional alignment mark.

FIG. 1 is a schematic view of a known type alignment system utilizing zone plates. As an example, this type of position detecting system is disclosed in European Patent Application 0,333,326A2, filed under the name of the assignee of the subject application.

Mask 1 is adhered to a membrane 47 which is supported by a main frame 45 of an aligner through a mask chuck 46. Mask-to-wafer alignment head 44 is disposed above the main frame 45. For alignment of the mask 1 and a wafer 2, a mask alignment mark 3M and a wafer alignment mark 4W are formed on the mask 1 and the wafer 2, respectively.

Light emanating from a light source 40 is transformed by a light projecting lens system 41 into a parallel light which is reflected by a half mirror 42 and impinges on the mask alignment mark 3M. The alignment mark 3M is provided by a transmission type zone plate, and positive first order diffraction light thereof is influenced by a convex lens function, converging at a point Q. The wafer alignment mark 4W is provided by a reflection type zone plate, and it has a convex mirror function (diverging function) for imaging the light, convergent at point Q, upon a detection surface 39.

Here, the signal light having been influenced by negative first order reflective diffraction of the wafer alignment mark 4W is not influenced by any lens function as the same passes through the mask M, and the light transmitted therethrough as zero-th order diffraction light is collected on detection surface 39 of a detector 38. Here, the term "zero-th order diffraction" means simple transmission or specular reflection.

In this Specification, the light influenced by m-th order diffraction by the mask 1 and subsequently influenced by n-th order diffraction by the wafer 2 and again influenced by l-th order diffraction by the mask, will be referred to as "(m, n, l)-th order light". Accordingly, the above-described light can be referred to as "(1, −1, 0)-th order light". This light provides the signal light.

In this type of positional deviation detecting system, any positional deviation between the mask 1 and the wafer 2 is detected on the basis of the position of incidence of the signal light upon the detection surface 39. There is a certain proportional relationship between the positional deviation $\Delta\sigma w$ and the displacement $\Delta\delta w$ of the position of incidence of the signal light upon the detection surface 39. The proportional constant thereof corresponds to the magnification of deviation detection. More specifically, if under such an arrangement the wafer 2 laterally shifts by $\Delta\sigma w$ relative to the mask 1, the position of incidence of the light on the detection surface 39 displaces by $\Delta\delta w$ which can be expressed as follows:

$$\Delta\delta w = \Delta\sigma w \times (bw/aw - 1)$$

Thus, the positional deviation is magnified by:

$$bw/aw - 1$$

This quantity "bw/aw−1" represents the deviation detecting magnification. Here, aw denotes the distance to the wafer from the point Q of convergence of the signal light emanating from the mask, and bw denotes the distance from the wafer to the detection surface 39. By detecting through the detection surface 39 the shift of the position of incidence of the signal light from its reference position as assumed when the mask and the wafer have no relative positional deviation (such a reference position can be determined by trial printing, for example, after the mask is set) and by calculating $\Delta\sigma w$ in accordance with the above-described equation while using the detected shift as the displacement $\Delta\delta w$, it is possible to determine the positional deviation between the mask and the wafer.

On the other hand, there are cases in which, in addition to the (1, −1, 0)-th order light described above, (0, −1, 1)-th order light which is different in diffraction order is nearly focused on the detection surface 39. More specifically, the (0, −1, 1)-th order light is such light as: having been inputted to the mask alignment mark 3M; having been transmitted therethrough at zero-th order; having been reflectively diffracted at negative first order by the wafer alignment mark 4W and influenced by the concave power (diversion) function; further having been transmissively diffracted at positive first order by the mask alignment mark 3M and influenced by the convex power (convergence) function; and nearly focused on the detection surface 39.

FIG. 2 schematically shows propagation of an input light AL, a (1, −1, 0)-th order light L1 and a (0, 1, 1)-th order light L2 as well as an optical arrangement.

Here, generally, between the (1, −1, 0)-th order light and the (0, −1, 1)-th order light, there is a difference in magnification of displacement of the position of incidence to the relative positional deviation of the mask and the wafer. This leads to that, if such a point that, when in the detection surface a position vector of each point in the detection surface is multiplied by the light intensity of that point and the thus obtained products are integrated over the entire detection surface, the integrated value has a "zero vector"

(hereinafter such a point will be referred to as "gravity center" of the light), is taken as the position of incidence of the light, the detection of positional deviation is affected by the (0, −1, 1)-th order light, in addition to the (1, −1, 0)-th order light which is the signal light. This precludes enhanced precision of deviation detection.

Further, when there is a wafer process factor such as a change in thickness of a resist film, for example, or any change in the relative position of the objects, to be aligned, in a direction perpendicular to a particular direction in which the positional deviation is to be detected, the ratio of intensity of these lights changes with such change. This results in a change in the overall deviation detecting magnification of the (1, −1, 0)-th order light and the (0, −1, 1)-th order light and, therefore, it causes an error in the deviation detection.

SUMMARY OF THE INVENTION

It is accordingly a primary object of the present invention to provide an improved positional deviation detecting method, by which enhancement of detection precision is ensured.

In accordance with a first aspect of the present invention, to achieve this object, there is provided a method of detecting a relative positional deviation of a first object having a first grating mark with an optical power and a second object having a second grating mark with an optical power, wherein a projected radiation beam is diffracted by the first and second grating marks in sequence and, on the basis of a position of convergence on a light receiving surface of plural diffraction beams produced by the diffraction through the first and second grating marks and including a signal beam having been diffracted at a predetermined order by each of the first and second grating marks, the relative positional deviation is determined, characterized in that: a detection zone is defined on the light receiving surface; that the signal beam is caused to be converged upon the detection zone; and that a predetermined diffraction beam of the plural diffraction beams which, for a relative positional deviation of the first and second objects, shows displacement different from that of the signal beam is substantially prevented from being converged upon the detection zone.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIGS. 13, 14 and 15 are schematic representations of a fourth embodiment of the present invention.

FIG. 16 is a schematic representation of a modified form of the fourth embodiment.

DESCRIPTION OF THE PREFERRED EMBODIMENTS

Figure 1:
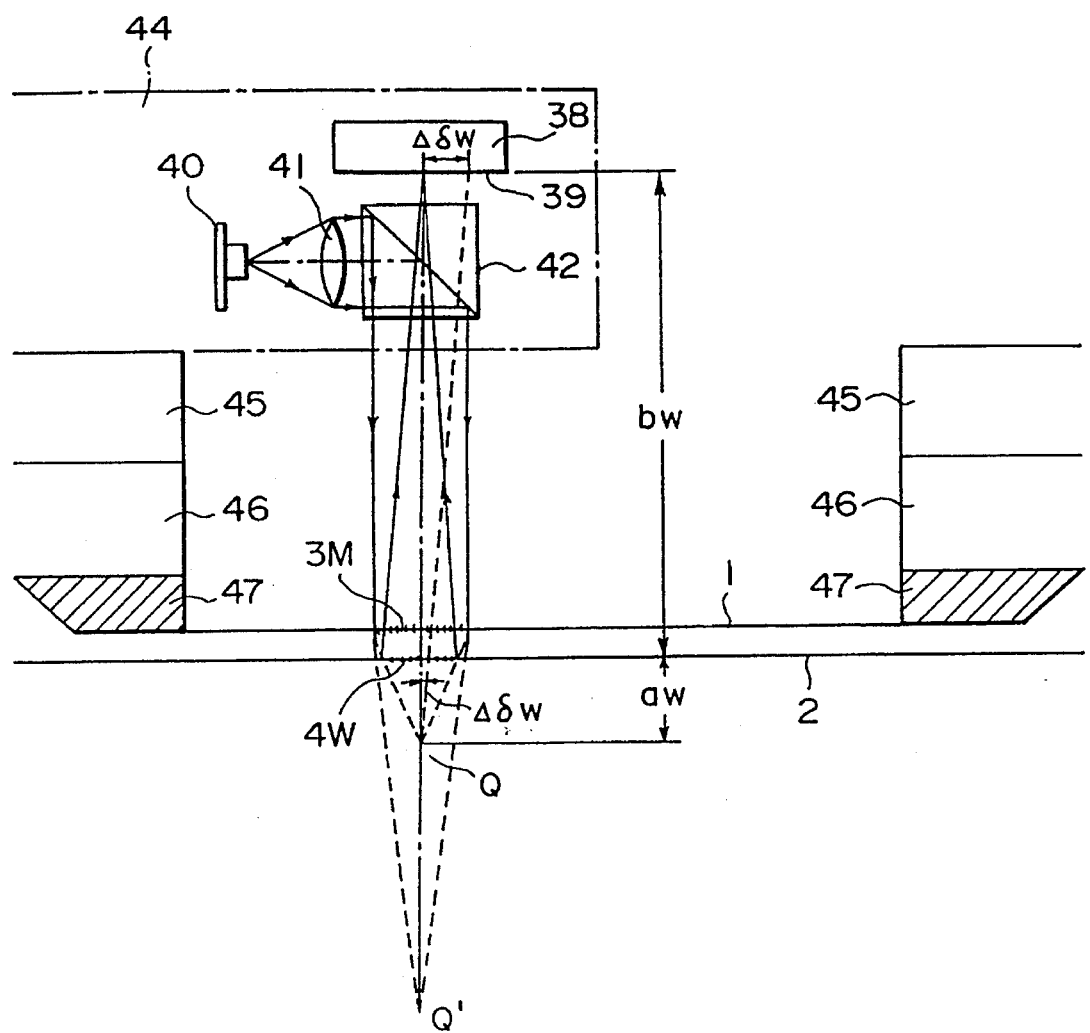
FIG. 1 is a schematic view of a general arrangement of a known type position detecting system.
Figure 2:
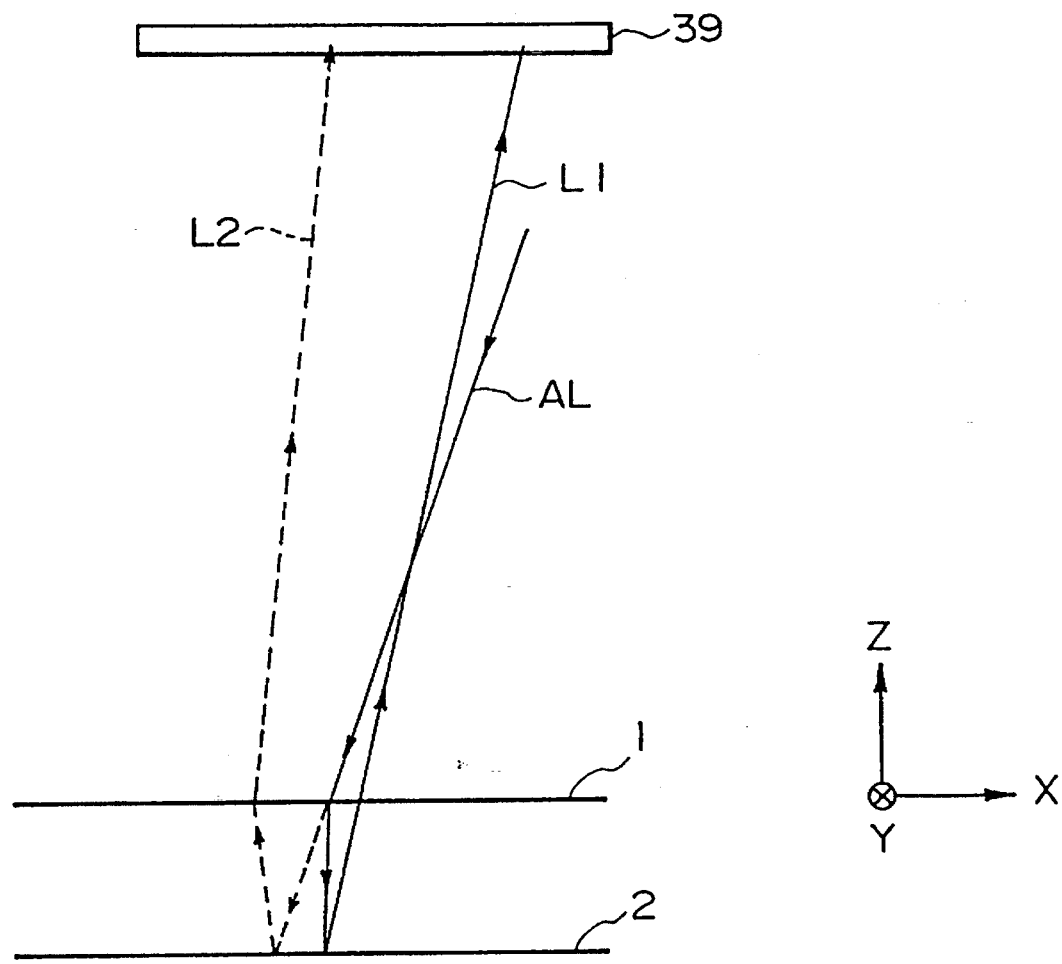
FIG. 2 is a schematic view, showing an example of optical paths for the (1, −1, 0)-th order light and the (0, −1, 1)-th order light.

A position detecting system according to a first embodiment of the present invention is characterized in that: A first alignment mark having a light diffracting function is provided on a first object while a second alignment mark having a light diffracting function is provided on a second object, wherein these alignment marks are so formed that, of light from light projecting means, when m, n and l are integers, the position of convergence on a predetermined plane of a first light having been diffracted at m-th order by the first alignment mark, having been diffracted at n-th order by the second alignment mark and having been diffracted at l-th order again by the first alignment mark, is displaceable at a predetermined magnification in response to a relative positional deviation of the first and second objects. The relative positional deviation of the first and second objects is determined by detecting the position of convergence of the first light on the predetermined plane, wherein, when m', n' and l' are integers satisfying m'≠m, n'≠n or l'≠l, the position of convergence on the predetermined plane of a second light having been diffracted at m'-th order by the first alignment mark, having been diffracted at n'-th order by the second alignment mark and having been diffracted at l'-th order again by the first alignment mark, is spaced from the position of convergence of the first light by a distance at least twice larger than the spot diameter of the first or second light (preferably the larger one of them). This assures that the second light is substantially prevented from being converged upon a predetermined detection zone of the predetermined plane on which the first light is to be detected.

More specifically, in a preferred form of this embodiment of the present invention, when an object surface A provides the first object while an object surface B provides the second object, first and second (signal producing) alignment marks A1 and A2 each having a function of a physical optic element, are formed on the object surface A. Also, on the other object surface B, first and second (signal producing) alignment marks B1 and B2 similarly each having a function of a physical optic element, are formed. Light is inputted to the alignment mark A1, and diffraction light caused thereby is inputted to the alignment mark B1. Diffraction light from the alignment mark B1 is incident on a predetermined plane, and the gravity center of the incident light on that plane is detected by a first detecting means, provided on that plane, as the position of incidence of the first signal light.

Here, the term "gravity center of light" means such a point that, when on a light receiving surface a position vector of each point on the surface is multiplied by the light intensity of that point and the thus obtained products are integrated over the entire surface, the integrated level has a "zero vector". However, as an alternative, the position of a peak point of the light intensity may be detected.

Similarly, light is inputted to the alignment mark A2, and diffraction light caused thereby is inputted to the alignment mark B2. A gravity center of diffraction light from the alignment mark B2, on a predetermined plane, is detected by a second detecting means, provided on that plane, as the position of incidence of the second signal light. By using two data from the first and second detecting means, the positioning of the objects A and B is executed. Here, with respect to each of the first and second signal lights, the position of incidence of the (m', n', l')-th order light which causes a detection error factor to the (m, n, l)-th order light, is set to satisfy the above-described positional relationship.

In this form of the present embodiment, the alignment marks A1, A2, B1 and B2 are so set that the gravity center position of the light incident on the first detecting means and the gravity center position of the light incident on the second detecting means, shift in opposite directions in response to a positional deviation between the objects A and B.

Figure 3:
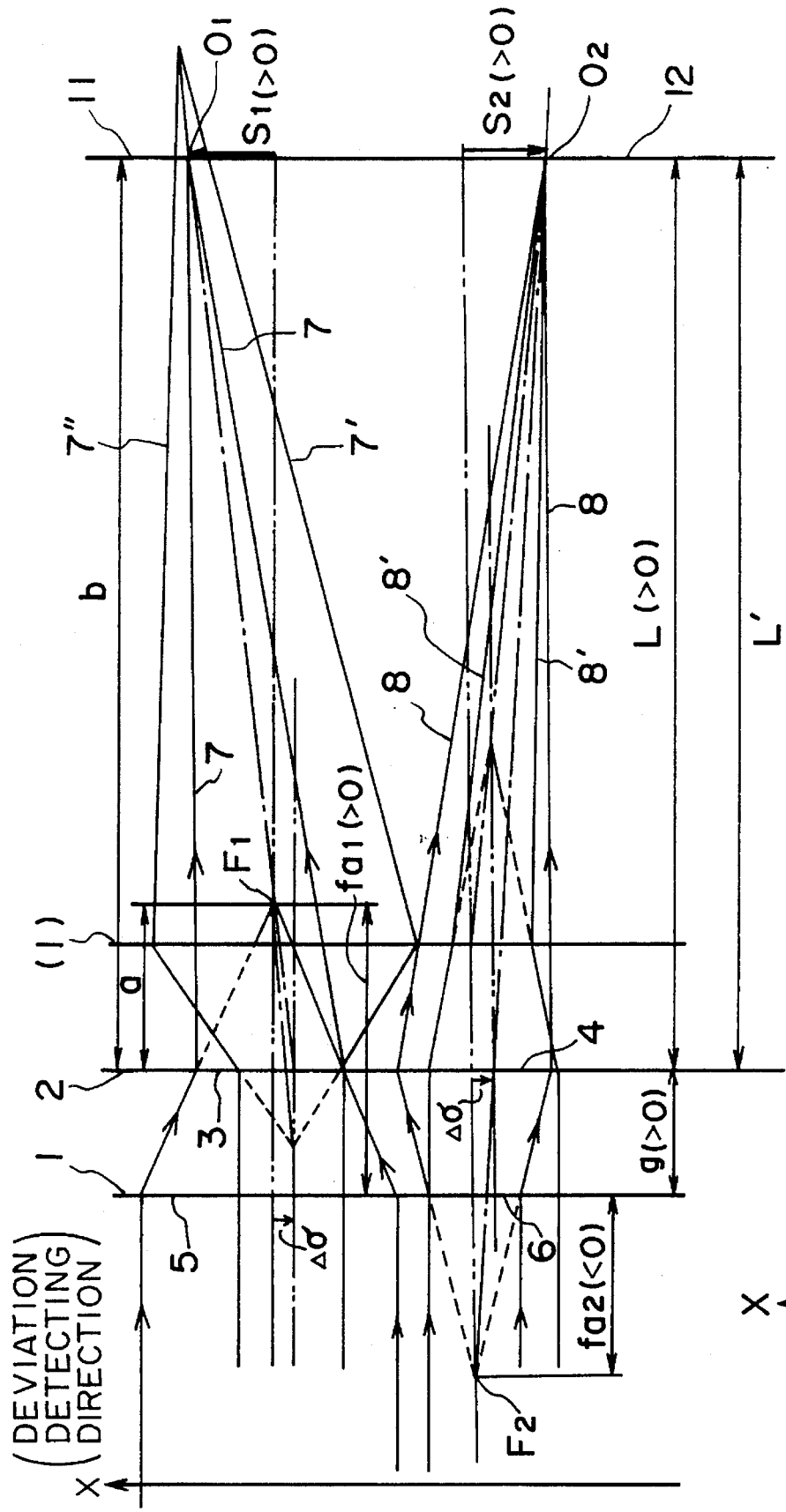
FIG. 3 is a schematic view, for explaining the principle of a position detecting system according to an aspect of the present invention.
Figure 4:
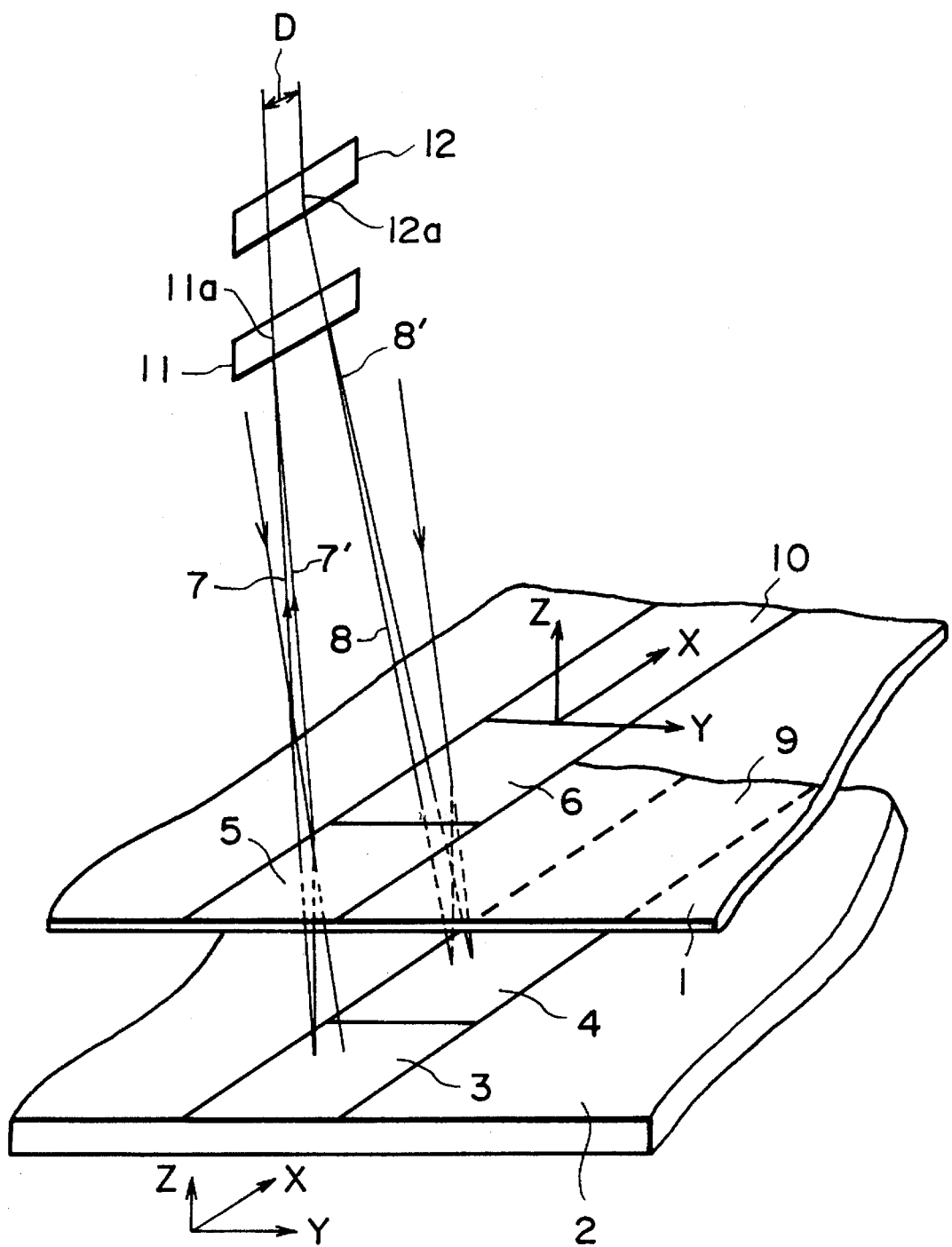
FIG. 4 is a schematic view of a major part of a position detecting system according to a first embodiment of the present invention.

FIG. 3 is a schematic view for explaining the principle of a first aspect of the present invention as well as structural features of it. FIG. 4 is a perspective view of a major part of a first embodiment of the present invention, based on the FIG. 3 structure.

In these drawings, denoted at 1 is a first object (object surface A) which is a mask, for example, and denoted at 2 is a second object (object surface B) which is a wafer, for example. The illustrated arrangement is an example wherein a relative positional deviation of the first and second objects it to be detected.

Since in this embodiment the light passing through the first object 1 and being reflected by the second object 2 goes again through the first object 1, in FIG. 3 the first object is illustrated in duplication. Denoted at 5 and 3 are alignment marks which are provided on the first and second objects 1 and 2, respectively, for obtaining a first signal light. Similarly, denoted at 6 and 4 are alignment marks provided on the first and second objects 1 and 2, respectively, for obtaining a second signal light. In FIG. 3, the paths are illustrated with the alignment marks 3 and 4 being replaced by equivalent transmission type alignment marks.

Each of the alignment marks 3–6 serves as a physical optic element such as, for example, a grating lens having an optical power (such as a one-dimensional or two-dimensional lens or mirror function) or a diffraction grating having no lens function. Denoted at 9 is a wafer scribe line and denoted at 10 is a mask scribe line. Each alignment mark is formed on the corresponding scribe line. Reference numerals 7 and 8 denote the first and second (alignment) signal lights, while reference numerals 7' and 8' denote (unwanted) diffraction lights of predetermined orders related to the first and second signal lights 7 and 8.

In this embodiment, the first signal light 7 is provided by a (1, −1, 0)-th order light; the second signal light 8 is provided by a (−1, 1, 0)-th order light; the light 7' is provided by a (0, −1, 1)-th order light; and the light 8' is provided by a (0, 1, −1)-th order light.

Denoted at 11 and 12 are first and second detecting means for detecting the first and second signal lights 7 and 8, respectively. Each of the first and second detecting means comprises a one-dimensional (linear) CCD sensor, for example, having its sensing elements arrayed in the X-axis direction.

For convenience in explanation, the optical distance from the second object 2 to the first detecting means 11 or the second detecting means 12 is denoted by L. Further, g denotes the distance between the first and second objects 1 and 2; $f_{a1}$ and $f_{a2}$ denote the focal lengths of the alignment marks 5 and 6; $\Delta\sigma$ denotes the relative positional deviation of the first and second objects 1 and 2; and $S_1$ and $S_2$ denote displacements of the gravity center positions of the first and second signal lights on the first and second detecting means, respectively, at that time, from the positions as assumed under correct alignment. Conveniently, the alignment light inputted to the object 1 is a plane wave. The signs are such as illustrated.

Each of the displacements $S_1$ and $S_2$ can be determined geometrically as a point of intersection between (i) the light receiving surface of the first (or second) detecting means 11 or 12 and (ii) the straight line that connects the focal point $F_1$ ($F_2$) of the alignment mark 5 (6) and the optical axis center of the alignment mark 3 (4). Therefore, the opposability in direction of the displacements $S_1$ and $S_2$ of the gravity centers of these lights, responsive to a relative positional deviation of the first and second objects 1 and 2, is attainable by applying an inversive relationship to the signs of optical imaging magnifications of the alignment marks 3 and 4.

In this embodiment, examples that can be used as a light source are: a light source such as a semiconductor laser, a He-Ne laser, an Ar laser or the like that can emit a coherent light; and a light source such as a light emitting diode or the like that can emit an incoherent light.

In this embodiment, as shown in FIG. 4, the (1, −1, 0)-th order light which is the light 7 as well as the (−1, 1, 0)-th order light which is the light 8, are those lights: which are incident upon the alignment marks 5 and 6, respectively, on the mask 1 surface each at a predetermined angle; Which are then transmissively diffracted by these marks and then reflectively diffracted by the alignment marks 3 and 4 on the wafer 2 surface, respectively; and which are then incident on the detecting means 11 and 12, respectively. On the other hand, the (0, −1, 1)-th order light which is the light 7' as well as the (0, 1, −1)-th order light which is the light 8', are those lights: which are transmitted at zero-th order by the alignment marks 5 and 6 on the mask 1; which are then reflectively diffracted by the alignment marks 3 and 4 on the wafer 2 surface, respectively; and which are then transmissively diffracted by the alignment marks 5 and 6 on the mask 1 surface and incident on the detecting means 11 and 12.

The gravity center positions of the first and second alignment lights, respectively, incident on the respective detecting means are detected and, by using output signals from the detecting means 11 and 12, any positional deviation of the mask 1 and the wafer 2 can be detected. At this time, the output signals corresponding to the lights 7' and 8' are not used for the detection.

Description will now be made of the alignment marks 3–6.

The alignment marks 3–6 are provided by Fresnel zone plates (or grating lenses) having different focal lengths. A practical size of each mark is 50–300 microns in the lengthwise direction (X-axis direction) of the scribe line 9 or 10 and 20–100 microns in the widthwise direction (Y-axis direction) of the scribe line.

In this embodiment, all the lights 7, 7', 8 and 8' are incident on the mask 1 at an angle of incidence of about 17.5 deg., with the projection component upon the mask 1 surface being perpendicular to the scribe line direction (X-axis direction).

The mask 1 and the wafer 2 are spaced from each other by a gap of 30 microns. The (1, −1, 0)-th order light 7 has been transmissively diffracted at first order by the alignment mark 5 and influenced by the convex lens function and, then, having been reflectively diffracted at negative first order by and influenced by the concave lens function of the alignment mark 3 on the wafer 2 surface and, thereafter, it is focused at a point on the first detecting means 11.

On the other hand, the (0, −1, 1)-th order light which is the light 7' has been transmitted (diffracted) at zero-th order through the mask 1 surface and then reflectively diffracted at first order by the alignment mark 3 on the wafer 2 surface and influenced by the convex lens function, and thereafter, transmissively diffracted at first order by the alignment mark 5 on the mask 1 surface and influenced by the concave lens function, and finally it impinges on the detecting means 11 surface.

On the detecting means 11 surface, displacement of the position of incidence of this light 7 corresponds to the quantity of positional deviation between the alignment marks 5 and 3 in the X-axis direction, namely, the quantity of misalignment of the axes of them. Also, the light is inputted, bearing magnified quantity of positional deviation. As a result of this, the shift of the gravity center position of the inputted light can be detected by the detecting means 11.

The present embodiment is so set that, when the mask 1 and the wafer 2 have no relative positional deviation (i.e., when the alignment marks 5 and 3 on the mask 1 and the wafer 2 just provide a coaxial system), the chief ray of the light 7 emitted from the wafer 2 has an angle of emission of 13 deg., and the projection of the emitted light upon the wafer 2 surface extends perpendicularly to the widthwise direction (Y-axis direction) of the scribe line, and the light 7 is focused on the detecting means 11 surface which is disposed at a predetermined position, for example, at a height of 18.657 mm from the wafer 2 surface.

On the other hand, the light 8 has been transmissively diffracted by the alignment mark 6 and then reflectively diffracted by the alignment mark 4 on the wafer 2 surface. The mark 4 serves so that the position of the spot of the light 8 formed thereby is displaced in a direction different from that of the spot of the light 7. When the marks 6 and 4 are aligned into a coaxial system and there is no relative positional deviation, the chief ray of the emitted light 8 from the wafer 2 has an angle of emission of 7 degrees, with the projection upon the wafer 2 surface being perpendicular to the widthwise direction of the scribe line, and the light is focused upon the detecting means 12 surface which is provided at a height higher than that of the first detecting means.

In the present embodiment with the lens parameter setting of the alignment marks as described, the X-axis component of the interval, i.e., the spacing along the X-axis direction, between the gravity center position of the light 7 on the detecting means 11 surface and the gravity center position of the light 8 on the detecting means 12 surface, is detected. When the spacing between the mask and the wafer is g and the spacing between the wafer and the light receiving surface of the detector is L, if the wafer causes a positional deviation $\Delta\sigma$ relative to the mask, then the displacements $S_1$ and $S_2$ of the gravity centers of the lights are expressed quantitatively, such as follows:

$$S_1 = -[(L - f_{a1} + g)/(f_{a1} - g)]\Delta\sigma$$

$$S_2 = -[(L - f_{a2} + g)/(f_{a2} - g)]\Delta\sigma$$

From this, the deviation magnifications can be defined as $\beta_1 = S_1/\Delta\sigma$ and $\beta_2 = S_2/\Delta\sigma$.

Since as described the signal lights 7 and 8 are displaceable along the detecting means 11 and 12 in the opposite directions in response to a positional deviation $\Delta\sigma$, the quantity of change ($\Delta D$) in the spacing of the lights 7 and 8 on the detecting means 11 and 12 in the X direction, can be given by the following equation:

$$\Delta D = (\beta_1 - \beta_2) \times \Delta\sigma$$

The positional deviation can be detected in the following manner.

The spacing D between the gravity center positions as assumed when the mask and the wafer have no relative positional deviation in the X direction, can be determined beforehand by calculation or by trial printings. Then, during actual detection of the relative positional deviation of the mask and the wafer in the X direction, a deviation $\Delta D$ of the spacing between the gravity center positions of the lights 7 and 8, with reference to the quantity D, can be detected and, from the detected deviation $\Delta D$, the relative positional deviation of the mask and the wafer in the X direction can be determined by calculation.

Next, description will be made of the angle of projection of the light to an alignment mark with respect to a normal to the alignment mark surface (FIG. 3) as well as the position of incidence of the light upon the detecting means surface responsive to a positional deviation $\Delta\sigma$ of the first and second objects in the X direction.

If the center position (optical axis position) of the first alignment mark 5 of the first object is denoted by ($x_{M01}$, $y_{M01}$, 0) and the position of the imaging point of a parallel light incident on the alignment mark 5 with an angle $\theta$ is denoted by ($x_{M1}$, $y_{M1}$, $z_{M1}$), then it follows that $z_{M1} = -f_1$.

On the other hand, it is assumed that the center position (optical axis position) of the alignment mark 3 of the second object as there is no relative positional deviation is denoted by ($x_{W1}$, $y_{W1}$, −g) and also that the alignment mark 3 is so designed as to form, at a position ($x_{S1}$, $y_{S1}$, $z_{S1}$), an image of a point light source (point image) which is at a position ($x_{M1}$, $y_{M1}$, −$f_1$) if there is no positional deviation. Similarly, the center position (optical axis position) of the alignment mark 6 of the first object is denoted by ($x_{M02}$, $y_{M02}$, 0) and, like the alignment mark 5, its imaging point position is denoted by ($x_{M2}$, $y_{M2}$, −$f_3$). Further, it is assumed that the center position (optical axis position) of the alignment mark 4 as there is no positional deviation is denoted by ($x_{W2}$, $y_{W2}$, −g) and that the mark 4 is so designed as to form, at a position ($x_{S2}$, $y_{S2}$, $z_{S2}$), an image of a point light source (point image) which is at a position ($x_{M2}$, $y_{M2}$, −$f_3$) as there is no positional deviation. Additionally, the distance from the mask surface to the detecting means surface is denoted by L'.

When, under the above parameter setting, the displacement of the gravity center position of the light (1, −1, 0)-th order light which is the light 7 and that of the (0, −1, 1)-th order light which is the light 7', other than the light 7, to be caused upon the detecting means surface in response to a positional deviation $\Delta\sigma$ of the second object relative to the first object, are denoted by $S_{11}$ and $S_{21}$, respectively, then they can be expressed as follows:

$$S_{11} = [1 - L/(f_1 - g)](x_{W1} - x_{M1} + \Delta\sigma) + x_{M1} \qquad (1)$$

$$S_{21}=[L'/(f_2-g)](x_{W1}-f_2\tan\theta-x_{M01}+\Delta\sigma)+X_{M01} \quad (2)$$

Similarly, when the displacement of the gravity center position of the (−1, 1, 0)-th order light which is the light 8 and that of the (0, 1, −1)-th order light which is the light 8', other than the light 8, to be caused on the detecting means surface, are denoted by $S_{12}$ and $S_{22}$, respectively, then they can be expressed as follows:

$$S_{12}=[1-L/(f_3-g)](x_{W2}-x_{M2}+\Delta\sigma)+x_{M2} \quad (3)$$

$$S_{22}=[L'/(f_4-g)](x_{W2}-f_4\tan\theta-x_{M02}+\Delta\sigma)+x_{M02} \quad (4)$$

Further, from the general relationship on lens imaging characteristics, it follows that:

$$x_{M0i}=x_{Mi}+f_{2i-1}\tan\theta (i=1,2) \quad (5)$$

Also, $x_{Mi}$ and $x_{Wi}$ are the quantities that are determined by the angles of deflection, with respect to the chief ray of input light, of the alignment marks of the first and second objects as well as the focal lengths of these marks, respectively, and they are expressed as follows:

$$\begin{cases} x_{Mi}=f_{2i-1}\tan\phi_{2i-1} \\ x_{Wi}=f_{2i}\tan\phi_{2i} \end{cases} (i=1,2) \quad (6)$$

Here, $\zeta_j=\theta-\phi_j (j=1,4)$ defines the angle of deflection of each alignment mark with an incidence angle $\theta$.

Now, it is assumed that the center of the alignment mark of the first object is taken as an origin; the X axis is laid on the alignment mark surface along the direction with respect to which the positional deviation is to be detected; the Y axis is laid along a direction perpendicular to the X axis; and the Z axis is laid along a direction of a normal to the alignment mark surface.

The detecting means has a light receiving zone with its center denoted by $(x_S, y_S, z_S)$, and the light receiving zone has a rectangular shape of a size $d_1$ in the X direction and $d_2$ in the direction perpendicular thereto.

Considering the (0, −1, 1)-th order light which is the (unwanted) light 7' and the (0, 1, −1)-th order light which is the (unwanted) light 8', and if equation (5) is substituted into equations (2) and (4), then it follows that:

$$S_{21}=[L'/(f_2-g)][x_{W1}-x_{M1}-\tan\theta(f_2+f_1)+\Delta\sigma]+x_{M1}+f_1\tan\theta \quad (2')$$

$$S_{22}=[L'/(f_4-g)][x_{W2}-x_{M2}-\tan\theta(f_4+f_3)+\Delta\sigma]+x_{M2}+f_3\tan\theta \quad (4')$$

Here, if the parameters are set so that, in a detectable range $\epsilon_1 \leq \Delta\sigma \leq \epsilon_2$ ($\epsilon_1$ and $\epsilon_2$ are upper and lower limits for the positional deviation which can be detected by the detecting means of a length $d_1$), the quantities $S_{21}$ and $S_{22}$ satisfy the following relations:

$$\begin{array}{l} S_{21}<-d_1/2+x_S \text{ or } S_{21}>d_1/2+x_S \\ S_{22}<-d_1/2+x_S \text{ or } S_{22}>d_1/2+x_S \end{array} \quad (7)$$

then, it is assured that the (0, −1, 1)-th order light which is the light 7 or the (0, 1, −1)-th order light which is the light 8 is prevented from impinging on the light receiving zone, in the range $\epsilon_1 \leq \Delta\sigma \leq \epsilon_2$.

In the present embodiment, the quantities $\epsilon_1$ and $\epsilon_2$ are so selected to have the values as described, and by this the inconveniences describe hereinbefore are avoided.

In this embodiment, $x_S=0$ is selected and an appropriate angle $\theta$ for projection of the light to each alignment mark as well as appropriate light deflection angles $\zeta_1, \zeta_2, \zeta_3$ and $\zeta_4$ (i.e. $x_{M1}, x_{M2}, x_{W1}$ and $x_{W2}$) of the respective alignment marks are set so as to satisfy equation (7) without causing a change in the detection magnification.

Here, if the distance L from the center of the alignment mark of the second object (wafer) to the center of the light receiving zone of the detecting means is L=18.657 mm, the distance L' from the center of the alignment mark of the first object (mask) to the center of the light receiving zone of the detecting means is L'=18.628 mm, the spacing g between the first and second objects is g=30.0 microns, and the focal lengths $f_1$ and $f_3$ of the mask alignment marks 5 and 6 are set so as to assure deviation detection sensitivities of $\beta_1=+200\times$ and $\beta_2=-200\times$ for the (1, −1, 0)-th order light and the (−1, 1, 0)-th order light as given by equations (1) and (3), then it follows that $f_1=122.8209$ microns and $f_3=-63.7538$ microns.

Also, from the conditions for assuring that the (1, −1, 0)-th order light and the (−1, 1, 0)-th order light are imaged on the detecting means surface, such as follows:

$$1/(f_1-g)+1/L=-1/f_2$$

$$1/(f_3-g)+1/L=-1/f_4$$

it follows that $f_2=-92.361$ microns and $f_4=94.2273$ microns. When these quantities are substituted into equations (2') and (4'), the following results are given:

$$S_{21}=-152.23(x_{W1}-x_{M1}+30.46\tan\theta+\Delta\sigma)+x_{M1}+122.82\tan\theta$$

$$S_{22}=149.94(x_{W2}-x_{M2}+30.47\tan\theta+\Delta\sigma)+x_{M2}-63.75\tan\theta$$

It is now assumed that the measurement range (the range from $\epsilon_1$ to $\epsilon_2$) for the positional deviation measurement is $-3.0<\Delta\sigma<3.0$ (micron) and that the detecting means has a size $d_1=40$ mm and $d_2=0.48$ mm. In this embodiment, while taking into account equation (7), the following conditions are adopted:

$$\left. \begin{array}{l} S_{21}= \quad -152.23(x_{W1}-x_{M1}+30.46\tan\theta+\Delta\sigma)+ \\ \qquad x_{M1}+122.82\tan\theta > d_1/2 \\ S_{22}= \quad -149.94(x_{W2}-x_{M2}+30.47\tan\theta+\Delta\sigma)+ \\ \qquad x_{M2}-63.75\tan\theta < -d_1/2 \\ \theta > 0 \end{array} \right\} \quad (7')$$

$$\left. \begin{array}{l} S_{21}= \quad -152.23(x_{W1}-x_{M1}+30.46\tan\theta+\Delta\sigma)+ \\ \qquad x_{M1}+122.82\tan\theta < -d_1/2 \\ S_{22}= \quad -149.94(x_{W2}-x_{M2}+30.47\tan\theta+\Delta\sigma)+ \\ \qquad x_{M2}-63.75\tan\theta > d_1/2 \\ \theta > 0 \end{array} \right\} \quad (7'')$$

On this occasion, $S_{11}$ and $S_{12}$ are given by:

$$S_{11}=-200.0(x_{W1}-x_{M1}+\epsilon)+x_{M1}$$

$$S_{12}=200.0(x_{W2}-x_{M2}+\epsilon)+x_{M2}$$

As the conditions for that the (1, −1, 0)-th order light and the (−1, 1, 0)-th order light are received by the detecting means, in the range $-3.0\leq\Delta\sigma\leq$, the quantities $x_{M1}, x_{M2}, x_{W1}$ and $x_{W2}$ are set so as to satisfy the following relations:

$$-d_1/2\leq S_{11}\leq d_1/2 \quad -d_1/2\leq S_{12}\leq d_1/2 \quad (8)$$

In this embodiment, in order to satisfy equations (7'), (7") or (8), the selected are θ=30 deg., $x_{W1}$=10.0 microns, $x_{M1}$=5.0 microns, $x_{W2}$=0.0 micron and $x_{M2}$=−5.0 microns. In this example, $S_{21}$ and $S_2$ are:

$$S_{21}(\epsilon)=-152.23\epsilon-2601.22 \text{ (micron)} \quad (9\text{-}1)$$

$$S_{22}(\epsilon)=149.94\epsilon+2595.92 \text{ (micron)} \quad (9\text{-}2)$$

If −3.0<Δσ<3.0, then:

−3067.91<$S_{21}$<−2154.53, 2146.1<$S_{22}$<3045.74

Thus, equation (7') is satisfied. On this occasion, $S_{11}$ and $S_{12}$ are:

$$S_{11}(\epsilon)=-200.0\epsilon-995 \text{ (micron)} \quad (9\text{-}3)$$

$$S_{12}(\epsilon)=200.0\epsilon+995 \text{ (micron)} \quad (9\text{-}4)$$

Thus, equation (8) is satisfied.

The present embodiment is arranged so that the (0, −1, 1)-th order light or the (0, 1, −1)-th order light is prevented from impinging on the light detecting zone of each detecting means 11 or 12. However, by suitably setting θ, $x_{W1}$, $x_{M1}$ and the like, it is possible to relatively separate the gravity center positions on the detecting means surface of the (1, −1, 0)-th order light and the (0, −1, 1)-th order light, or the (−1, 1, 0)-th order light and the (0, 1, −1)-th order light, by a distance within the deviation detectable range but larger than a predetermined length.

More specifically, as for the first signal light, the relative distance $l_1$ of the gravity centers of the (1, −1, 0)-th order light (light 7) and the (0, −1, 1)-th order light (light 7'), upon the detecting means surface, is:

$$(9\text{-}5)$$

$$\begin{aligned} l_1 &= |S_{11} - S_{21}| \\ &= |[1 - L/(f_1 - g) - L'/(f_2 - g)]\Delta\sigma + \epsilon_0| \end{aligned}$$

wherein (9-6)

$$\begin{aligned} \epsilon_0 &= x_{M1} - x_{M01} + [1 - L/(f_1 - g)](x_{W1} - x_{M1}) - \\ &\quad [L'/(f_2 - g)](x_{W1} - f_2\tan\theta - x_{M01}) \end{aligned}$$

Thus, the parameters $f_1$, $f_2$, L, L', $x_{M01}$, $x_{M1}$ and θ may be so set that, within the measurement range $\epsilon_1 \leq \Delta\sigma \leq \epsilon_2$, the distance $l_1$ always satisfies the following relation:

$$l_1 \geq l_{min}(>0) \quad (9\text{-}7)$$

wherein $l_{min}$ is the allowable minimum quantity for the relative gravity center spacing of the two lights 7 and 7' as they come close to each other on the detecting means surface. When $\alpha_1$ and $\alpha_2$ denote the $1/e^2$ light systems (spot diameters) of these lights on the detecting means surface, $\alpha_1$ and $\alpha_2$ are determined by L and the mark size in the X direction, and the condition for the separation of the two lights is given by:

$$l_{min}=\gamma(\alpha_1+\alpha_2) \quad (9\text{-}8)$$

where γ is a constant satisfying γ>1.0 and, generally, γ≧2.0 is preferable. Namely, it is preferable that the lights are separated by a distance at least four times larger than the spot diameter, where $\alpha_1 \cong \alpha_2$. Similar setting should be made with regard to the second signal light, too.

When the setting is done in the manner as described, it is possible to detect only the gravity center position of the light intensity distribution of the (1, −1, 0)-th order light, for example, through the selection of the output signals from the detecting means 11. More specifically, by using, as an example, a charge accumulation type sensor such as a CCD or the like and by setting a window to such sensor, output signal selection may be done to allow detection of the gravity center position of the light intensity distribution in a range of $1/e^2$ of the peak intensity, for example, about the peak intensity point of the (1, −1, 0)-th order light.

A practical example of parameter setting may be such that: When only the gravity centers of the (1, −1, 0)-th order light and the (−1, 1, 0)-th order light of the first and second signal lights are to be detected and processed, the relative gravity center spacing l of the two lights to be considered on the detecting means surface in relation to the positional deviation Δσ, is given by:

$$\begin{aligned} l &= |S_{11} - S_{12}| \quad &(9\text{-}9) \\ &= |(L/(f_3 - g) - L/(f_1 - g))\Delta\sigma + \epsilon_i| \\ \epsilon_i &= [1 - L/(f_1 - g)](x_{W1} - x_{M1}) - \quad &(9\text{-}10) \\ &\quad [1 - L/f_3 - g)](x_{W2} - x_{M2}) + x_{M1} - x_{M2} \end{aligned}$$

Thus, the overall detection sensitivity β to the positional deviation Δσ is:

$$\beta=[1/(f_3-g)-1/(f_1-g)]L \quad (9\text{-}11)$$

Therefore, first, in order to attain a desired overall detection sensitivity $\beta_0$ (e.g. 200x), the condition for the parameter setting is given as:

$$[1/(f_3-g)-1/(f_1-g)]L=\beta_0 \quad (9\text{-}12)$$

Then, under the condition (9-12), as regards the first signal light, the parameters are set so as to satisfy equations (9-5) to (9-12). Similarly, as regards the second signal light, the parameters are set so as to satisfy the conditions, such as given by equations (9-13) to (9-15), below, which are to be satisfied by the relative gravity center spacing $l_2$ on the detecting means surface of the (−1, 1, 0)-th order light 8 and the (0, 1, −1)-th order light 8':

$$l_2 = |[1 - L/(f_3 - g) - L'/(f_4 - g)]\Delta\sigma + \epsilon_0'| \quad (9\text{-}13)$$

$$\begin{aligned} \epsilon_0' &= x_{M2} - x_{M02} + [1 - L/(f_3-g)](x_{W2} - x_{M2}) - \quad (9\text{-}14) \\ &\quad [L'/(f_4 - g)](x_{W2} - f_4\tan\theta - x_{M02}) \end{aligned}$$

$$l_2 \geq l_{min} \quad (9\text{-}15)$$

In this manner, the parameters $f_1$–$f_4$, L, L', $x_{M01}$, $x_{M1}$, $x_{M02}$, $x_{M2}$ and θ are set so that a total of eight equations (9-5) to (9-8) and (9-12) to (9-15) are satisfied. Since there are eight conditional equations (including inequality) for unknown quantities of a number eleven (11), the solutions are not determined definitely, and it is necessary to adopt such a process in which $f_1$, $f_3$ and L', for example, are first given and then numerical solutions are determined.

Figure 5A:
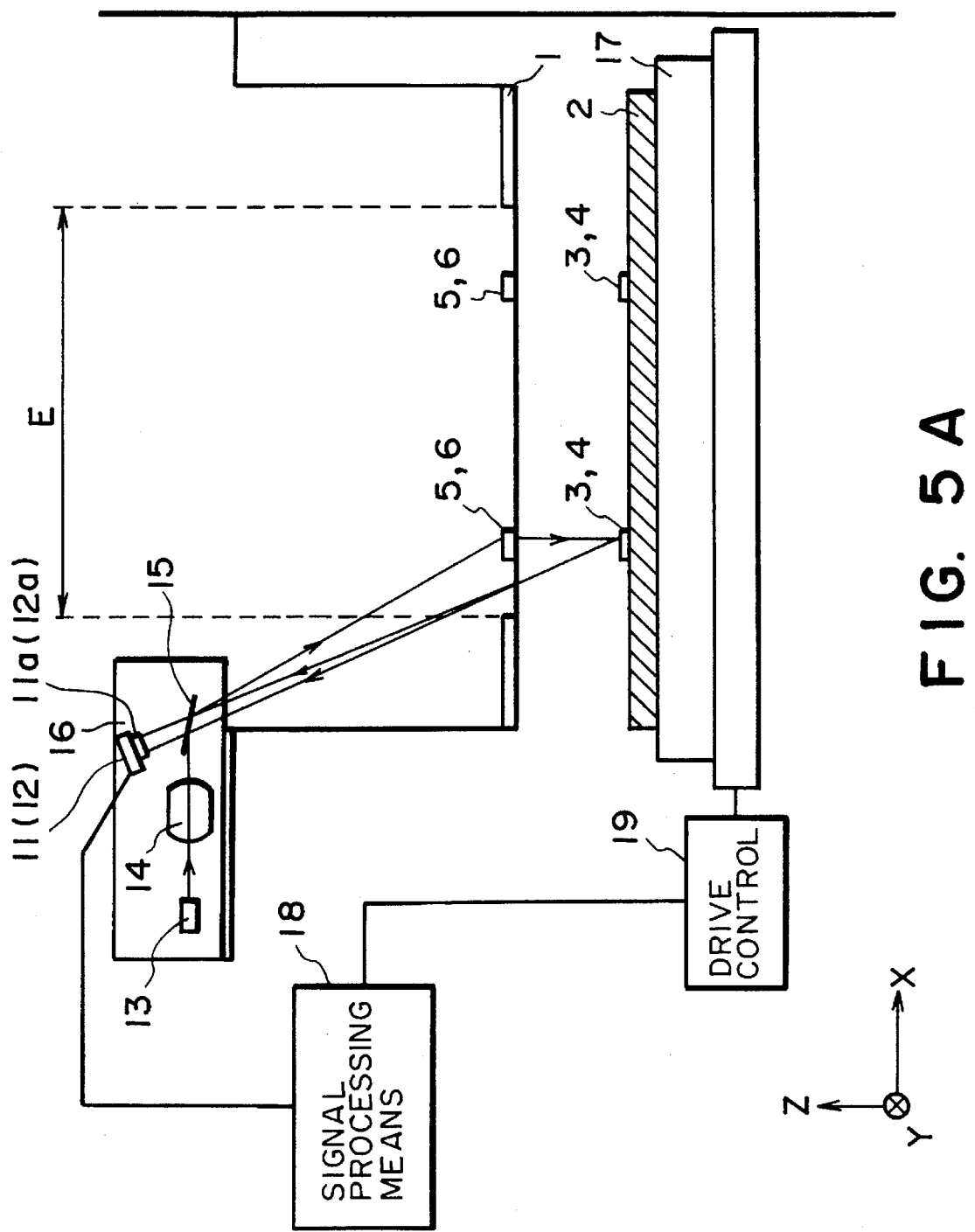
FIG. 5A is a schematic view of a peripheral part of a proximity type semiconductor device manufacturing apparatus in which a positional deviation detecting method of the present invention is applied.

FIG. 5A shows a proximity type semiconductor device manufacturing exposure apparatus (X-ray exposure apparatus) into which the first embodiment of the present invention shown in FIG. 4 is incorporated. As shown in the drawing (while not shown in FIG. 4), the apparatus is equipped with a light source 13, a collimator lens system (or a beam diameter changing lens) 14, a projected light deflecting mirror 15, a pickup casing (alignment head casing) 16, a wafer stage 17, a positional deviation signal processing means 18, a wafer stage drive control means 19, and the like. Character E denotes the width of the exposure light (X-ray flux) in the X direction.

Also in this embodiment, any relative positional deviation of the mask (first object) 1 and the wafer (second object) 2, is detected in a similar manner as having been described with reference to the first embodiment.

An alignment process to be adopted in this embodiment may be such as follows:

A first example is that: Signals representing displacements $\Delta\delta$ of gravity centers of the lights upon the detection surfaces 11a and 12 b of the detecting means 11 and 12, corresponding to the positional deviation $\Delta\sigma$ between two objects, are detected and, in the signal processing means 18, the positional deviation $\Delta\sigma$ between these objects is detected on the basis of the signals representing the displacements of the gravity centers. Then, the stage drive control 19 operates to move the wafer stage 17 by an amount corresponding to the detected positional deviation $\Delta\sigma$.

A second example is that: From the signals outputted by the detecting means 11 and 12, the signal processing means 18 detects such a direction that cancels the positional deviation $\Delta\sigma$. The stage drive control 19 operates to move the wafer stage 17 in that direction, and the above-described operations are repeated until the positional deviation $\Delta\sigma$ comes into a tolerable range.

Figure 5B:
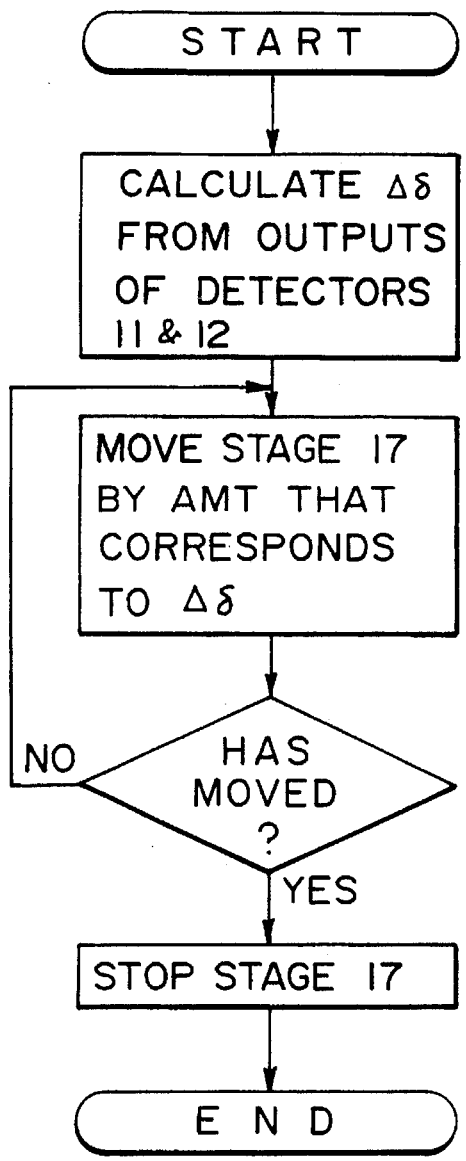
FIGS. 5B and 5C are flow charts, respectively, showing examples of an alignment process in the apparatus of FIG. 5A.
Figure 5C:
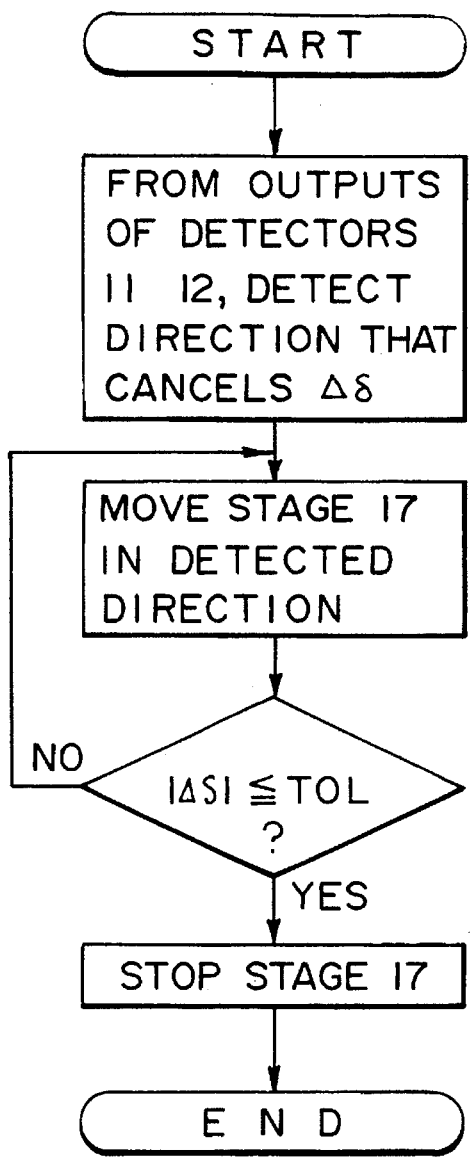

The above-described alignment procedures are illustrated in the flow charts of FIGS. 5B and 5C, respectively.

It will be understood from FIG. 5A that the light source 13 projects light from outside of the path of the exposure light to the alignment marks 5 and 6, and that the detecting means 11 and 12 which are provided outside the exposure light flux receive diffraction lights emanating from the alignment marks 3 and 4 outwardly of the exposure light, for the position detecting purpose.

Thus, with the above structure, it is possible to provide a system having no necessity of retracting the pickup housing 16 at the time of exposure.

In a modified form of the first embodiment of the present invention, equations (1), (2'), (3) and (4') related to the position of incidence of the (1, −1, 0)-th order light, the (−1, 1, 0)-th order light, the (0, −1, 1)-th order light and the (0, 1, −1)-th order light upon the detecting means surface, may be used to determine the location of the detecting means as well as the size thereof, for example, so that the light receiving zone of the detecting means receives the (0, −1, 1)-th order light or the (0, 1, −1)-th order light as the alignment signal light, with the other lights being prevented from being received. Since this modification will have an arrangement basically similar to that of the first embodiment, the explanation of the structure itself will be omitted.

In this embodiment, for simplification, the angle $\theta$ of incidence of the light upon the alignment mark in the X-Z plane as well as the eccentric parameters $x_{M1}, x_{M2}, x_{W1}, x_{W2}$ and the like are the same as those of the first embodiment, but the location of the detecting means or the size thereof is different.

Here, from equations (9-1) to (9-4), the center coordinate $(x_S, y_S, z_S)$ of the detecting means is set as follows:

$$x_S = [S_{21}(0) + S_{22}(0)]/2$$

so as to assure that only the (0, −1, 1)-th order light or the (0, 1, −1)-th order light is received. With regard to $y_S$ and $z_S$, this embodiment is the same as the first embodiment.

The size of the light receiving zone of the detecting means is set to be equal to 1.88 mm in the X direction, in consideration of possible quantities of $S_{21}$ and $S_{22}$ under the condition of the positional deviation detectable range of $-3.0 < \Delta\sigma < 3.0$ (micron).

Under these conditions, the detecting means can receive only the (0, −1, 1)-th order light or the (0, 1, −1)-th order light and can execute the positional deviation detection without being influenced by the (1, −1, 0)-th order light or the (−1, 1, 0)-th order light.

In another modified form of the first embodiment of the present invention, the structure may be arranged to use, as a positional deviation signal light, such light as transmissively diffracted at m-th order by an alignment mark of a mask, then reflectively diffracted at n-th order by an alignment mark of a wafer and then transmissively diffracted at l-th order again by the mask alignment mark, namely, the (m, n, l)-th order light, wherein $m \neq 0$, $n \neq 0$ and $l \neq 0$.

In this example, each alignment mark comprises a one-dimensional grating lens having a cylindrical power, and the X axis is laid in the direction in which the lens power is produced. The Y-axis is laid on an axis which passes the center of the alignment mark and intersects at a right angle with the X axis, within the plane in which the alignment mark is formed. Also, the Z axis is laid on an axis perpendicular to the X and Y axes. When an input light is incident at an angle $\theta$ in the Y-Z plane, if the (m, n, l)-th order light as the same finally emanates from the mask surface has an angle $\zeta_f$, then the angle is defined by:

$$\sin \zeta_f = (\lambda/P_M)(l+m) - (\lambda/P_W)n - \sin\theta \qquad (10)$$

wherein $P_M$ and $P_W$ are pitches of mask and wafer alignment marks, in the Y-Z plane, having no light converging or diverging function (optical power), and $\lambda$ denotes the wavelength of the light used.

From equation (10), it follows that the lights to be inputted to the light detection surface at the same time should be, as a first example, those lights which correspond to such a combination of diffraction orders that satisfy:

$$l+m=k \text{ (constant)}$$

$$n=n_O \text{ (constant)} \qquad (10'),$$

that is, l-th order transmission lights having been transmitted at m-th order by the mask alignment mark and having an "l" satisfying equation (10') again. As for the positional deviation signal light, it is a necessary condition for the magnified deviation detection using grating lenses that $n \neq 0$ and at least one of m and l is not equal to 0.

Assuming now that the focal length of a mask alignment mark corresponding to i-th order diffraction light is $fi^M$ and similarly the focal length of a wafer alignment mark 3 corresponding to j-th order diffraction light is $fj^W$, then, from the effective gravity center position of the (m, n, l)-th order light, the positional deviation detecting magnification $\beta$ upon the detecting means for the (m, n, l)-th order light, is given by:

$$\beta = [1 - L_1/(fm^M - g)][L_2/(L_1 - g)] \qquad (10'')$$

where $L_1$ is given by:

$$1/(fm^M - g) + 1/L_1 = -1/fn^W \qquad (10''')$$

and $L_2$ is the distance from the center of the mask mark to the center of the detection surface.

Here, the position S of incidence of the (m, n, l)-th order light on the detecting means surface is, like the first embodiment, expressed by using the incidence angle θ of light in the X-Z plane and the X-axis center positions $x_{M0}$ and $x_W$ of the grating lenses (alignment marks), as follows:

$$S = [1 - L_1/(fm^M - g)][L_2/(L_1 - g)] \times \{[(x_{M0} - fm^M \tan\theta - x_W)L_1/(fm^M - g) + x_W - x_{Mi}] \times L_2/(L_1 - g) + x_{M0}\} \quad (11)$$

Assuming now that the (m, n, l)-th order light is imaged on the detecting means surface, then $L_2$ is given by:

$$1/(L_1-g) + 1/L_2 = -1/fl^M \quad (12)$$

Also, if the focal length of the mask alignment mark corresponding to the positive first order diffraction light is denoted by $fl^M$, then generally $fl^M$ ($fm^M$) can be expressed as:

$$fl^M = f_1^M/l \quad (13)$$

On the other hand, if the imaging plane position of the (m', n', l')-th order light wherein m'≠m, n'≠n or l'≠l is at a distance $L_2'$ from the mask surface, then in this embodiment the optical arrangement including the detecting means and other optical elements is so determined that the (m', n', l')-th order light which satisfies equation (14) below, that is, such light as having approximately the same intensity as the (m, n, l)-th order light upon the detecting means surface, is prevented from reaching the light receiving zone of the detecting means surface.

$$|L_2'/L_2| \cong 1 \quad (14)$$

Equation (14) represents that, for the distance $L_2$ to the convergent point position of the (m, n, l)-th order light, the distance $L_2'$ to the convergent point position of the (m', n', l')-th order light is of the same level as $L_2$ and, therefore, that it has approximately the same intensity concentration. Here, $L_2'$ can be given by:

$$L_2' = -[fl'^M(L_1'-g)]/[fl'^M + L_1' - g] \quad (15-1)$$

$$L_1' = -[fn'^W(fm'^M - g)]/[fn'^W + fm'^M - g] \quad (15-2)$$

By using equation (13), the above equation can be rewritten as:

$$L_2' = -\frac{f_1^M/l'(L_1' - g)}{f_1^M/l' + L_1' - g} \quad (15\text{-}1')$$

$$= \frac{f_1^M}{l'} - \frac{(f_1^M/l')^2}{f_1^M/l' + L_1' - g}$$

$$= \frac{f_1^M}{l'} - \frac{(f_1^M/l')^2}{\dfrac{f_1^M}{l'} \dfrac{\dfrac{f_1^W}{n'}\left(\dfrac{f_1^M}{m'} - g\right)}{\dfrac{f_1^W}{n'} + \dfrac{f_1^M}{m'} - g} - g}$$

$$= \frac{f_1^M}{l'} - \frac{\left(\dfrac{f_1^M}{l'}\right)^2 \left(\dfrac{f_1^W}{n'} + \dfrac{f_1^M}{m'} - g\right)}{\left(\dfrac{f_1^M}{l'} - g\right)\left(\dfrac{f_1^W}{n'} + \dfrac{f_1^M}{m'} - g\right) - \dfrac{f_1^W}{n'}\left(\dfrac{f_1^M}{m'} - g\right)}$$

Then, on the basis of equation (10'), such a diffraction order (m', n', l') with which the distance $L_2'$ as given by equation (15-1') and the distance $L_2$ of the (m, n, l)-th order light from the final surface to the imaging plane satisfy equation (14), is determined. In other words, by substituting n'=n and m+l=m'+l' into equation (15-1') and by rewriting the same with respect to m', then the following is obtained:

$$L_2' = \frac{f_1^M}{m+l-m'} - \frac{\left(\dfrac{f_1^M}{m+l-m'}\right)^2 \left(\dfrac{f_1^W}{n'} + \dfrac{f_1^M}{m'} - g\right)}{\left(\dfrac{f_1^M}{m+l-m'} - g\right)\left(\dfrac{f_1^W}{n} + \dfrac{f_1^M}{m'} - g\right) - \dfrac{f_1^W}{n}\left(\dfrac{f_1^W}{m'} - g\right)} \quad (15\text{-}1'')$$

On the other hand, $$L_2 = \frac{f_1^M}{l} - \frac{\left(\dfrac{f_1^M}{l}\right)^2 \left(\dfrac{f_1^W}{n} + \dfrac{f_1^M}{m} - g\right)}{\left(\dfrac{f_1^M}{l} - g\right)\left(\dfrac{f_1^W}{n} + \dfrac{f_1^M}{m} - g\right) - \dfrac{f_1^W}{n}\left(\dfrac{f_1^W}{m} - g\right)} \quad (15\text{-}1''')$$

In the present embodiment, the calculation of the position of incidence of light based on equation (11) is effected to such a set of diffraction orders m', n' and l' with respect to which, for particular $fl^M$, $fl^W$ and g as well as the diffraction orders m, n, l, the ratio of the imaging plane position $L_2$ of the (m, n, l)-th order light and the imaging plane position $L_2'$ of the (m', n', l')-th order light, namely, the difference $|L_2-L_2'|$ therebetween satisfies equation (14). Then, the light projection angle (incidence angle) θ and the focal lengths of the alignment marks as well as the locations of the detecting means are determined so as to assure that the spacing between the positions of incidence of these lights on the detecting means surface does satisfy at least equation (9-8) or, alternatively, to assure that the condition for preventing the (m', n', l')-th order light from impinging on the light receiving zone of the detecting means surface, namely, the following condition, is satisfied:

$$S' < -d_1/2 + x_S \text{ or } S' > -d_1/2 + x_S$$

More specifically, from equation (1), the position S of incidence of the (m, n, l)-th order light on the detecting means surface in the X direction is:

$$\begin{aligned} S = & [1 - L_1/(fm^M - g)][L_2/(L_1 - g)] \times \\ & \{[(x_{M0} - fm^M \tan\theta - x_W)L_1/(fm^M - g) + \\ & x_W - x_{M0}] \times L_2/(L_1 - g) + x_{M0}\} \end{aligned}$$

Similarly, the position S' of incidence of the (m', n', l')-th order light on the detecting means surface is:

$$\begin{aligned} S' = & [1 - L_1'/(fm'^M - g)][L_2/(L_1' - g)] \times \\ & \{[(x_{M0} - fm'^M \tan\theta - x_W)L_1'/(fm'^M - g) + \\ & x_W - x_{M0}] \times L_2/(L_1' - g) + x_{M0}\} \end{aligned} \quad (11)$$

where $$1/(L_1 - g) + 1/L_2 = -1/fl^M$$

$$1/(L_1' - g) + 1/L_2 = -1/fl'^M$$

Therefore, the parameters are set so as to assure that $l_{min}$ in which the X-axis relative gravity center spacing $l = |S - S'|$ on the detecting means surface of the (m, n, l)-th order light and the (m', n', l')-th order light as determined by the above equations satisfies equation (9-8) and that a relation $l \geq l_{min}$ is always satisfied. A practical process of parameter setting is substantially the same as that of the first embodiment.

As a result of this, by detecting the gravity center position of only one positional deviation signal light, it is possible to determine the quantity of positional deviation. Therefore, it is possible to avoid error factors in the detection such as, for example, a change in the effective deviation detection sensitivity (magnification) due to a change in the ratio of quantity of plural lights impinging and converging on the detecting means surface.

While in the foregoing embodiments the phenomenon that the spacing in the X direction of the gravity center positions on two light detecting means changes in proportion to the relative positional deviation in the X direction of a mask and a wafer is used, and the change in the spacing is detected. However, the present invention is not limited to this. As an example, the invention is applicable also to an arrangement wherein a single detecting means and a single light beam are used, and the relative positional deviation of the mask and the wafer is detected on the basis of a proportional relationship between (i) the quantity of deviation of the gravity center position of the diffraction light upon the single detecting means, from a preset reference position thereon, and (ii) the quantity of relative positional deviation of the mask and the wafer. Further, two light beams such as in the foregoing embodiments may be inputted to a single detecting means.

A position detecting system according to a second embodiment of the present invention is characterized in that: An alignment mark having a wavefront converting or light diffracting function is provided on a first object while another alignment mark having a wavefront converting or light diffracting function is provided on a second object. Of light from a light projecting means, light as influenced by the wavefront converting functions of these alignment marks of the first and second objects is directed to a predetermined plane and, by detecting the position of incidence of that light upon the predetermined plane through a detecting means, the relative positional deviation of the first and second objects is determined. The alignment mark of the second object is formed outside a region within which the light diffracted at zero-th order by the alignment mark of the first object is incident on the second object.

In another aspect of this embodiment of the present invention, the first object is equipped with two alignment marks A1 and A2 each having a wavefront converting function while the second object is equipped with two alignment marks B1 and B2 each having a wavefront converting function. Of light from a light projecting means, a first light as influenced by the wavefront converting functions of the alignment marks A1 and B1 of the first and second objects as well as a second light as influenced by the wavefront converting functions of the alignment marks A2 and B2 of the first and second objects, are directed to a predetermined plane. By detecting the positions of incidence of these lights on the predetermined plane through a detecting means, the relative positional deviation of the first and second objects is determined. Two alignment marks of the first object or the second object are formed in a single region in an overlapping or juxtaposed relation, and two alignment marks of the second object are formed outside a region within which the light diffracted at zero-th order by the two alignment marks of the first object is incident on the second object.

In another aspect of this embodiment of the present invention, the two alignment marks A1 and A2 or the two alignment marks B1 and B2 are provided by a single and common mark.

More specifically, in a preferred form of the present invention, when an object surface A provides the first object while an object surface B provides the second object, first and second signal producing alignment marks A1 and A2 each serving as a physical optic element having a wavefront converting function, are formed on the object surface A, in a separate relation to satisfy a predetermined condition. Also, on the other object surface B, first and second signal producing alignment marks B1 and B2 similarly each serving as a physical optic element, are formed in juxtaposition. Light is inputted to the alignment mark A1, and diffraction light caused thereby is inputted to the alignment mark B1. Diffraction light from the alignment mark B1 is incident on a predetermined plane, and the gravity center of the incident light on that plane is detected by a first detecting means, as the position of incidence of the first signal light.

Here, the term "gravity center of light" means such a point that, when on a light receiving surface a position vector of each point on the surface is multiplied by the light intensity of that point and the thus obtained products are integrated over the entire surface, the integrated level has a "zero vector". However, as an alternative, the position of a peak point of the light intensity may be detected.

Similarly, light is inputted to the alignment mark A2, and diffraction light caused thereby is inputted to the alignment mark B2. A gravity center of diffraction light from the alignment mark B2, on a predetermined plane, is detected by a second detecting means as the position of incidence of the second signal light. By using two data from the first and second detecting means, the positioning of the objects A and B is executed. Here, in order to avoid the effect of the m', n', l')-th order light which causes a detection error factor to the (m, n, l)-th order light the factor such as the alignment mark position, the direction of incidence of the input light or the like is set as described.

In this form of the present embodiment, the alignment marks A1, A2, B1 and B2 are so set that the gravity center position of the light incident on the first detecting means and the gravity center position of the light incident on the second detecting means, shift in opposite directions in response to a positional deviation between the objects A and B.

Figure 6:
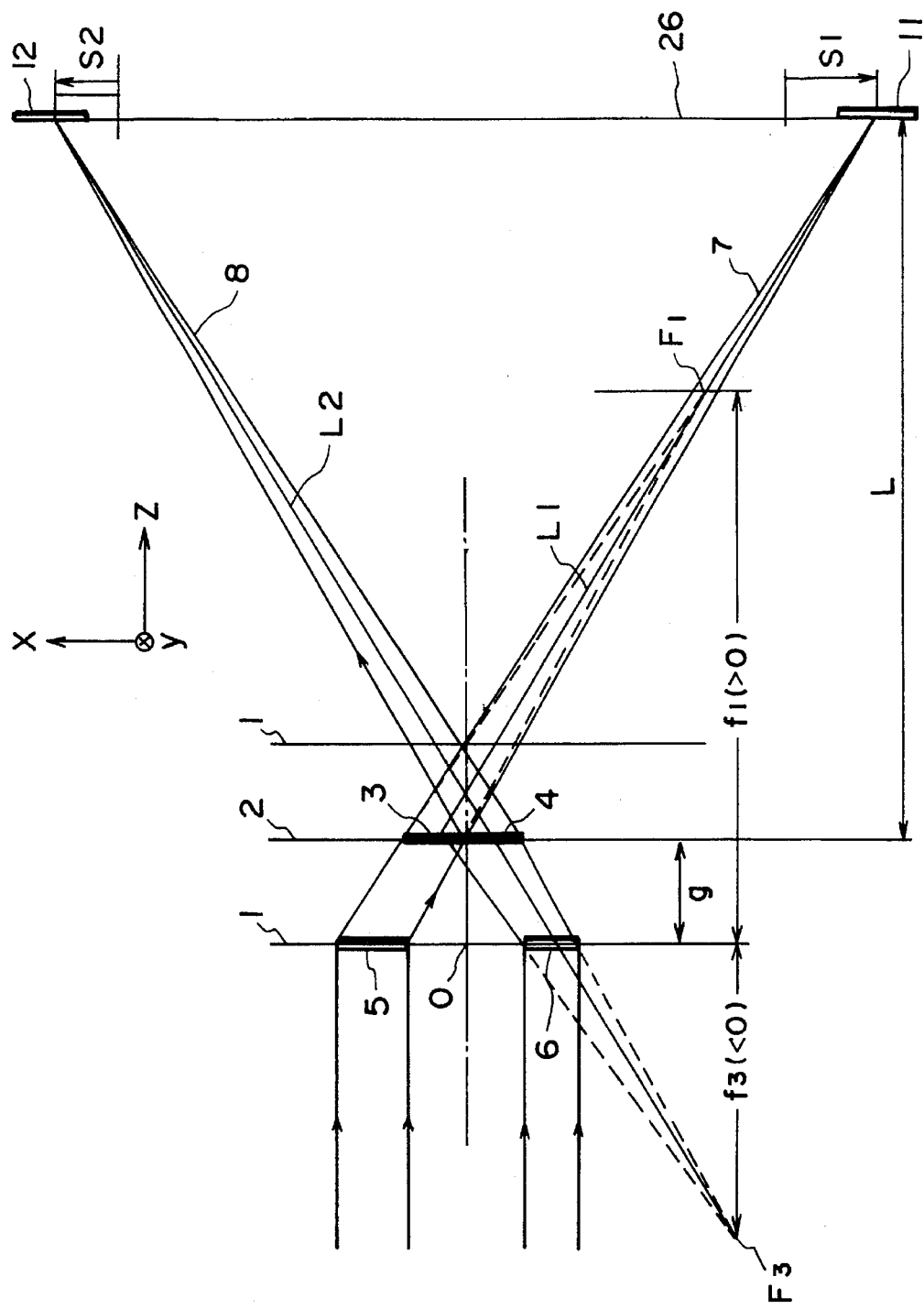
FIGS. 6 and 7 are schematic representations of a second embodiment of the present invention.
Figure 7:
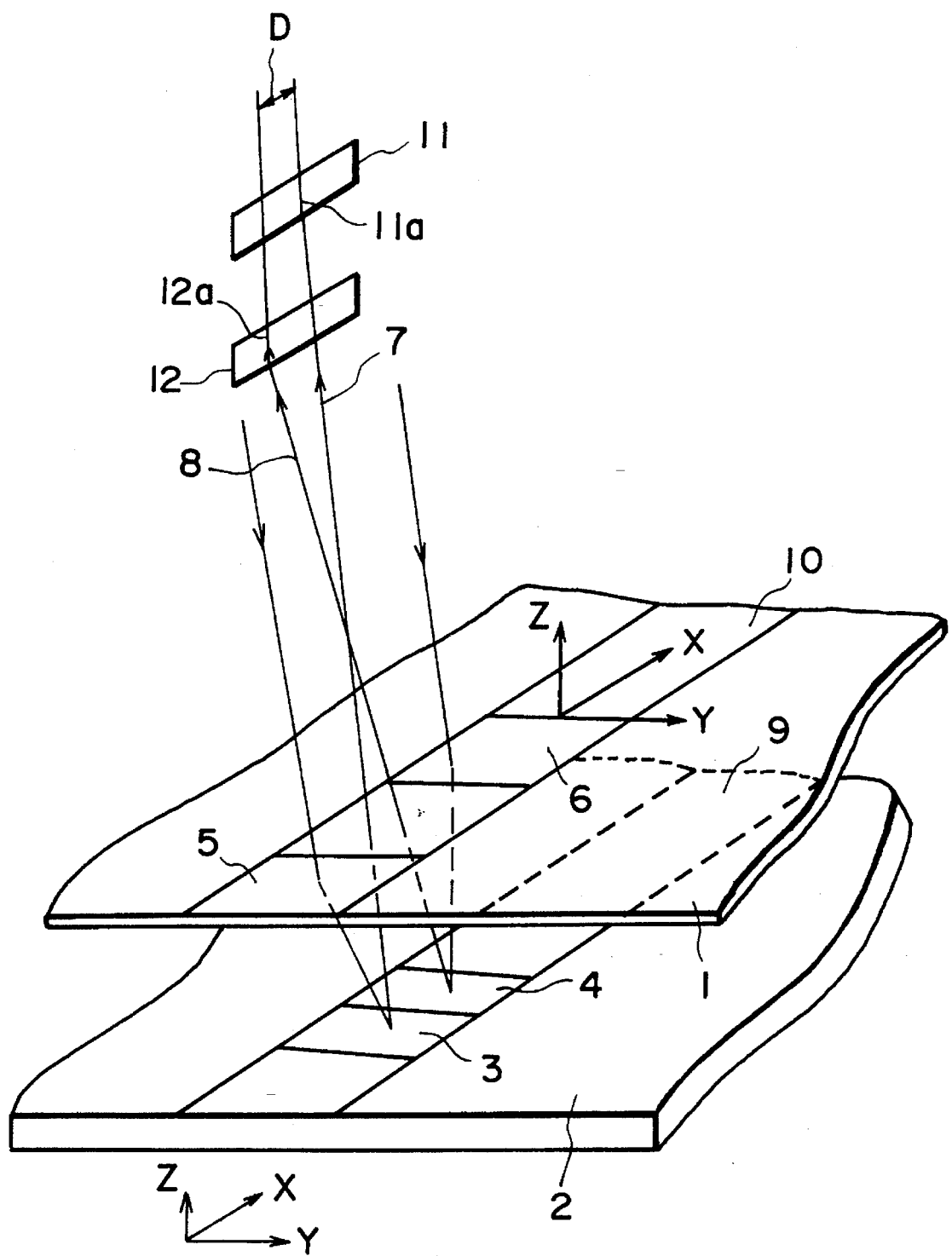

FIG. 6 is a schematic view for explaining the principle of a second aspect of the present invention as well as structural features of it. FIG. 7 is a perspective view of a major part of a second embodiment of the present invention, based on the FIG. 6 structure.

In these drawings, denoted at 1 is a first object (object surface A) which is a mask, for example, and denoted at 2 is a second object (object surface B) which is a wafer, for example. The illustrated embodiment is an example wherein a relative positional deviation of the first and second objects is to be detected.

Since in this embodiment the light passing through the first object 1 and being reflected by the second object 2 goes again through the first object 1 and is diffracted at zero-th order thereby, in FIG. 3 the first object is illustrated in duplication. Denoted at 5 and 3 are alignment marks which are provided on the first and second objects 1 and 2, respectively, for obtaining a first signal light. Similarly, denoted at 6 and 4 are alignment marks provided on the first and second objects 1 and 2, respectively, for obtaining a second signal light. In FIG. 6, the paths are illustrated with the alignment marks 3 and 4 being replaced by equivalent transmission type alignment marks.

Each of the alignment marks 3–6 comprises an optical member with a wavefront converting function which serves as a physical optic element such as, for example, a grating lens having an optical power (such as a one-dimensional or two-dimensional lens function) or a diffraction grating having no lens function.

In this embodiment, the two alignment marks 5 and 6 provided on the first object 1 are spaced from each other in the alignment direction or the positional deviation detecting direction (X direction), by a predetermined distance. On the other hand, the two alignment marks 3 and 4 provided on the second object 2 are juxtaposed with each other. Here, the alignment mark setting is such that, when, of light from a light source means (not shown), light inputted to the two alignment marks 5 and 6 of the first object 1 and diffracted at zero-th order by the alignment marks 5 and 6 (simply transmitted) is incident on the second object 2 surface, the two alignment marks 3 and 4 are positioned outside the region in which the light is incident.

Here, it is not necessary that the alignment marks 3 and 4 of the second object are positioned completely outside the region of incidence of the zero-th order diffraction light, and they may partially overlap that region. If, as an example, the area of the overlapped portion is not greater than about 30% of the area of the alignment mark, the object of the present invention can be accomplished sufficiently. This structure is effective to reduce the intensity of unwanted diffraction light, other than the signal light, to a level not greater than one-third of the signal light and, therefore, the effect of the unwanted diffraction light upon the positional deviation detection can be made small.

Denoted at 9 is a wafer scribe line and denoted at 10 is a mask scribe line. Each alignment mark is formed on the corresponding scribe line. Reference numerals 7 and 8 denote the first and second alignment signal lights, while reference numerals 7' and 8' denote (unwanted) diffraction lights of predetermined orders related to the first and second signal lights 7 and 8 and causing a detection error factor.

In this embodiment, the first signal light 7 is provided by a (1, −1, 0)-th order light; the second signal light 8 is provided by a (−1, 1, 0)-th order light; the light 7' is provided by a (0, −1, 1)-th order light; and the light 8' is provided by a (0, 1, −1)-th order light, like the first embodiment.

Denoted at 11 and 12 are first and second detecting means for detecting the first and second signal lights 7 and 8, respectively. Each of the first and second detecting means comprises a one-dimensional (linear) CCD sensor, for example, having its sensing elements arrayed in the X-axis direction.

For convenience in explanation, the optical distance from the second object 2 to the first detecting means 11 or the second detecting means 12 is denoted by L. Further, g denotes the distance between the first and second objects 1 and 2; $f_1$ and $f_3$ denote the focal lengths of the alignment marks 5 and 6; $\Delta\sigma$ denotes the relative positional deviation of the first and second objects 1 and 2; and $S_1$ and $S_2$ denote displacements of the gravity center positions of the first and second signal lights on the first and second detecting means, respectively, at that time, from the positions as assumed under correct alignment. Conveniently, the alignment light inputted from an unshown light source to the object 1 is a plane wave. The signs are such as illustrated.

Each of the displacements $S_1$ and $S_2$ can be determined geometrically as a point of intersection between (i) the light receiving surface of the first (or second) detecting means 11 or 12 and (ii) the straight line that connects the focal point $F_1$ ($F_2$) of the alignment mark 5 (6) and the optical axis center of the alignment mark 3 (4). Therefore, the opposability in direction of the displacements $S_1$ and $S_3$ of the gravity centers of these lights, responsive to a relative positional deviation of the first and second objects 1 and 2, is attainable by applying an inversive relationship to the signs of optical imaging magnifications of the alignment marks 3 and 4.

In this embodiment, examples that can be used as a light source are: a light source such as a semiconductor laser, a He-Ne laser, an Ar laser or the like that can emit a coherent light; and a light source such as a light emitting diode or the like that can emit an incoherent light.

In this embodiment, as shown in FIG. 7, the (1, −1, 0)-th order light which is the light 7 as well as the (−1, 1, 0)-th order light which is the light 8, are those lights: which are incident upon the alignment marks 5 and 6, respectively, on the mask 1 surface each at a predetermined angle; which are then transmissively diffracted by these marks and then reflectively diffracted by the alignment marks 3 and 4 on the wafer 2 surface, respectively; and which are then incident on the detecting means 11 and 12, respectively. On the other hand, the (0, −1, 1)-th order light which is the light 7' as well as the (0, 1, −1)-th order light which is the light 8', are those lights: which are transmitted at zero-th order by the alignment marks 5 and 6 on the mask 1; which are then reflectively diffracted by the alignment marks 3 and 4 on the wafer 2 surface, respectively; and which are then transmissively diffracted by the alignment marks 5 and 6 on the mask 1 surface and incident on an area outside the detecting means 11 and 12. Alternatively, if these lights are incident on the detecting means 11 and 12, they do not adversely affect the detection of the first and second signal lights, and the alignment marks 3–6 are so set.

The gravity center positions of the first and second alignment lights 7 and 8, respectively, incident on the respective detecting means 11 and 12 are detected and, by using output signals from the detecting means 11 and 12, any positional deviation of the mask 1 and the wafer 2 can be detected.

Next, description will be made of the angle of projection of the light to an alignment mark with respect to a normal to the alignment mark surface (FIG. 6) as well as the position of incidence of the light upon the detecting means surface responsive to a positional deviation $\Delta\sigma$ of the first and second objects.

If the center position (optical axis position) of the first alignment mark 5 of the first object is denoted by $(x_{M01}, y_{M01}, 0)$ and the position of the imaging point of a parallel light incident on the alignment mark 5 with an angle $\theta$ in the X-Z plane is denoted by $(x_{M1}, y_{M1}, z_{M1})$, then it follows that $z_{M1}=-f_1$.

On the other hand, it is assumed that the center position (optical axis position) of the alignment mark 3 of the second object as there is no relative positional deviation is denoted by $(x_{W1}, y_{W1}, -g)$ and also that the alignment mark 3 is so designed as to form, at a position $(x_{S1}, y_{S1}, z_{S1})$, an image of a point light source (point image) which is at a position $(x_{M1}, y_{M1}, -f_1)$ if there is no positional deviation. Similarly, the center position (optical axis position) of the alignment mark 6 of the first object is denoted by $(x_{M02}, y_{M02}, 0)$ and, like the alignment mark 5, the imaging point position of a parallel light incident on the alignment mark 6 at an angle $\theta$ in the X-Z plane is denoted by $(x_{M2}, y_{M2}, -f_3)$. Further, it is assumed that the center position (optical axis position) of the alignment mark 4 as there is no positional deviation is denoted by $(x_{W2}, y_{W2}, -g)$ and that the mark 4 is so designed as to form, at a position $(x_{S2}, y_{S2}, z_{S2})$, an image of a point light source (point image) which is at a position $(x_{M2}, y_{M2}, -f_3)$ as there is no positional deviation. Additionally, the distance from the mask surface 26 to the detecting means surface is denoted by L.

When, under the above parameter setting, the displacement of the gravity center position of the light $(1, -1, 0)$-th order light which is the light 7 to be caused upon the detecting means surface in response to a positional deviation $\Delta\sigma$ of the second object relative to the first object, is denoted by $S_{11}$, then it can be expressed as follows:

$$S_{11}=[1-L/(f_1-g)](x_{W1}-x_{M1}+\Delta\sigma)+x_{M1} \quad (21)$$

Similarly, when the displacement of the gravity center position of the $(-1, 1, 0)$-th order light which is the light 8 to be caused on the detecting means surface, is denoted by $S_{12}$ then it can be expressed as follows:

$$S_{12}=[1-L/(f_3-g)](x_{W2}-x_{M2}+\Delta\sigma)+x_{M2} \quad (22)$$

Further, from the general relationship on lens imaging characteristics, it follows that:

$$x_{M0i}=x_{Mi} \ (i=1, 2) \quad (23)$$

Also, $x_{Mi}$ and $x_{Wi}$ are the quantities that are determined by the angles of deflection, with respect to the chief ray of input light, of the alignment marks of the first and second objects as well as the focal lengths of these marks, respectively, and they are expressed as follows:

$$\begin{cases} x_{Mi}=f_{2i-1}\tan\phi_{2i-1} \\ x_{Wi}=f_{2i}\tan\phi_{2i} \end{cases} (i=1, 2) \quad (24)$$

Now, it is assumed that the center of the alignment mark setting region of the first object is taken as an origin; the X axis is laid on the alignment mark surface along the direction with respect to which the positional deviation is to be detected; the Y axis is laid along a direction perpendicular to the X axis; and the Z axis is laid along a direction of a normal to the alignment mark surface.

The detecting means has a light receiving zone with its center denoted by $(x_S, y_S, z_S)$, and the light receiving zone has a rectangular shape of a size $d_1$ in the X direction and $d_2$ in the direction perpendicular thereto.

In the present embodiment, the relative distance d in the X direction of the positions of incidence of the two lights 7 and 8 (light quantity gravity center positions of them) upon the detection surface, is measured and, from a difference of the measured relative distance d from a reference length $d_0$, that is, from a difference $S=d-d_0$, the positional deviation $\Delta\sigma$ is determined. Namely:

$$\begin{aligned} d &= S_1 - S_2 \qquad (25)\\ &= [1-L/(f_1-g)](x_W-x_{M1}+\Delta\sigma)+x_{M1}-\\ &\quad [1-L/(f_3-g)](x_{W2}-x_{M2}+\Delta\sigma)-x_{M2}\\ &= [L/(f_3-g)-L/(f_1-g)]\Delta\sigma+\\ &\quad [1-L/(f_1-g)](x_{W1}-x_{M1})-\\ &\quad [1-L/(f_3-g)](x_{W2}-x_{M2})+x_{M1}-x_{M2}\\ &= [L/(f_3-g)-L/(f_1-g)]\Delta\sigma+d_0 \end{aligned}$$

wherein $$d_0=[1-L/(f_1-g)](x_{W1}-x_{M1})-[1-L/(f_3-g)](x_{W2}-x_{M2})+x_{M1}-x_{M2}$$

From equation (25), the difference S is given by:

$$S=L[1/(f_3-g)-1/(f_1-g)]\Delta\sigma$$

If $$\alpha=L[1/(f_3-g)-1/(f_1-g)]$$

then, $\alpha$ represents the detection magnification to a positional deviation $\Delta\sigma$. Therefore, if $\alpha$ is known, from $S/\alpha$, it is possible to determine the positional deviation $\Delta\sigma$.

An important feature of the present embodiment is that, in addition to the locations of the alignment marks, as seen in FIG. 6, the path of the first signal light 7 intersects the path of the second signal light 8 in the course of convergence upon the detection surface.

A Gaussian-distribution parallel light having a peak of intensity distribution in the neighborhood of a middle point O of the alignment marks 5 and 6 is projected onto the first object (mask) 1 and the paths for the first and second signal lights 7 and 8 intersect with each other. When this arrangement is adopted, as a result of ray tracing simulation, the inventors have revealed that, even if the spacing between the first and second objects (mask and wafer) changes, the relative gravity center distance d of the two lights upon the detection surface substantially unchange.

Thus, the present embodiment effectively reduces occurrence of an error in the positional deviation measurement, due to a change in the relative light quantity of the $(1, -1, 0)$-th order light and the $(0, -1, 1)$-th order light, or a change in the spacing between the first and second objects.

As a matter of course, the present embodiment can be applied to a proximity type semiconductor device manufacturing apparatus such as illustrated in FIGS. 5A–5C.

Figure 8:
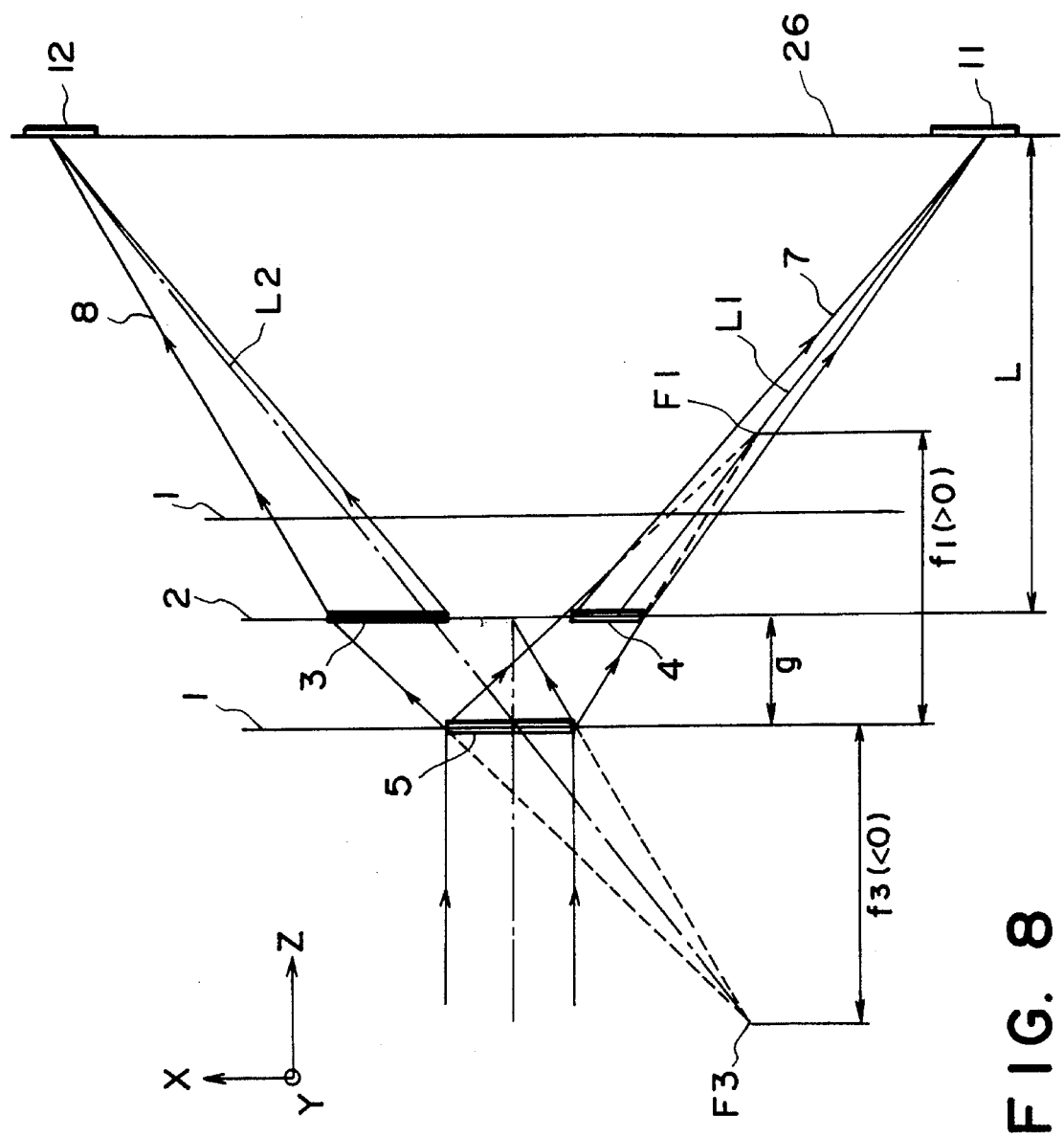
FIG. 8 is a schematic representation of a modified form of the second embodiment.

FIG. 8 is a schematic representation, showing a modified form of the second embodiment, and like numerals as of those of FIG. 6 are assigned to corresponding elements.

In this example, the first object 1 is provided with an alignment mark 5 defined by a single continuous zone, while the second object 2 is provided with two alignment marks 3 and 4 which are spaced from each other by a predetermined distance. The alignment marks 3 and 4 are positioned outside such a region within which the light inputted to the alignment mark 5 of the first object 1 and diffracted at zero-th order thereby is incident on the second object.

In this embodiment, for convenience, the light influenced by a wavefront converting function at the second object 2 surface is illustrated as being transmitted through the second object 2. Actually, however, it may be such light reflected by the second object 2 surface and then transmissively diffracted at zero-th order by the first object 1 surface.

As regards the locations of the alignment marks, the alignment marks 3 and 4 are disposed separately from each other so as to prevent that, as there is substantially no positional deviation, the alignment marks 3 and 4 of the second object 2 are positioned just below the alignment mark 5 of the first object 1. Or, the size and location of each alignment mark are so determined that, when the alignment mark of the second object 2 is partially located just below the alignment mark 5 of the first object 1, the area of such a region in which the alignment mark of the first object 1 as projected onto the second object 2 surface overlaps with the alignment marks 3 and 4 of the second object 2, is made sufficiently small such as, for example, not greater than 30% of the total area of the alignment marks of the second object.

Under the alignment mark setting as described above, in the present embodiment, the first signal light 7 is such light as diffracted at positive first order by the alignment mark (grating lens) 5 of the mask 1 and transmitted through the first object 1 in the form of a convergent light, then diffracted at first order by the alignment mark 4 of the second object 2 and reflected by the second object 2 surface and, then, transmitted at zero-th order through the first object 1 and, finally, converged upon the detecting means 11 surface.

The wavefront converting action of the grating lens (alignment mark) 4 of the second object 2 is a light diverging action, and the grating lens 4 serves as a concave lens.

On the other hand, the second signal light 8 is such light as influenced by negative first order diffracting action (concave lens action) of the alignment mark 5 of the first object and transmitted through the first object 1 in the form of a divergent light, then influenced by first order reflective diffraction action of the alignment mark 3 of the second object (serving as a convex lens), and then, after passing through the mask 1, finally converged upon the detecting means 12 surface, like the first signal light 7.

As described hereinbefore, in the present embodiment, two lights which are different in sign of diffraction order (positive and negative) are produced by the grating lens (alignment mark) 5 of the first object (mask) 1, and these lights are influenced by different wavefront converting actions of the grating lenses (alignment marks) 3 and 4 disposed in different regions on the second object (wafer) 2 surface. Then, from the gravity center positions of light intensity distributions of the two lights upon the detection surface 26, the relative gravity center distance of these two lights is detected and, in a manner similar to that of the second embodiment, the relative positional deviation of the first and second objects is determined. Also, in the present embodiment, like the second embodiment, upon the detection means 11 and 12, to the light diffracted by the combination of the alignment marks 4 and 5, a single signal light, that is, the (1, −1, 0)-th order light 7 is focused and, also, to the light diffracted by the combination of the alignment marks 3 and 5, a single signal light, that is, the (−1, 1, 0)-th order light 8 is focused. In this manner, as the signal light, a single light having a history of diffraction orders, predetermined, can be received and, therefore, the occurrence of positional deviation measurement error due to convergence of plural lights having different histories of diffraction orders can be suppressed.

While in these embodiments the phenomenon that the spacing in the X direction of the gravity center positions on two light detecting means changes in proportion to the relative positional deviation in the X direction of a first object (mask) and a second object (wafer) is used, and the change in the spacing is detected. However, the present invention is not limited to this. As an example, the invention is applicable also to an arrangement wherein the relative positional deviation of the mask and the wafer is detected on the basis of a proportional relationship between (i) the quantity of deviation of the gravity center position of the diffraction light upon a single detecting means, from a preset reference position thereon, and (ii) the quantity of relative positional deviation of the mask and the wafer.

Further, like the first embodiment, the (0, −1, 1)-th order light or the (0, 1, −1)-th order light may be used as a signal light, while preventing the production of or reducing the intensity of the (1, −1, 0)-th order light or the (−1, 1, 0)-th order light.

A position detecting system according to a third embodiment of the present invention is characterized in that: When a relative positional deviation of first and second objects opposed to each other is to be detected, the first object is equipped with two alignment marks A1 and A2 each having a wavefront converting function while the second object is equipped with two alignment marks B1 and B2 each having a wavefront converting function. Light from a light projecting means is projected obliquely upon the first object surface, from one of opposite sides of a reference plane as defined by a normal to the first object surface and a direction perpendicular to the positional deviation detecting direction. The light is influenced by the wavefront converting functions of the alignment marks A1 and B1, whereby a first (signal) light is produced. Also, light from the light projecting means is projected obliquely upon the first object surface, from the other side of the reference plane, and the light is influenced by the wavefront converting functions of the alignment marks A2 and B2, whereby a second (signal) light is produced. Each of the first and second lights is directed to a predetermined plane, and the position of incidence of the first light or the second light upon that plane is detected through a detecting means. The relative positional deviation of the first and second objects is determined by using an output signal from the detecting means.

Particularly, in this aspect of the present invention, the two alignment marks A1 and A2 provided on the first object are spaced from each other in the positional deviation detecting direction, by a predetermined distance. The angles of incidence of the lights inputted from the light projecting means to the two alignment marks A1 and A2 are so set that the paths of regularly reflected lights from the alignment mark surfaces do not intersect with each other. Each of the first and second (signal) lights is influenced by the imaging action of a corresponding alignment mark, and the path of the first light and the path of the second light, as projected onto the first object surface, intersect with each other. The direction and angle of incidence of each of the two lights as well as the shape of the mark pattern, rotation and the like of each alignment mark are so set.

More specifically, in a preferred form of this embodiment of the present invention, when an object surface A provides the first object while an object surface B provides the second object, first and second signal producing alignment marks A1 and A2 each having a function of a physical optic element, are formed on the object surface A. Also, on the other object surface B, first and second signal producing alignment marks B1 and B2 similarly each having a function of a physical optic element, are formed. Light is inputted to the alignment mark A1, and diffraction light caused thereby is inputted to the alignment mark B1. Diffraction light from the alignment mark B1 is incident on a predetermined plane, and the gravity center of the incident light on that plane is detected by a first detecting means as the position of incidence of the first signal light.

Here, the term "gravity center of light" means such a point that, when on a light receiving surface a position vector of each point on the surface is multiplied by the light intensity of that point and the thus obtained products are integrated over the entire surface, the integrated level has a "zero vector". However, as an alternative, the position of a peak point of the light intensity may be detected.

Similarly, light is inputted to the alignment mark A2, and diffraction light caused thereby is inputted to the alignment mark B2. A gravity center of diffraction light from the alignment mark B2, on a predetermined plane, is detected by a second detecting means, provided on that plane, as the position of incidence of the second signal light.

Here, the light to be inputted to the alignment mark A1 and the light to be inputted to the alignment mark A2, are projected obliquely in different directions with respect to a difference plane as defined by a normal to the first object surface and a direction perpendicular to the positional deviation detecting direction.

By using two data from the first and second detecting means, the positioning of the objects A and B is executed. Here, the system is arranged so as to reduce the effect of the (m', n', l')-th order light or edge scattered light which causes a detection error factor to the (m, n, l)-th order light.

In this form of the present embodiment, the alignment marks A1, A2, B1 and B2 are so set that the gravity center position of the light incident on the first detecting means and the gravity center position of the light incident on the second detecting means, shift in opposite directions in response to a positional deviation between the objects A and B.

Figure 9:
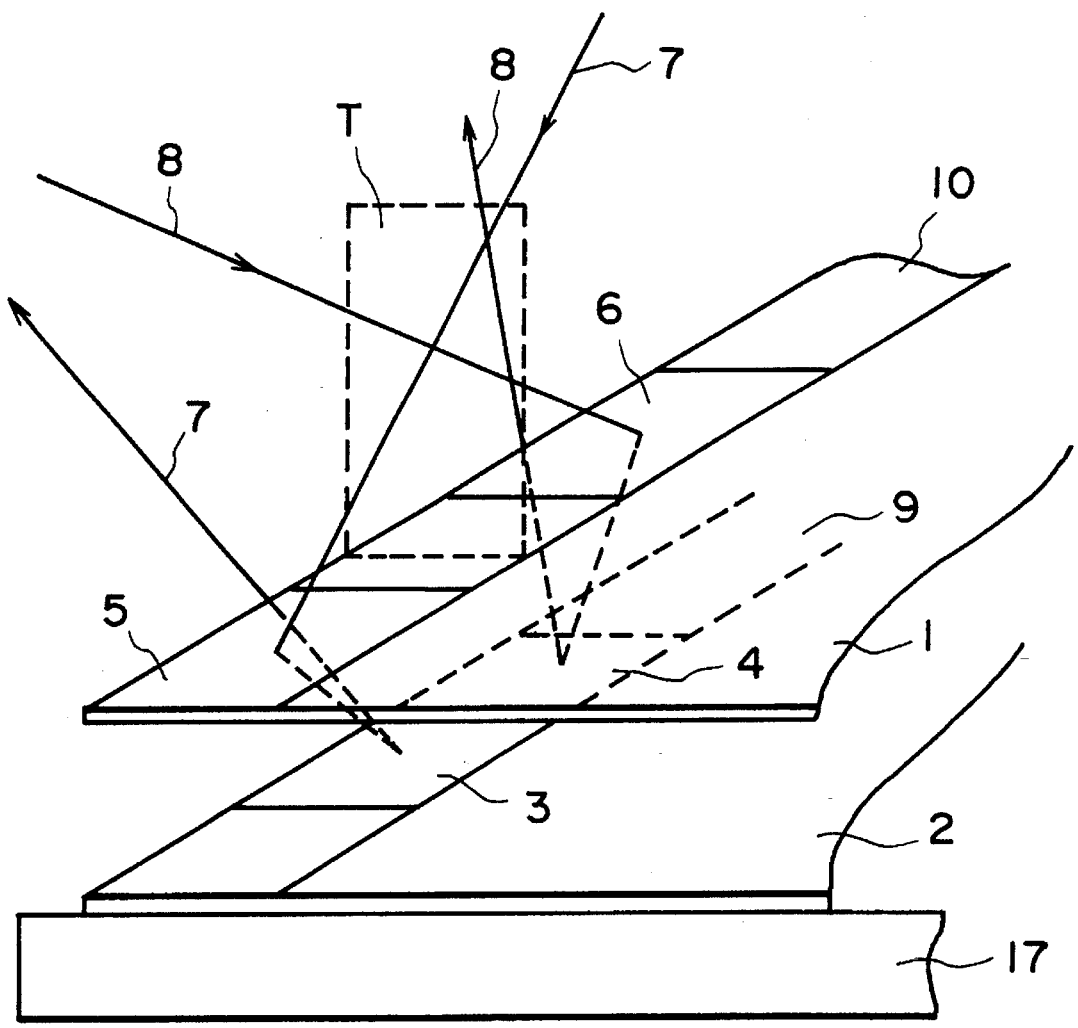
FIGS. 9, 10 and 11 are schematic representations of a third embodiment of the present invention.
Figure 10:
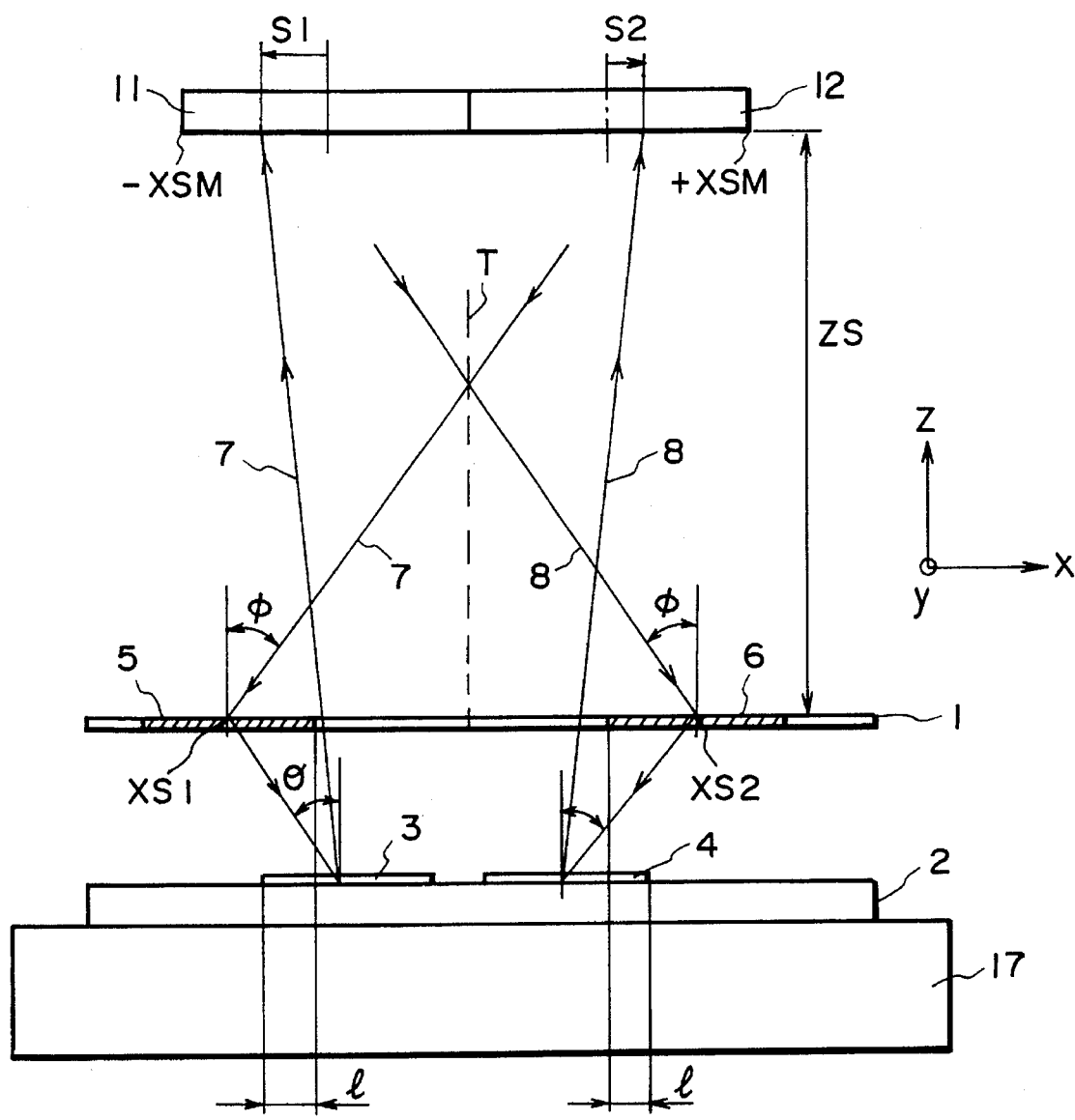
Figure 11:
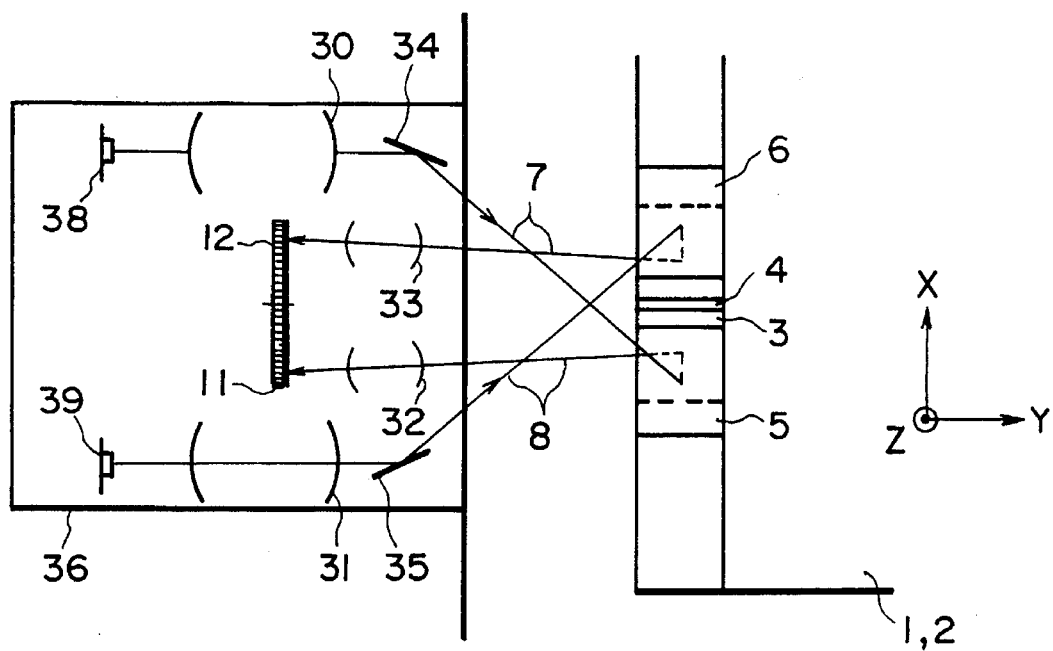

FIG. 9 is a perspective view showing a major part of a third embodiment of the present invention. FIG. 10 is a sectional view taken along the X-Z plane in FIG. 9, and FIG. 11 is a sectional view taken along the X-Y plane in FIG. 9.

In these drawings, denoted at 1 is a first object (object surface A) which is a mask, for example, and denoted at 2 is a second object (object surface B) which is a wafer, for example. The illustrated embodiment is an example wherein a relative positional deviation of the first and second objects is to be detected. Denoted at 5 and 3 are alignment marks which are provided on the first and second objects 1 and 2, respectively, for obtaining a first signal light. Similarly, denoted at 6 and 4 are alignment marks provided on the first and second objects 1 and 2, respectively, for obtaining a second signal light. In this example, the alignment marks 5 and 6 of the first object 1 are spaced from each other in the deviation detecting direction (X direction) by a predetermined distance.

Each of the alignment marks 3–6 comprises an optical member with a wavefront converting function which serves as a physical optic element such as, for example, a grating lens having a one-dimensional or two-dimensional lens function or a diffraction grating having no lens function. Denoted at 9 is a wafer scribe line and denoted at 10 is a mask scribe line. Each alignment mark is formed on the corresponding scribe line. Reference numerals 7 and 8 denote the first and second (alignment) signal lights.

The first and second signal lights 7 and 8 are projected obliquely, from different sides of a reference plane T as defined by a normal to the first object 1 surface and a direction (Y direction) perpendicular to the positional deviation detecting direction (X direction). In these drawings, the first and second signal lights are projected obliquely in the directions substantially symmetrical with respect to the reference plane T.

Reference numerals 7' and 8' denote (unwanted) diffraction lights of predetermined orders related to the first and second signal lights 7 and 8.

In this embodiment, the first signal light 7 is provided by a (1, −1, 0)-th order light; the second signal light 8 is provided by a (−1, 1, 0)-th order light; the light 7' is provided by a (0, −1, 1)-th order light; and the light 8' is provided by a (0, 1, −1)-th order light.

Denoted at 11 and 12 are first and second detecting means for detecting the first and second signal lights 7 and 8, respectively. Each of the first and second detecting means comprises a one-dimensional (linear) CCD sensor, for example, having its sensing elements arrayed in the X-axis direction.

For convenience in explanation, the optical distance from the second object 2 to the first detecting means 11 or the second detecting means 12 is denoted by L. Further, g denotes the distance between the first and second objects 1 and 2; $f_{a1}$ and $f_{a2}$ denote the focal lengths of the alignment marks 5 and 6; $\Delta\sigma$ denotes the relative positional deviation of the first and second objects 1 and 2; and $S_1$ and $S_2$ denote displacements of the gravity center positions of the first and second signal lights on the first and second detecting means, respectively, at that time, from the positions as assumed under correct alignment. Conveniently, the alignment light inputted to the object 1 is a plane wave. The signs are such as illustrated.

Each of the displacements $S_1$ and $S_2$ can be determined geometrically as a point of intersection between (i) the light receiving surface of the first (or second) detecting means 11 or 12 and (ii) the straight line that connects the focal point $F_1$ ($F_2$) of the alignment mark 5 (6) and the optical axis center of the alignment mark 3 (4). Therefore, the opposability in direction of the displacements $S_1$ and $S_2$ of the gravity centers of these lights, responsive to a relative positional deviation of the first and second objects 1 and 2, is attainable by applying an inversive relationship to the signs of optical imaging magnifications of the alignment marks 3 and 4.

In this embodiment, examples that can be used as a light source are: a light source such as a semiconductor laser, a He-Ne laser, an Ar laser or the like that can emit a coherent light; and a light source such as a light emitting diode or the like that can emit an incoherent light.

In this embodiment, as shown in FIG. 10, the (1, −1, 0)-th order light which is the lights 7 as well as the (−1, 1, 0)-th order light which is the light 8, are those lights: which are incident upon the alignment marks 5 and 6, respectively, on the mask 1 surface each at a predetermined angle; which are then transmissively diffracted by these marks and then reflectively diffracted by the alignment marks 3 and 4 on the wafer 2 surface, respectively; and which are then incident on the detecting means 11 and 12, respectively.

Referring now to FIG. 11, description will be made of a light projecting optical system for projecting lights upon the alignment marks 5 and 6 of the first object, in different directions.

FIG. 11 is a general and schematic view, as seen from above, of an alignment pickup head 36 which accommodates in a single casing light sources 38 and 39, light projecting optical systems 30 and 31, mirrors 34 and 35, and light receiving optical systems 32 and 33, as well as the alignment marks 3–6 and the first and second lights 7 and 8.

The first signal light 7 emanates from the light source 38 and, after passing the light projecting optical system 30 and the mirror 34, it is projected to the alignment mark 5 of the first object (mask) 1 at a predetermined angle. Similarly, the second signal light 8 emanates from the light source 39 and, after passing the light projecting optical system 31 and the mirror 35, it is projected onto the alignment mark 6 of the first object 1 at a predetermined angle. Here, the angles of incidence of the first and second lights 7 and 8 upon the first object are so set that, in order to prevent intersection of regularly reflected lights from the first object 1 surface as irradiated, the input lights to be projected to the first object 1 surface intersect, beforehand, with each other.

This facilitates the setting of location, size and the like of each alignment mark, necessary for avoiding degradation of the positional deviation measurement precision which otherwise is caused by impingement on the first detecting means 11 surface of plural positional deviation signal lights such as, for example, the (1, −1, 0)-th order diffraction light which is the light 7 and the (0, −1, 1)-th order diffraction light which is the light 7'. Also, it is possible to avoid impingement on the surface of the first or second detecting means 11 or 12 of edge scattered light, from an edge of a circuit pattern extending in the X direction.

Referring to FIG. 10, the conditions for avoidance will be explained.

As regards the concurrent production of a signal light, i.e., the (1, −1, 0)-th order light 7 and an unwanted light, i.e., the (0, −1, 1)-th order light 7', the present embodiment is arranged so that only the (1, −1, 0)-th order light is received as the signal light. To this end, with regard to the angle of incidence of each of the first and second signal lights 7 and 8 upon the first object 1 surface and with regard to the location in the X direction of each of the alignment marks 3–6, there is a condition such as follows:

$$g\tan\phi > l \tag{31}$$

wherein g is the spacing between the first and second objects in the Z direction, $\phi$ is the angle of incidence in the X-Z plane of each signal light 7 or 8, with respect to a normal to the first object 1 surface, and l denotes the distance in the X direction between the boundary of each alignment mark in the −X direction (+X direction) on the first object and the boundary in the +X direction (−X direction) on the second object (the parenthesized direction being related to the alignment mark for the first signal light 7), as seen in FIG. 10.

Also, in order to avoid impingement of edge scattered light from a pattern upon the detecting means 11 or 12, there is a condition such as follows:

$$ZS\tan\phi_2 + xs_2 > xsM \tag{32}$$

and $$-ZS\tan\phi_1 + xs_1 > -xsM \tag{33}$$

wherein $\phi_1$ and $\phi_2$ each denotes an angle defined in the X-Z plane between the chief ray of input light and a normal to the first object 1 surface, ZS is the distance from the first object 1 surface to the detecting means 11 or 12 in the Z direction, $xs_1$ and $xs_2$ represent the center positions of the alignment marks 5 and 6, respectively, on the first object 1 surface with respect to the X direction, and $\pm xsM$ represents the positions of the opposite ends of the light receiving zone of each detecting means in the X direction.

In the present embodiment, in accordance with equations (31), (32) and (33), the conditions for impingement of the first and second alignment signal lights upon the first object 1 surface, the location and size of each alignment mark, the imaging condition for each of the first and second lights 7 and 8, and the like, are designed appropriately, to thereby assure avoidance of unwanted diffraction lights 7' and 8' or edge scattered light, from impinging on the detecting means 11 or 12.

Further, in the present embodiment, the first and second lights 7 and 8 are projected to the first object at angles substantially symmetrical with each other, with respect to the reference plane T, and the structure of the overall system is approximately symmetrical with respect to the reference plane T. With this arrangement, any change in the position of incidence of the light upon the detecting means, due to relative inclination of the first and second objects, any change in the spacing therebetween or the light, can be cancelled relatively between the first and second signal lights 7 and 8.

Further, as compared with the distance between the alignment marks 5 and 6 of the first object (as measured in the X direction), the distance between the alignment marks 3 and 4 of the second object (as measured in the X direction) can be made small. As a result, the detection is not affected by any local waviness or distortion of the surface of the second object.

Next, description will be made of the angle of projection of the light to an alignment mark with respect to a normal to the alignment mark surface as well as the position of incidence of the light upon the detecting means surface responsive to a positional deviation of the first and second objects in the X direction. The alignment marks 3, 4, 5 and 6 are provided by grating lenses, respectively. These grating lenses 5, 3, 6 and 4 have respective focal lengths which are denoted by $f_1$, $f_2$, $f_3$ and $f_4$, respectively.

If the center position (optical axis position) of the alignment mark 5 of the first object is denoted by $(x_{M01}, y_{M01}, 0)$ and the position of the imaging point of a parallel light incident on the alignment mark 5 with an angle $\theta$ is denoted by $(x_{M1}, y_{M1}, z_{M1})$, then it follows that $z_{M1} = -f_1$.

On the other hand, it is assumed that the center position (optical axis position) of the alignment mark 3 of the second object as there is no relative positional deviation is denoted by $(x_{W1}, y_{W1}, -g)$ and also that the alignment mark 3 is so designed as to form, at a position $(x_{S1}, y_{S1}, z_{S1})$, an image of a point light source (point image) which is at a position $(x_{M1}, y_{M1}, -f_1)$ if there is no positional deviation. Similarly, the center position (optical axis position) of the alignment mark 6 of the first object is denoted by $(x_{M02}, y_{M02}, 0)$, and the imaging point position of the parallel light by the alignment mark 6 is denoted by $(x_{M2}, y_{M2}, -f_3)$. Further, it is assumed that the center position (optical axis position) of the alignment mark 4 as there is no positional deviation is denoted by $(x_{W2}, y_{W2}, -g)$ and that the mark 4 is so designed as to form, at a position $(x_{S2}, y_{S2}, z_{S2})$, an image of a point light source (point image) which is at a position $(x_{M2}, y_{M2}, -f_3)$ as there is no positional deviation.

When, under the above parameter setting, the displacement of the gravity center position of the (1, −1, 0)-th order light which provides the light 7 to be caused upon the detecting means surface in response to a positional deviation $\Delta\sigma$ of the second object relative to the first object, is denoted by $S_{11}$ then it can be expressed as follows:

$$S_{11} = [1 - L/(f_1 - g)](x_{W1} - x_{M1} + \epsilon) + x_{M1} \tag{34}$$

Similarly, when the displacement of the gravity center position of the (−1, 1, 0)-th order light which provides the light 8 to be caused on the detecting means surface, is denoted by $S_{12}$ then it can be expressed as follows:

$$S_{12} = [1 - L/(f_3 - g)](x_{W2} - x_{M2} + \epsilon) + x_{M2} \quad (35)$$

Further, from the general relationship on lens imaging characteristics, it follows that:

$$x_{M0i} = x_{Mi} + f_{2i-1}\tan\theta \ (i=1, 2) \quad (36)$$

Also, $x_{Mi}$ and $x_{Wi}$ are the quantities that are determined by the angles of deflection, with respect to the chief ray of input light, of the alignment marks of the first and second objects as well as the focal lengths of these marks, respectively, and they are expressed as follows:

$$\begin{cases} x_{Mi} = f_{2i-1}\tan\phi_{2i-1} \\ x_{Wi} = f_{2i}\tan\phi_{2i} \end{cases} \quad (i=1, 2) \quad (37)$$

Here, $\zeta_j = \theta - \phi_j$ (j=1,4) defines the angle of deflection of each alignment mark with an incidence angle $\theta$.

Now, it is assumed that the center of the alignment mark of the first object is taken as an origin; the X axis is laid on the alignment mark surface along the direction with respect to which the positional deviation is to be detected; the Y axis is laid along a direction perpendicular to the X axis; and the Z axis is laid along a direction of a normal to the alignment mark surface. Also, it is assumed that $\theta_1 = -\theta_2$ and that the lights are projected symmetrically.

The detecting means has a light receiving zone with its center denoted by $(O, y_S, z_S)$ in the X-Y orthogonal coordinate system, and the light receiving zone has a rectangular shape of a size $d_1$ in the X direction and $d_2$ in the direction perpendicular thereto.

Considering the (1, −1, 0)-th order light, and if equation (36) is substituted into equations (34) and (35), then the displacements $S_{11}$ and $S_{12}$ of the light quantity gravity center positions of the first and second (signal) lights 7 and 8 are expressed as follows:

$$S_{11} = [1 - L/(f_1 - g)](f_2\tan\phi_2 - x_{M01} + f_1\tan\theta_1 + \epsilon) + x_{M01} - f_1\tan\theta_1 \quad (34')$$

$$S_{12} = [1 - L/(f_3 - g)](f_4\tan\phi_4 - x_{M02} - f_3\tan\theta_1 + \epsilon) + x_{M01} + f_3\tan\theta_1 \quad (35')$$

Here, the coordinate origin on the X axis is laid at the middle point between the alignment marks 5 and 6 on the first object (the middle of the segment connecting the centers of these alignment marks).

Figure 12:
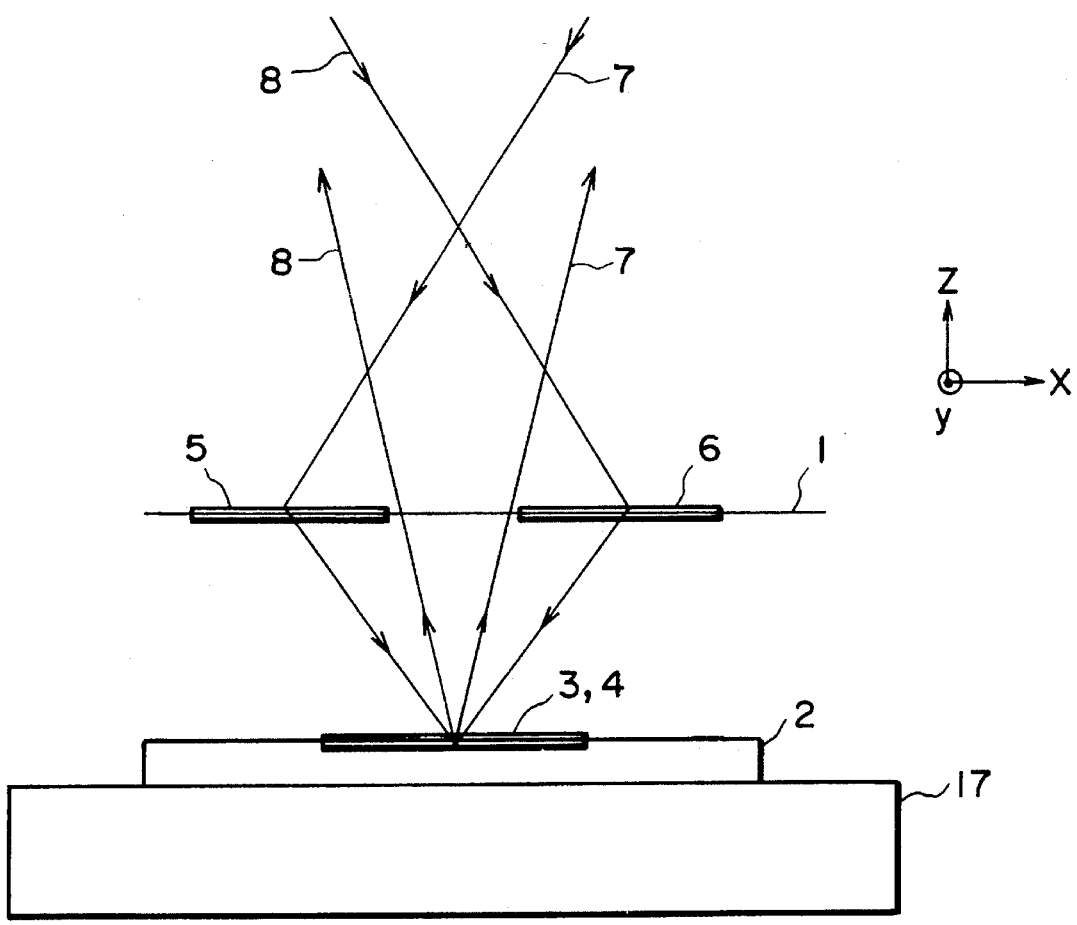
FIG. 12 is a schematic representation of a modified form of the third embodiment.

FIG. 12 is a schematic representation, showing a modified form of the third embodiment of the present invention.

In this embodiment, two alignment marks 3 and 4 provided on a second object (wafer) 2, are formed with overlapping, in a single and common region. This is effective to avoid a change, from a design value, of the relative distance in the X direction of the two, first and second lights 7 and 8 upon the first and second detecting means 11 and 12, which otherwise is caused by local inclination or waviness of the second object (wafer) 2 surface.

In addition, the advantageous effects as attainable with the third embodiment can be attained also in the present embodiment, by optical path designing for the first and second lights 7 and 8 in accordance with equations (31), (32) and (33).

This embodiment is so arranged that the first and second lights 7 and 8 emanating from the second object (wafer) 2 surface, are deflected and projected obliquely to the regions of the alignment marks 5 and 6 on the first object (mask) 1.

With the intersecting light paths for the input light, as a result of ray tracing simulation made by the inventors, it has been confirmed that a change in the relative distance of the first and second lights 7 and 8 upon the first and second detecting means 11 and 12, namely, a positional deviation measurement error, which otherwise is caused by a change in the spacing between the first and second objects or a change in the center position of the irradiation region as the light is projected to the first object, can be prevented satisfactorily.

As a matter of course, the third embodiment of the present invention can be applied to a proximity type semiconductor device manufacturing apparatus such as shown in FIGS. 5A–5C.

In accordance with the third embodiment of the present invention, for the detection of relative positional deviation of first and second objects, the angle or direction of incidence of each of two lights upon the first object as well as the location or size of each alignment mark are so set as to satisfy the conditions defined by equations (31), (32) and (33). This ensures the following advantageous effects:

(a) It is possible to avoid impingement and convergence, upon the light receiving zone of the detecting means, of diffraction light other than desired diffraction light (signal light) of predetermined order or orders.

(b) It is possible to avoid impingement, upon the light receiving zone of the detecting means, of edge scattered light from a circuit pattern, for example formed on the object surface.

(c) It is possible to suppress a positional deviation measurement error which otherwise is caused by a change in the spacing between the first and second objects, relative surface inclination of them or a change in the relative position of them in a direction perpendicular to the positional deviation detecting direction.

A position detecting system according to a fourth embodiment of the present invention is characterized in that: For detection of a relative positional deviation of first and second objects which are disposed opposed to each other, the first object is equipped with an alignment mark A1 having a wavefront converting function while the second object is equipped with an alignment mark B1 having a wavefront converting function, wherein the alignment mark B1 is formed in a region spaced from a region of the alignment mark A1 of the first object as projected onto the second object, with respect to a direction substantially perpendicular to the positional deviation detecting direction. Light is projected from a light projecting means onto the first object in an oblique direction, and light influenced by the wavefront converting functions of the alignment marks A1 and B1 of the first and second objects is directed to a predetermined plane. The positions of incidence of these lights upon that plane are detected through a detecting means and, by using an output signal from the detecting means, the positional deviation is detected.

In a preferred form of this embodiment of the present invention, two alignment marks A1 and A2 each having a wavefront converting function are provided on the first object, along the positional deviation detecting direction, while two alignment marks B1 and B2 each having a wavefront converting function are provided on the second object, along the positional deviation detecting direction and in a region spaced from a region of the alignment marks A1 and A2 of the first object as projected onto the second object, with respect to a direction substantially perpendicular to the positional deviation detecting direction. Of light from a light projecting means, first light as influenced by the wavefront converting functions of the alignment marks A1 and B1 of the first and second objects as well as second light as influenced by the wavefront converting functions of the alignment marks A2 and B2 of the first and second objects, are directed to a predetermined plane. The positions of incidence of the first and second lights on that plane are detected by detecting means and, by using an output signal from the detecting means, the positional deviation is detected.

In this aspect of the present invention, each of the alignment marks A1, A2, B1 and B2 comprises a physical optic element having an imaging function in the positional deviation detecting direction.

More specifically, in a preferred form of this embodiment of the present invention, when an object surface A provides the first object while an object surface B provides the second object, first and second (signal producing) alignment marks A1 and A2 each having a function of a physical optic element, are formed on the object surface A. Also, on the other object surface B, first and second (signal producing) alignment marks B1 and B2 similarly each having a function of a physical optic element, are formed.

Here, the region on the second object in which the two alignment marks B1 and B2 are formed, is spaced by a predetermined distance from a region of the two alignment marks A1 and A2 of the first object as projected onto the second object, with respect to a direction substantially perpendicular to the positional deviation detecting direction. The alignment marks B1 and B2 are formed in that region, along the positional deviation detecting direction.

Light is inputted to the alignment mark A1, and diffraction light caused thereby is inputted to the alignment mark B1. Diffraction light from the alignment mark B1 is incident on a predetermined plane, and the gravity center of the incident light on that plane is detected by a first detecting means as the position of incidence of the first signal light.

Here, the term "gravity center of light" means such a point that, when on a light receiving surface a position vector of each point on the surface is multiplied by the light intensity of that point and the thus obtained products are integrated over the entire surface, the integrated level has a "zero vector". However, as an alternative, the position of a peak point of the light intensity may be detected.

Similarly, light is inputted to the alignment mark A2, and diffraction light caused thereby is inputted to the alignment mark B2. A gravity center of diffraction light from the alignment mark B2, on a predetermined plane, is detected by a second detecting means as the position of incidence of the second signal light. By using two data from the first and second detecting means, the positioning of the objects A and B is executed. Here, various factors are so set that the (m', n', l')-th order light which causes a detection error factor to the (m, n, l)-th order light, is not received by the detecting means.

In this form of the present embodiment, the alignment marks A1, A2, B1 and B2 are so set that the gravity center position of the light incident on the first detecting means and the gravity center position of the light incident on the second detecting means, shift in opposite directions in response to a positional deviation between the objects A and B.

Figure 13:
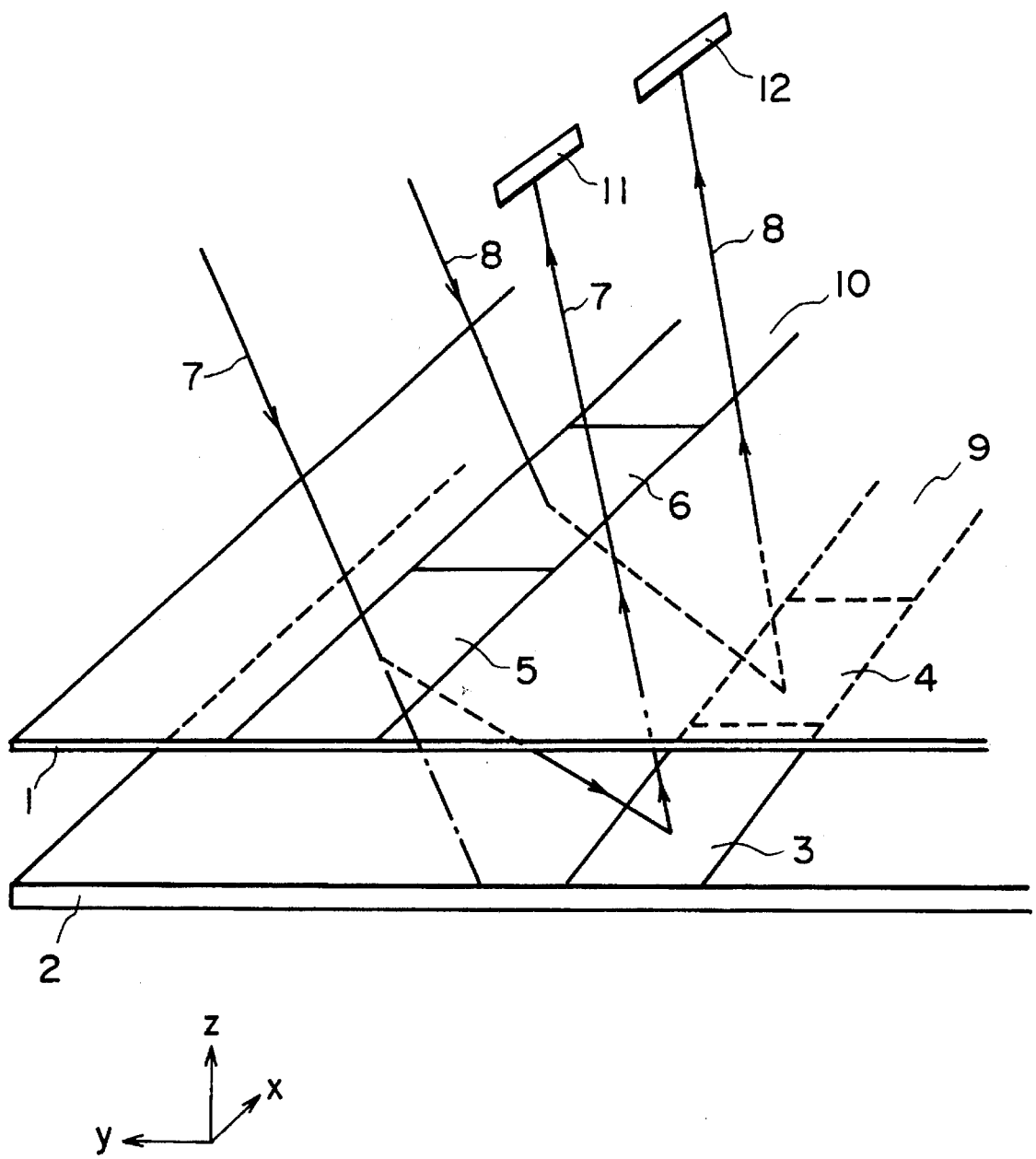
Figure 14:
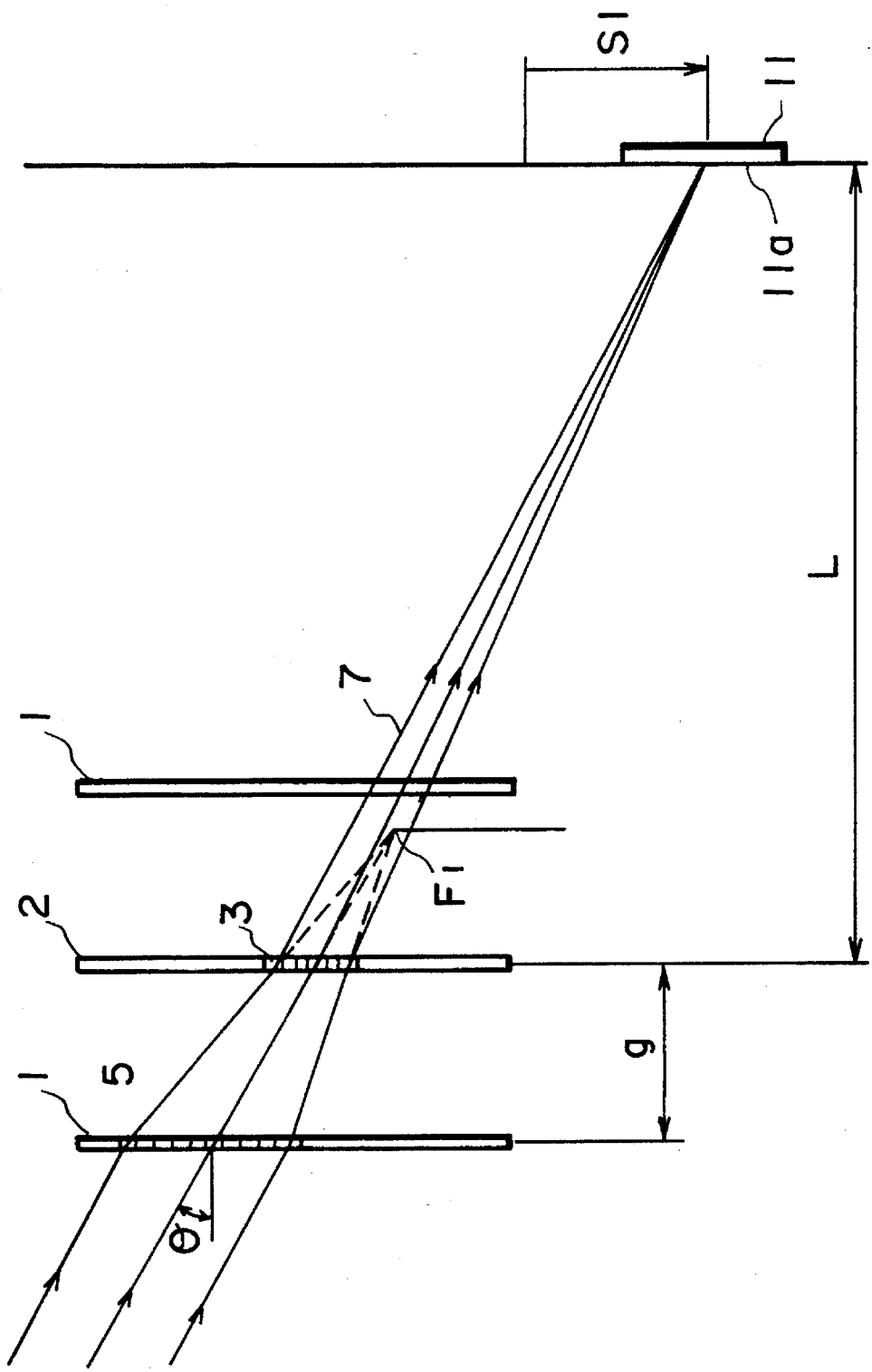

FIG. 13 is a perspective view of a major part of a fourth embodiment of the present invention. FIG. 14 shows, in an extended view, a portion of the FIG. 13 embodiment. FIG. 15 is a sectional view of the FIG. 13 embodiment, as seen in the X direction.

In these drawings, denoted at 1 is a first object (object surface A) which is a mask, for example, and denoted at 2 is a second object (object surface B) which is a wafer, for example. The illustrated embodiment is an example wherein a relative positional deviation of the first and second objects is to be detected.

Since in this embodiment the light passing through the first object 1 and being reflected by the second object 2 goes again through the first object 1, in FIG. 14 the first object is illustrated in duplication. Denoted at 5 and 3 are alignment marks which are provided on the first and second objects 1 and 2, respectively, for obtaining a first signal light. Similarly, denoted at 6 and 4 are alignment marks provided on the first and second objects 1 and 2, respectively, for obtaining a second signal light. In FIG. 14, the paths are illustrated with the alignment marks 3 and 4 being replaced by equivalent transmission type alignment marks.

Each of the alignment marks 3–6 comprises an optical member with a wavefront converting function which serves as a physical optic element such as, for example, a grating lens having a one-dimensional or two-dimensional lens function or a diffraction grating having no lens function.

The alignment marks 5 and 6 of the first object (mask) 1 are disposed along the positional deviation detecting direction (X direction). The alignment marks 3 and 4 of the second object (wafer) 2 are disposed in a region spaced, by a predetermined distance, from a region of the alignment marks 5 and 6 of the first object as being projected onto the second object 2 surface, with respect to a direction (Y direction) perpendicular to the positional deviation detecting direction, and they are disposed along the positional deviation detecting direction.

Each of the alignment marks 3–6 comprises a grating lens with a cylindrical power, for example, having an imaging function with respect to the positional deviation detecting direction (X direction). With respect to the Y direction, each mark may have or may not have an imaging function.

Denoted at 9 is a wafer scribe line and denoted at 10 is a mask scribe line. Each alignment mark is formed on the corresponding scribe line. Reference numerals 7 and 8 denote the first and second (alignment) signal lights, while reference numerals 7' and 8' denote (unwanted) diffraction lights of predetermined orders related to the first and second signal lights 7 and 8.

In this embodiment, the first signal light 7 is provided by a (1, −1, 0)-th order light; the second signal light 8 is provided by a (−1, 1, 0)-th order light; the light 7' is provided by a (0, −1, 1)-th order light; and the light 8' is provided by a (0, 1, −1)-th order light.

Denoted at 11 and 12 are first and second detecting means for detecting the first and second signal lights 7 and 8, respectively. Each of the first and second detecting means comprises a one-dimensional (linear) CCD sensor, for example, having its sensing elements arrayed in the X-axis direction.

For convenience in explanation, the optical distance from the second object 2 to the first detecting means 11 or the second detecting means 12 is denoted by L. Further, g denotes the distance between the first and second objects 1 and 2; $f_{a1}$ and $f_{a2}$ denote the focal lengths of the alignment marks 5 and 6; $\Delta\sigma$ denotes the relative positional deviation of the first and second objects 1 and 2; and $S_1$ and $S_2$ denote displacements of the gravity center positions of the first and second signal lights on the first and second detecting means, respectively, at that time, from the positions as assumed under correct alignment. Conveniently, the alignment light inputted to the object 1 is a plane wave. The signs are such as illustrated.

Each of the displacements $S_1$ and $S_2$ can be determined geometrically as a point of intersection between (i) the light receiving surface of the first (or second) detecting means 11 or 12 and (ii) the straight line that connects the focal point $F_1$ ($F_2$) of the alignment mark 5 (6) and the optical axis center of the alignment mark 3 (4). Therefore, the opposability in direction of the displacements $S_1$ and $S_2$ of the gravity centers of these lights, responsive to a relative positional deviation of the first and second objects 1 and 2, is attainable by applying an inversive relationship to the signs of optical imaging magnifications of the alignment marks 3 and 4.

In this embodiment, examples that can be used as a light source are: a light source such as a semiconductor laser, a He-Ne laser, an Ar laser or the like that can emit a coherent light; and a light source such as a light emitting diode or the like that can emit an incoherent light.

In this embodiment, as shown in FIG. 13, the (1, -1, 0)-th order light which is the light 7 as well as the (-1, 1, 0)-th order light which is the light 8, are those lights: which are incident upon the alignment marks 5 and 6, respectively, on the mask 1 surface each at a predetermined angle; which are then transmissively diffracted by these marks and then reflectively diffracted by the alignment marks 3 and 4 on the wafer 2 surface, respectively; and which are then incident on the detecting means 11 and 12, respectively. On the other hand, the (0, -1, 1)-th order light which is the light 7' as well as the (0, 1, -1)-th order light which is the light 8', are those lights: which are transmitted at zero-th order by the alignment marks 5 and 6 on the mask 1; which are then reflectively diffracted by the alignment marks 3 and 4 on the wafer 2 surface, respectively; and which are then transmissively diffracted by the alignment marks 5 and 6 on the mask 1 surface and incident on the detecting means 11 and 12.

The gravity center positions of the first and second alignment lights, respectively, incident on the respective detecting means are detected and, by using output signals from the detecting means 11 and 12, any positional deviation of the mask 1 and the wafer 2 can be detected.

Here, in an orthogonal coordinate system wherein the X-axis is laid on the positional deviation detecting direction, the Z-axis is laid on a normal to the first object and the Y-axis is laid on a direction perpendicular to the X and Z axes, the angle of incidence of the light (alignment signal light) upon the first object 1 surface, in the Y-Z plane, is denoted by $\theta$.

On this occasion, the alignment mark disposition in the Y direction perpendicular to the positional deviation detecting direction (X direction) is so set that, within the positional deviation measurement range after the prealignment operation, as shown in FIG. 15, the central position of the alignment marks 3 and 4 of the second object 2 is always deviated by a predetermined distance dy, with respect to the alignment marks 5 and 6 of the first object, in a direction (Y direction) perpendicular to the positional deviation detecting direction, this being done so as to avoid impingement of zero-th order light transmitted through the alignment marks 5 and 6 of the first object 1 upon the alignment marks 3 and 4 of the second object 2. The distance dy is a parameter to be determined depending upon the width of each alignment mark in the Y direction and the incidence angle $\theta$. In this embodiment, the distance dy is so determined as to avoid generation of the (0, -1, 1)-th order diffraction light 7' and the (0, 1, -1)-th order diffraction light 8' but to allow impingement of only the (1, -1, 0)-th order light 7 and the (-1, 1, 0)-th order light 8 upon the detecting means 11 and 12.

More specifically, in FIG. 15, the distance dy may be determined from the condition that, of the light transmitted at zero-th order through the first object 1, the light diffracted at negative first order by a positive Y-direction side edge e in the Y-Z section of the alignment marks 3 and 4 of the second object 2 does not impinge on the region of the alignment marks 5 and 6 on the first object 1 surface.

Namely, if the widths in the Y direction of the alignment marks 5 and 3 of the first and second objects are denoted by $Wy^M$ and $Wy^W$, the center positions of the alignment marks 5 and 3 of the first and second objects, respectively, in the Y direction, are denoted by $yO^M$ and $yO^W$, and the pitches (constant) of the alignment marks of the first and second objects, in the Y direction, are denoted by $P_M$ and $P_W$, then the position e of the edge of the alignment mark can be expressed as:

$$e = yO^W + 0.5 Wy^W \qquad (41)$$

Thus, the condition to be detected is:

$$yO^M - 0.5 Wy^M > e + g\tan\phi \qquad (42)$$

wherein $\phi$ is the emission angle in the Y-Z plane of the negative first order diffraction light, with respect to a normal to the second object 2 surface, and it can be determined in accordance with a diffraction condition such as follows:

$$P_W(\sin\theta + \sin\phi) = \lambda \qquad (43)$$

Since from the definition the distance dy is given by $dy = yO^M - yO^W$, from equations (41) and (42) the condition related to the distance dy is given by:

$$dy > 0.5(Wy^M + Wy^W) + g\tan\phi$$

Assuming now that the measurement range for a positional deviation $\Delta\sigma$, in each of the X and Y directions, is:

$$-\epsilon_1 < \Delta\sigma < \epsilon_1 (\epsilon_1 > 0) \qquad (44)$$

then, the distance dy is changeable such as follows:

$$dy^0 - \epsilon_1 < dy < dy^0 + \epsilon_1 \qquad (45)$$

wherein $dy^0$ is a quantity as assumed when $\Delta\sigma = 0$, and $dy^0 \neq 0$.

It is seen therefrom that the condition to be satisfied within the positional deviation measurement range is:

$$dy > 0.5(Wy^M + Wy^W) + g\tan\phi + \Delta\sigma \qquad (42')$$

In this embodiment, the alignment mark disposition is so determined as to satisfy the conditions given by equations (42') and (43) and, by doing so, only the (1, -1, 0)-th order light and the (-1, 1, 0)-th order light can be received by the detecting means and unwanted crosstalk with the (0, -1, 1)-th order light or the (0, 1, -1)-th order light can be avoided.

The fourth embodiment of the present invention is applicable to a proximity type semiconductor device manufacturing exposure apparatus such as shown in FIGS. 5A–5C.

FIG. 16 is a schematic view showing a modified form of the fourth embodiment of the present invention.

In this example, for the detection of a positional deviation in the X direction, only the (0, -1, 1)-th order light is detected through the detecting means 11 as the alignment light 7, while only the (0, 1, -1)-th order light is detected through the detecting means 12 as the alignment light 8, and the angle of incidence of the light from an unshown light source as well as the disposition of the alignment marks 3–6 in the Y-Z plane are set accordingly.

Each of the alignment marks 3–6 has an imaging function with respect to the X direction.

In this embodiment, the alignment light 7 (8) is projected from a light projecting means (not shown) obliquely only the mask 1 surface, at a predetermined angle in the Y-Z plane. In the drawing, the light is projected to a region on the mask 1 surface in which the alignment mark 5 (6) is not present. The light passed (transmitted at zero-th order) through the mask 1 is reflectively diffracted by the alignment mark 3 (4) on the wafer 2 surface and, then, it is diffracted by the alignment mark 5 (6) on the mask 1 surface. The thus diffracted light 7 (8) is detected by the detecting means 11 (12).

By using parameter expression similar to that in the fourth embodiment, the conditions in the present embodiment can be given by the following simultaneous equations:

$$e' + g\tan\zeta < yO^W - 0.5 Wy^W \tag{36}$$

$$e' = yO^M + 0.5 Wy^M \tag{37}$$

$$P_M(\sin\theta + \sin\zeta) = \lambda \tag{38}$$

From equations (36) and (37), the condition to be satisfied by $dy = yO^M - yO^W$, under no positional deviation, is:

$$dy < -0.5(Wy^M + Wy^W) - g\tan\zeta$$

If the positional deviation measurement range is defined in accordance with equation (34), as in the fourth embodiment, then the condition to be satisfied by the distance dy within the range of equation (34) is:

$$dy < -0.5(Wy^M + Wy^W) - g\tan\zeta - \epsilon_1 \tag{39}$$

By setting beforehand the locations of the alignment marks of the first and second objects in accordance with equation (39), it is possible to assure that only the (0, −1, 1)-th order diffraction light and the (0, 1, −1)-th order diffraction light are detected by the detecting means as the positional deviation signal lights.

While in these embodiments the phenomenon that the spacing in the X direction of the gravity center positions on two light detecting means changes in proportion to the relative positional deviation in the X direction of a first object (mask) and a second object (wafer) is used, and the change in the spacing is detected. However, the present invention is not limited to this. As an example, the invention is applicable also to an arrangement wherein the relative positional deviation of the mask and the wafer is detected on the basis of a proportional relationship between (i) the quantity of deviation of the gravity center position of the diffraction light upon a single detecting means, from a preset reference position thereon, and (ii) the quantity of relative positional deviation of the mask and the wafer.

Further, the system may be modified so that the two signal lights are received by a common detecting means.

A position detecting system according to a fifth embodiment of the present invention is characterized in that: For detection of a relative positional deviation of a first and second object which are disposed opposed to each other, the first object is equipped with two alignment marks A1 and A1' each having a wavefront converting function which marks are provided along a direction substantially perpendicular to the positional deviation detecting direction, while the second object is equipped with an alignment mark B1 having a wavefront converting function. Of light from a light projecting means, the light as influenced by a transmissive type wavefront converting function of the alignment mark A1 of the first object, as influenced by the reflective type wavefront converting function of the alignment mark B1 of the second object and then as influenced by a transmission type wavefront converting function of the alignment mark A1' of the first object, is directed to a predetermined plane. The position of incidence of the light on that plane is detected through a detecting means and, by using an output signal from the detecting means, the positional deviation is detected.

In one aspect, this embodiment of the present invention is characterized in that: Various features are so set that the alignment mark B1 is positioned in a region outside a region in which the light, of the light from the light projecting means, as inputted to the alignment mark A1' of the first object and influenced by the transmission type wavefront converting function thereof, is inputted to the second object. Or, the region in which the light, of the light from the light projecting means, as inputted to the alignment mark A1' of the first object and influenced by a transmission type wavefront converting function thereof impinges on the second object, overlaps the region of the second object in which the alignment mark B1 is formed, and the area of such an overlapping region is not greater than 30% of the region in which the alignment mark B1 is formed. Various factors are so set.

More specifically, in a preferred form of this embodiment of the present invention, when an object surface A provides the first object while an object surface B provides the second object, first and second signal producing alignment marks A1, A1' and A2, A2' each having a function of a physical optic element, are formed on the object surface A. Also, on the other object surface B, first and second signal producing alignment marks B1 and B2 similarly each having a function of a physical optic element, are formed.

Here, the first signal producing alignment marks A1 and A1' are provided along a direction substantially perpendicular to the positional deviation detecting direction. Similarly, the second signal producing alignment marks A2 and A2' are provided along a direction substantially perpendicular to the positional deviation detecting direction.

Parallel light having a Gaussian intensity distribution is inputted to the alignment mark A1, and diffraction light caused thereby is inputted to the alignment mark B1. Diffraction light from the alignment mark B1 is inputted to the alignment mark A', and diffraction light therefrom is incident on a predetermined plane. The gravity center of the incident light on that plane is detected by a first detecting means as the position of incidence of the first signal light.

Here, the term "gravity center of light" means such a point that, when on a light receiving surface a position vector of each point on the surface is multiplied by the light intensity of that point and the thus obtained products are integrated over the entire surface, the integrated level has a "zero vector". However, as an alternative, the position of a peak point of the light intensity may be detected.

Similarly, light is inputted to the alignment mark A2, and diffraction light caused thereby is inputted to the alignment mark B2. Then, reflective diffraction light from the mark B2 is inputted to the alignment mark A2'. A gravity center of diffraction light from the alignment mark A2', on a predetermined plane, is detected by a second detecting means as the position of incidence of the second signal light. By using two data from the first and second detecting means, the positioning of the objects A and B is executed. Here, various parameters are so set that the (m', n', l')-th order light which causes a detection error factor to the (m, n, l)-th order light, is not received by the detecting means.

In this form of the present embodiment, the alignment marks A1, A1', A2, A2', B1 and B2 are so set that the gravity center position of the light incident on the first detecting means and the gravity center position of the light incident on the second detecting means, shift in opposite directions in response to a positional deviation between the objects A and B.

Figure 17:
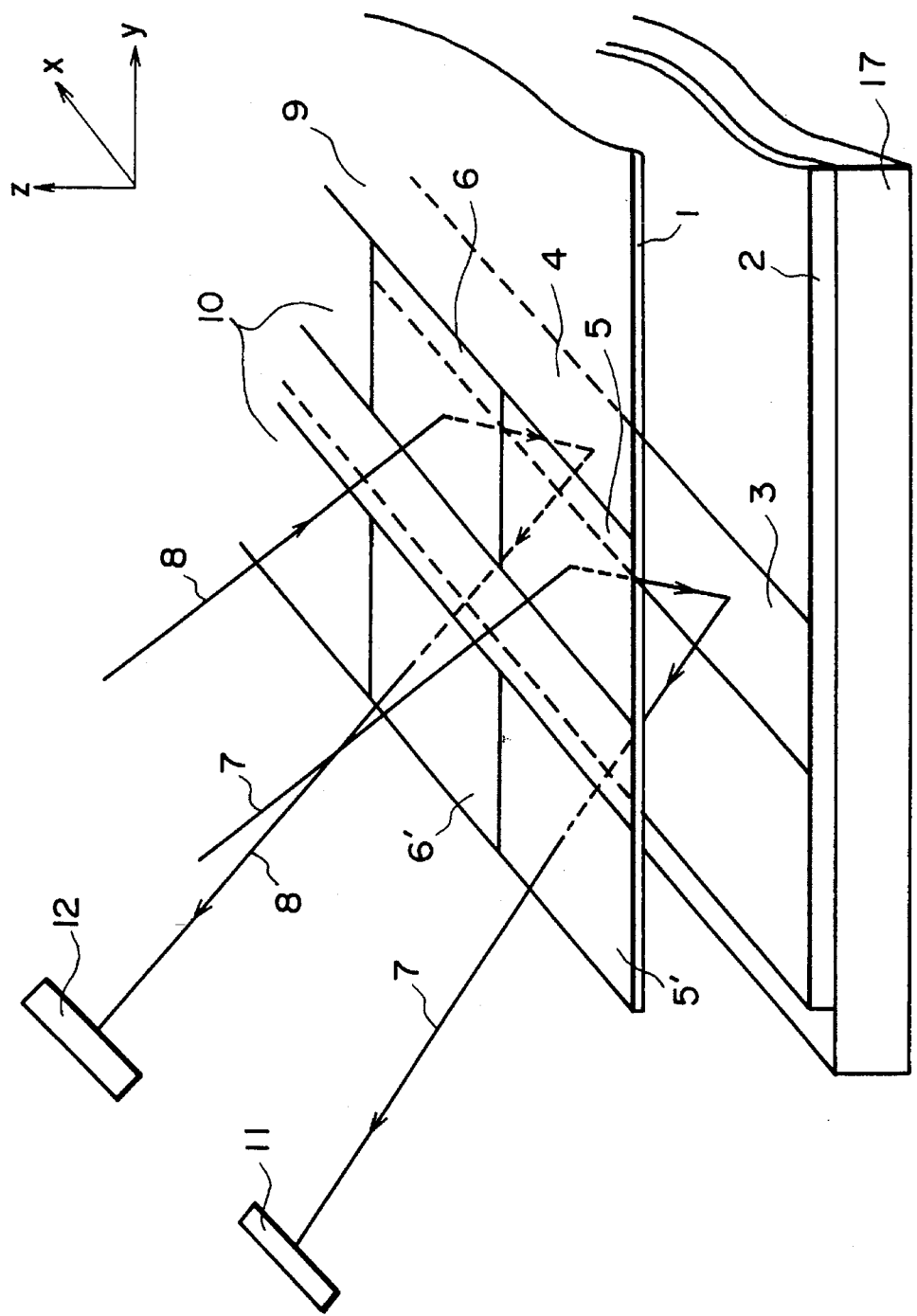
FIGS. 17, 18, 19 and 20 are schematic representations of a fifth embodiment of the present invention.
Figure 18:
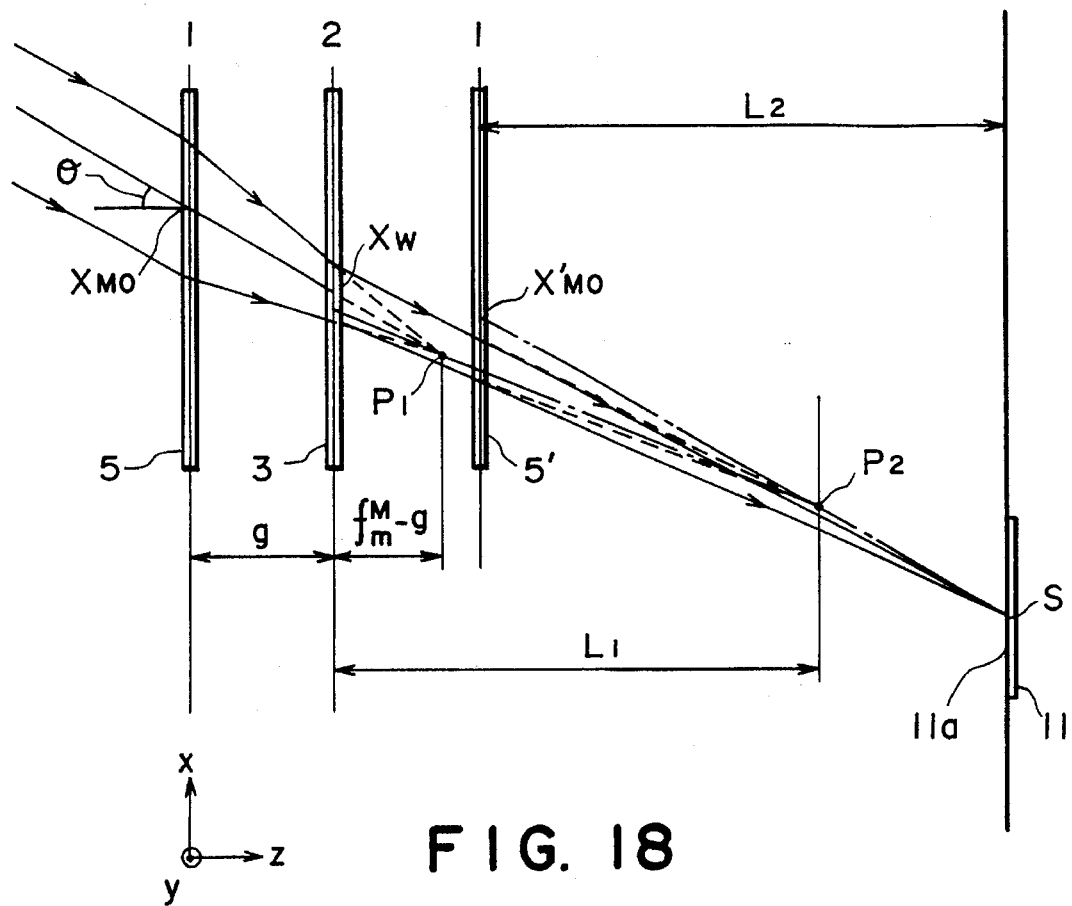
Figure 19:
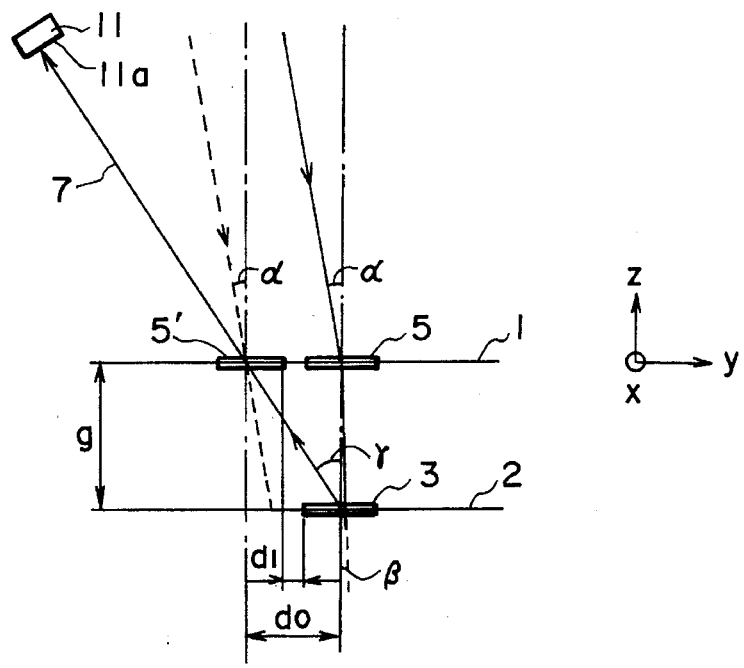

FIG. 17 is a perspective view of a major part of the fifth embodiment of the present invention. FIG. 18 illustrates, in an extended view, a portion of the FIG. 17 embodiment. FIG. 19 is a schematic view of a major part of the FIG. 17 embodiment, as seen in the X direction.

In these drawings, denoted at 1 is a first object (object surface A) which is a mask, for example, and denoted at 2 is a second object (object surface B) which is a wafer, for example. The illustrated embodiment is an example wherein a relative positional deviation of the first and second objects is to be detected.

Since in this embodiment the light passing through the first object 1 and being reflected by the second object 2 goes again through the first object 1, in FIG. 18 the first object is illustrated in duplication. Denoted at 5, 5' and 3 are alignment marks which are provided on the first and second objects 1 and 2, respectively, for obtaining a first signal light. Similarly, denoted at 6, 6' and 4 are alignment marks provided on the first and second objects 1 and 2, respectively, for obtaining a second signal light. In FIG. 18, the paths are illustrated with the alignment marks 3 and 4 being replaced by equivalent transmission type alignment marks.

Each of the alignment marks 3–6' comprises an optical member with a wavefront converting function which serves as a physical optic element such as, for example, a grating lens having a one-dimensional or two-dimensional lens function or a diffraction grating having no lens function.

The alignment marks 5 and 5' are disposed along a direction (Y direction) substantially perpendicular to the positional deviation detecting direction (X direction). Similarly, the alignment marks 6 and 6' are disposed along a direction (Y direction) substantially perpendicular to the positional deviation detecting direction (X direction). Here, the X direction coincides with a wafer scribe line direction.

In the present embodiment, each alignment mark of the first and second objects has an imaging function in the X direction. With respect to a direction perpendicular thereto, it may have or it may not have an imaging function.

Denoted at 9 is a wafer scribe line and denoted at 10 is a mask scribe line. Each alignment mark is formed on the corresponding scribe line. Reference numerals 7 and 8 denote the first and second (alignment) signal lights, while reference numerals 7' and 8' denote (unwanted) diffraction lights of predetermined orders related to the first and second signal lights 7 and 8.

Denoted at 11 and 12 are first and second detecting means for detecting the first and second signal lights 7 and 8, respectively. Each of the first and second detecting means comprises a one-dimensional (linear) CCD sensor, for example, having its sensing elements arrayed in the X-axis direction.

Since the optical actions of the first and second signal lights 7 and 8 are substantially the same and they are handled substantially in the same manner, description will be made only with regard to the first signal light 7.

In FIG. 18, the spacing between the first object (which hereinafter also will be referred to as a "mask") 1 and the second object (which hereinafter also will be referred to as a "wafer") 2 is denoted by g, the distance from the second object 2 to the convergent point P2 as defined by the alignment mark 3 of the second object 2 is denoted by $L_1$ and the distance from the first object 1 to the first detecting means 11 is denoted by $L_2$.

Assuming now that the focal length of a mask alignment mark corresponding to i-th order diffraction light is $fi^M$ and similarly the focal length of a wafer alignment mark 3 corresponding to j-th order diffraction light is $fj^W$, then from the effective gravity center position of the (m, n, l)-th order light, the positional deviation detecting magnification β upon the detection surface 11a of the detecting means 11 for the (m, n, l)-th order light, is given by:

$$\beta = [1 - L/(f_m^M - g)][L_2/(L_1 - g)] \tag{51}$$

where $L_1$ is given by:

$$1/(f_m^M - g) + 1/L_1 = -1/f_n^W \tag{52}$$

Here, the position S of incidence of the (m, n, l)-th order light on the detecting means surface 11a is expressed by using the incidence angle θ of light in the X-Z plane and the X-axis center positions $x_{M0}$, $x_{M0}'$ and $x_W$ of the alignment marks 5, 3 and 5', as follows:

$$S = \{(x_{M0} - f_m^M \tan\theta - x_W)[L_1/(f_m^M - g)] + \tag{53}$$
$$x_W - x_{M0}'\} \times L_2/(L_1 - g) + -x_{M0}'$$

Assuming now that the (m, n, l)-th order light is imaged on the detecting means surface 11a, then $L_2$ is given by:

$$1/(L_1 - g) + 1/L_2 = -1/f_l^M \tag{54}$$

Also, if the focal length of the mask alignment mark corresponding to the positive first order diffraction light is denoted by $f1^M$, then generally the focal length $fl^M$ ($fm^M$) can be expressed as:

$$fl^M = f1^M/l \tag{55}$$

Assuming now that $x_{M0} - x_W =$ and if equation (52) is substituted into equation (53), it follows that:

$$S = [L_1/(f_m^M - g) - 1][L_2/(L_1 - g)]\epsilon + \epsilon_0$$

$$\epsilon_0 = [-L_1/(f_m^M - g)f_m^M \tan\theta - x^{M0}{}' + x_{M0}] \cdot L_2/(L_1 - g) + x_{M0}' \tag{53'}$$

Here, if equation (52) is substituted into the positional deviation sensitivity β as given by equation (51), then it follows that:

$$\beta = \left( \frac{-1}{f_m^M - g} \times \frac{1}{\frac{1}{f_m^M - g} + \frac{1}{f_n^W} - 1} \right) \times \tag{51'}$$

$$\left( \frac{-1}{\frac{1}{f_m^M - g} + \frac{1}{f_n^W}} - g \right)$$

$$= \left( \frac{1}{1 + \frac{f_m^M - g}{f_n^W}} + 1 \right) \times \frac{L_2}{\frac{f_n^W(f_m^M - g)}{f_m^M - g + f_n^W} + g}$$

$$= \frac{(2f_n^W + f_m^M - g)L_2}{f_n^W \times f_m^M + g(f_m^M - g)}$$

If the distance $L_1$ as given by equations (54) and (52) is substituted into the distance $L_2$, then:

$$L_2 = -\cfrac{1}{\cfrac{1}{L_1-g}+\cfrac{1}{f_1^M}} \qquad (56)$$

$$= -\left\{\cfrac{1}{\cfrac{1}{-\left(\cfrac{1}{\cfrac{1}{f_m^M-g}+\cfrac{1}{f_n^W}}\right)-g}+\cfrac{1}{f_1^M}}\right\}$$

$$= \cfrac{f_1^M\{f_n^W(f_m^M-g)+g(f_m^M+f_n^W-g)\}}{f_1^M(f_m^M+f_n^W-g)-f_n^W(f_m^M-g)-g(f_m^M+f_n^W-g)}$$

The positional deviation sensitivity β as obtainable by substituting equation (56) into equation (51'), is determined by $fm^M$, $fn^W$, $fl^M$ and g.

However, on an occasion when the detection surface 11a may not be disposed on the imaging plane, from equation (51'), it is determined by $fm^M$, $fn^W$, g and $L_2$.

Next, description will be made of the path of the first signal light 7, for the positional deviation detection in this embodiment.

In the present embodiment, the light 7 diffracted or wavefront-converted three times, by two alignment marks 5 and 5' of the first object 1 and one alignment mark 3 of the second object 2, is used as the positional deviation detecting light. Generally, in a diffraction system wherein light is diffracted three times, finally two lights having different diffraction histories emanate in the same direction.

Figure 20:
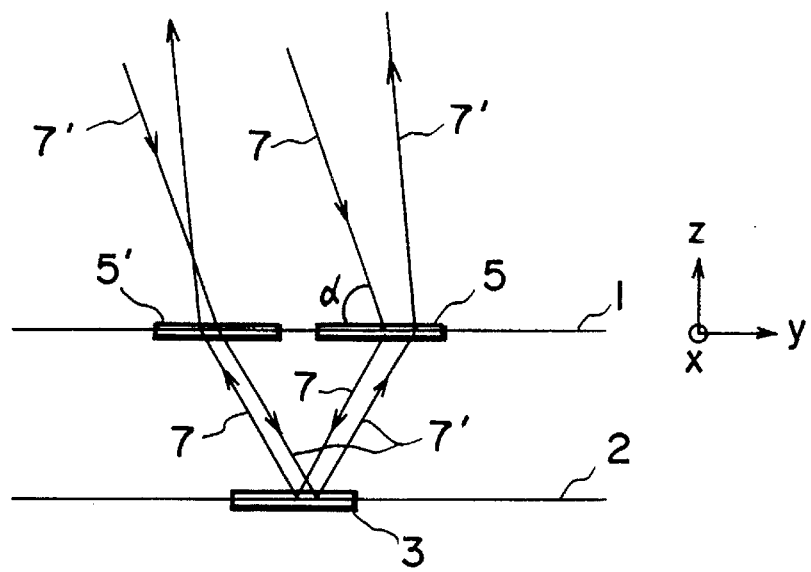

More specifically, as shown in FIG. 20, alignment marks 5 and 5' are formed on the first object 1 while an alignment mark 3 is formed on the second object 2. By way of example, as the first signal light 7, the (m, n, l)-th order light as projected onto the first object 1 at an angle α and diffracted at m-th order by the alignment mark 5, at n-th order by the alignment mark 3 and at l-th order by the alignment mark 5', is used.

In response thereto, the (l, n, m)-th order light 7' diffracted at l-th order by the alignment mark 5' of the first object 1, at n-th order by the alignment mark 3 of the second object 2 and at m-th order by the alignment mark 5 of the first object 1, emanates from the first object 1 in the same direction as the first signal light 7.

In the present embodiment, in order to prevent degradation of the signal-to-noise ratio of the signal light 7 due to impingement of the diffraction light 7' upon the detection surface or to suppress generation of crosstalk resulting from interference or the like of the lights 7 and 7', optimization is made with regard to the location of each alignment mark and its diffraction angle, such as shown in FIG. 18.

More particularly, the pair of alignment marks 5 and 5' of the first object 1 and the pair of alignment marks 6 and 6' are disposed along a direction (Y direction) perpendicular to the positional deviation detecting direction (X direction), and each alignment mark is provided by a cylindrical grating lens having an imaging function only in the X direction.

Further, the alignment marks 5, 3, 6 and 4 each has a mark pattern which is configured so that it serves as a grating element of constant pitch in the Y direction.

The alignment marks 5' and 6' each is provided by a grating lens of linear zone plate type, having no light deflecting function in the Y-Z section. When the grating pitch of the alignment mark in the Y-Z section, namely, the section in which it has no imaging function, is denoted by $P_1$ and $P_2$, for the alignment marks 5 and 3, and by $P_3$ and $P_4$, for the alignment marks 6 and 4, and when the signal light is provided by the (−1, 1, −1)-th order light produced as a result of impingement of light upon the first object surface at an angle α and diffraction through these alignment marks at negative first order by the alignment mark 5 (6), at positive first order by the alignment marks 3 (4) and at negative first order by the alignment mark 5' (6'), in this order, if the angles of lights in the Y-Z plane emanating from the alignment marks 5, 3, 6 and 4 are denoted by β($P_1$), β($P_3$), γ($p_2$) and γ($P_4$), with respect to a normal to the first object, then the following relations are obtained:

$$g\tan\alpha < d_1 \qquad (57)$$

$$g\tan\gamma \cong d_0 \qquad (58)$$

wherein $d_0$ is the distance in the Y direction between the centers of the alignment marks 5 and 5' (6 and 6'), and $d_1$ is the distance (measured in the Y direction) between opposed edges of the alignment marks 3 and 5' (4 and 6').

In order to adopt the disposition shown in FIG. 19, it is desirable that the angle β is made small while the angle γ is made larger than the incidence angle α. For example, in the present embodiment, if α=5 deg., the first signal light has an angle β=30 deg., the second signal light has an angle β=36 deg. and the spacing between the first and second objects is equal to 30 microns, then:

$$d_1 > 2.63 \text{ microns}$$

On the other hand, the distance $d_{11}$ in the Y direction between the centers of the first signal light producing alignment marks 3 and 5 is given from equation (58), as follows:

$$d_1 \cong 17.32 \text{ microns}$$

Similarly, the distance $d_{12}$ in the Y direction between the centers of the second signal light producing alignment marks 4 and 6 is:

$$d_{12} \cong 21.80 \text{ microns}$$

In the present embodiment, for each of the first and second signal lights 7 and 8, the angle β=0 deg. is adopted.

Equation (57) is a condition for avoiding impingement of the light 7' upon the detection surface, when in FIG. 20 the light 7 is used as the first signal light. Equation (58) is a condition related to the size and location of each alignment mark for assuring efficient impingement of the first signal light 7 upon the detection surface.

In the present embodiment, by setting various factors such as described hereinbefore, the position of incidence of the first signal light 7 (second signal light 8) can be detected without being affected by the light 7' (light 8').

The present embodiment is applicable also to a proximity type semiconductor device manufacturing exposure apparatus such as shown in FIGS. 5A–5C.

Figure 21:
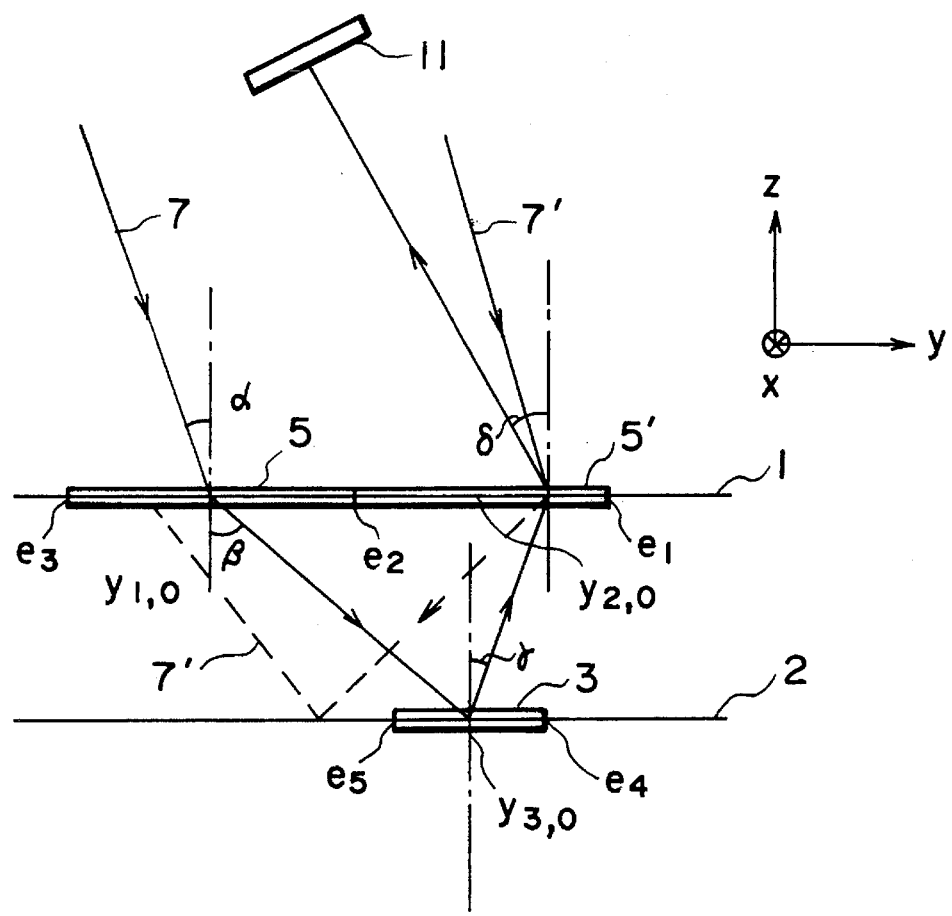
FIG. 21 is a schematic representation of a modified form of the fifth embodiment.

FIG. 21 is a schematic view of a major part of a modified form of the fifth embodiment of the present invention.

In this example, like the fifth embodiment, for obtaining a first signal light 7, two alignment marks 5 and 5' each comprising a physical optic element are provided on the first object (mask) 1, while one alignment mark 3 comprising a physical optic element is provided on the second object (wafer) 2.

Similarly, for obtaining a second signal light 8, two alignment marks 6 and 6' (not shown) each comprising a physical optic element are provided on the first object 1, while one alignment mark 4 (not shown) comprising a physical optic element is provided on the second object 2. Each alignment mark has an imaging function in the X direction, and is provided by a cylindrical type lens element having a light deflecting function in the Y direction.

The production of the light 7' which is an unwanted diffraction light in relation to the first signal light 7, is reduced. For example, the location and size of each alignment mark in the Y-Z plane as well as the light paths, particularly, the diffraction angle of each alignment mark, are so set that the quantity of the light 7' becomes not greater than 1/20 of the quantity of the first signal light 7.

With this arrangement, the effect of the light 7' which is an unwanted diffraction light in relation to the first signal light 7, in the positional deviation detection, is reduced.

To this end, in the present embodiment, various factors are set such as follows: It is now assumed that the positional deviation detecting direction lies in the X direction, that in the Y-Z plane light is incident on the first object at an angle $\alpha$ with respect to a normal thereto, and that the first signal light 7 having a path such as shown in FIG. 21 is incident on the detecting means 11 which may comprise a CCD or accumulation type photoelectric transducer element. Here, the orders of diffraction by the alignment marks are such that the light is diffracted at m-th order by the alignment mark 5, at n-th order by the alignment mark 3 and at l-th order by the alignment mark 5'. Namely, it is the (m, n, l)-th order light. Similarly, the light 7' which is unwanted diffraction light is expressed as the (m', n', l')-th order light, as diffracted at m'-th order by the alignment mark 5', at n'-th order by the alignment mark 3 and at l'-th order by the alignment mark 5.

Here, the factors are so set that the area of overlapping region between the region in which the (m', n', l')-th order light 7' impinges on the second object 2 surface and the region in which the alignment mark 3' is formed, becomes not greater than 30% of the area of the region of the alignment mark 3'. This assures that the intensity of the light 7' is reduced to one-third or lower of the intensity of the light 7.

In the present embodiment, the (1, 1, −1)-th order light is used as the first signal light 7 and, in consideration of the off-axis imaging characteristics as given by equation (51') of the wavefront converting characteristics of the grating lens patterns of the alignment marks 5, 5' and 3, the optical system is arranged so that the predetermined imaging plane provides the detection surface.

It is now assumed that, from the relationship with regard to the location and size of each alignment mark, only a weak light 7' is produced. If so, the light 7' which can impinge and converge on the light receiving zone of the detection surface in response to the (1, 1, −1)-th order light which is the first signal light is the (−1, 1, 1)-th order light. Thus, generally, in response to the (m, n, l)-th order light, the (l, n, m)-th order light impinges and converges upon the detection surface.

Each alignment mark has an imaging characteristic in the X direction, but it has no imaging function in the Y direction. Totally, it has a light deflecting function for changing the emission angle of the light toward a predetermined direction.

It is now assumed that the grating pitches (regular) of the alignment marks 5, 5' and 3 in the Y direction are $P_1$, $P_1'$ and $P_2$, that the emission angle in the Y-Z plane of the light 7 from the alignment mark 5 is $\beta$, as shown in FIG. 21, that the emission angle from the alignment mark 3 is $\gamma$, and that the emission angle from the alignment mark 5' is $\delta$. Also, it is assumed that the center coordinate positions of the alignment marks 5, 5' and 3 in the Y direction are $Y_{1.0}$, $Y_{2.0}$ and $Y_{3.0}$, and that the boundary positions of them in the Y direction are $e_1, e_2, \ldots$ and $e_5$, as illustrated.

Here, $e_2$ is the contact boundary position of the alignment marks 5 and 5'. If the spacing between the first and second objects 1 and 2 in the Z direction is g, then the emission angle $\gamma'$ of the light 7 from the alignment mark 5' is expressed in the following relation:

$$\sin\gamma' = \sin\alpha - \lambda/P_1' \tag{59}$$

Also, the condition for avoiding impingement of a portion of the light 7', emanating from the boundary $e_1$ portion of the alignment mark 5', upon the alignment mark 3 forming region on the second object, is given by:

$$e_1 - g\tan\gamma' < e_5 \tag{60}$$

If the above inequality is satisfied, all the negative first order diffraction light 7' emanating from the region in which the alignment mark 5' is present, does not impinge on the region on the second object in which the alignment mark 3 is present, as seen from FIG. 21. Thus, equation (60) represents the condition for suppressing production of the light 7'.

Also, the condition for assuring efficient impingement of the light 7, emanating from the alignment mark 5, upon the alignment mark 3 is:

$$g\tan\beta + y_{1.0} \cong y_{3.0} \tag{61}$$

Also, the condition for assuring efficient impingement of the light 7, emanating from the alignment mark 3, upon the alignment mark 5' is:

$$g\tan\gamma + y_{3.0} \cong y_{2.0} \tag{62}$$

Equations (61) and (62) are the conditions with which, when the system is structured so that, as the light 7 is wavefront converted by the object surfaces totally, the region of incidence of the light upon each alignment mark is defined about an axis of the center of each alignment mark, any light directed outwardly of such an alignment mark region is minimized. Namely, these equations are the conditions related to the location and size of each alignment mark as well as the optical path designing, necessary for assuring efficient transmission of a wavefront and, thus, for enhancing the quantity of light impinging on the detection surface.

While in these embodiments the phenomenon that the spacing in the X direction of the gravity center positions on two light detecting means changes in proportion to the relative positional deviation in the X direction of a first object (mask) and a second object (wafer) is used, and the change in the spacing is detected. However, the present invention is not limited to this. As an example, the invention is applicable also to an arrangement wherein the relative positional deviation of the mask and the wafer is detected on the basis of a proportional relationship between (i) the quantity of deviation of the gravity center position of the diffraction light upon a single detecting means, from a preset reference position thereon, and (ii) the quantity of relative positional deviation of the mask and the wafer.

While the invention has been described with reference to the structures disclosed herein, it is not confined to the details set forth and this application is intended to cover such modifications or changes as may come within the purposes of the improvements or the scope of the following claims.

What is claimed is:

1. A method of detecting a relative positional deviation of a first object having a first grating mark with an optical power and a second object having a second grating mark with an optical power, wherein a projected radiation beam is diffracted by the first and second grating marks in sequence and, on the basis of a position of convergence on a light receiving surface of plural diffraction beams produced by the diffraction through the first and second grating marks and including a signal beam having been diffracted at a predetermined order by each of the first and second grating marks, the relative positional deviation is determined, said method comprising the steps of:

providing the signal beam by a predetermined diffraction beam, which is diffracted at an l-th order by the first grating mark, diffracted at an m-th order by the second grating mark and diffracted at an n-th order by the first grating mark, and providing the predetermined diffraction beam by a beam diffracted at an l'-th order by the first grating mark, diffracted at an m'-th order by the second grating mark and diffracted at an n'-th order by the first grating mark, wherein n and l' are equal to zero and l and n' have positive signs and m and m' have negative signs, or wherein n and l' are equal to zero and l and n' have negative signs and m and m' have positive signs;

defining a detection zone on the light receiving surface;

converging the signal beam upon the detection zone, the signal beam displacing on the detection zone in a particular direction in response to a relative positional deviation of the first and second objects; and setting the conditions of the first and second grating marks to substantially prevent the predetermined diffraction beam from being converged upon the detection zone, the predetermined diffraction beam also displacing in the particular direction in response to a relative positional deviation of the first and second objects.

2. A method according to claim 1, wherein the signal beam is a beam diffracted at a positive first order by the first grating mark, diffracted at a negative first order by the second grating mark and diffracted at a zero-th order by the first grating mark, and the predetermined diffraction beam is a beam diffracted at a zero-th order by the first grating mark, diffracted at a negative first order by the second grating mark and diffracted at a positive first order by the first grating mark.

3. A method according to claim 2, wherein the predetermined diffraction beam includes a portion having a relatively low intensity, which portion is incident on the detection zone, and wherein an unwanted beam includes a portion having a relatively high intensity, which portion is incident on a region other than the detection zone.

4. A method according to claim 2, wherein the predetermined diffraction beam is not incident on the light receiving surface.

5. A method according to claim 4, further comprising preventing production of the predetermined diffraction beam.

6. A method according to claim 1, wherein the predetermined diffraction beam is incident in a defocused state upon a relatively wide region including the detection zone.

7. A method according to claim 1, wherein the signal beam is a beam diffracted at a negative first order by the first grating mark, diffracted at a positive first order by the second grating mark and diffracted at a zero-th order by the first grating mark, and the predetermined diffraction beam is a beam diffracted at a zero-th order by the first grating mark, diffracted at a positive first order by the second grating mark and diffracted at a negative first order by the first grating mark.

8. A method according to claim 7, wherein the predetermined diffraction beam includes a portion having a relatively low intensity, which portion is incident on the detection zone, and wherein an unwanted beam has a portion having a relatively high intensity, which portion is incident on a region other than the detection zone.

9. A method according to claim 7, wherein the predetermined diffraction beam is not incident on the light receiving surface.

10. A method according to claim 9, further comprising preventing production of the predetermined diffraction beam.

11. A method according to claim 7, wherein the predetermined diffraction beam is incident in a defocused state upon a relatively wide region including the detection zone.

12. A method according to claim 1, wherein the signal beam is a beam diffracted at a zero-th order by the first grating mark, diffracted at a negative first order by the second grating mark and diffracted at a positive first order by the first grating mark, and the predetermined diffraction beam is a beam diffracted at a positive first order by the first grating mark, diffracted at a negative first order by the second grating mark and diffracted at a zero-th order by the first grating mark.

13. A method according to claim 12, wherein the predetermined diffraction beam includes a portion having a relatively low intensity, which portion is incident on the detection zone, and wherein an unwanted beam includes a portion having a relatively high intensity, which portion is incident on a region other than the detection zone.

14. A method according to claim 12, wherein the predetermined diffraction beam is not incident on the light receiving surface.

15. A method according to claim 14, further comprising preventing production of the predetermined diffraction beam.

16. A method according to claim 12, wherein the predetermined diffraction beam is incident in a defocused state upon a relatively wide region including the detection zone.

17. A method according to claim 1, wherein the signal beam is a beam diffracted at a zero-th order by the first grating mark, diffracted at a positive first order by the second grating mark and diffracted at a negative first order by the first grating mark, and the predetermined diffraction beam is a beam diffracted at a negative first order by the first grating mark, diffracted at a positive first order by the second grating mark and diffracted at a zero-th order by the first grating mark.

18. A method according to claim 17, wherein the predetermined diffraction beam includes a portion having a relatively low intensity, which portion is incident on the detection zone, and wherein an unwanted beam includes a portion having a relatively high intensity, which portion is incident on a region other than the detection zone.

19. A method according to claim 17, wherein the predetermined diffraction beam is not incident on the light receiving surface.

20. A method according to claim 19, further comprising preventing production of the predetermined diffraction beam.

21. A method according to claim 17, wherein the predetermined diffraction beam is incident in a defocused state upon a relatively wide region including the detection zone.

22. A method of detecting a relative positional deviation of a first object having a first grating mark with an optical power and a second object having a second grating mark with an optical power, wherein a projected radiation beam is diffracted by the first and second grating marks in sequence and, on the basis of a position of convergence on a light receiving surface of plural diffraction beams produced by the diffraction through the first and second grating marks and including a signal beam having been diffracted at a predetermined order by each of the first and second grating marks, the relative positional deviation is determined, said method comprising the steps of:

providing the signal beam by a predetermined diffraction beam, which is diffracted at an l-th order by the first grating mark, diffracted at an m-th order by the second grating mark and diffracted at an n-th order by the first grating mark, and providing the predetermined diffraction beam by a beam diffracted at an l'-th order by the first grating mark, diffracted at an m'-th order by the second grating mark and diffracted at an n'-th order by the first grating mark, wherein n and l' are equal to zero and l and n' have positive signs and m and m' have negative signs, or wherein n and l' are equal to zero and l and n' have negative signs and m and m' have positive signs;

defining a detection zone on the light receiving surface;

converging the signal beam upon the detection zone, the signal beam displacing on the detection zone in a particular direction in response to a relative positional deviation of the first and second objects; and setting the conditions of the first and second grating marks to cause the predetermined diffraction beam to have an intensity sufficiently smaller than that of the signal beam, the predetermined diffraction beam also displacing in the particular direction in response to a relative positional deviation of the first and second objects.

23. A method according to claim 22, wherein the signal beam is a beam diffracted at a zero-th order by the first grating mark, diffracted at a positive first order by the second grating mark and diffracted at a negative first order by the first grating mark, and the predetermined diffraction beam is a beam diffracted at a negative first order by the first grating mark, diffracted at a positive first order by the second grating mark and diffracted at a zero-th order by the first grating mark.

24. A method according to claim 22, wherein the signal beam is a beam diffracted at a zero-th order by the first grating mark, diffracted at a negative first order by the second grating mark and diffracted at a positive first order by the first grating mark, and the predetermined diffraction beam is a beam diffracted at a positive first order by the first grating mark, diffracted at a negative first order by the second grating mark and diffracted at a zero-th order by the first grating mark.

25. A method according to claim 22, wherein the signal beam is a beam diffracted at a positive first order by the first grating mark, diffracted at a negative first order by the second grating mark and diffracted at a zero-th order by the first grating mark, and the predetermined diffraction beam is a beam diffracted at a zero-th order by the first grating mark, diffracted at a negative first order by the second grating mark and diffracted at a positive first order by the first grating mark.

26. A method according to claim 22, wherein the signal beam is a beam diffracted at a negative first order by the first grating mark, diffracted at a positive first order by the second grating mark and diffracted at a zero-th order by the first grating mark, and the predetermined diffraction beam is a beam diffracted at a zero-th order by the first grating mark, diffracted at a positive first order by the second grating mark and diffracted at a negative first order by the first grating mark.

27. A method according to claim 22, wherein the predetermined diffraction beam has an intensity not higher than one-third of the intensity of the signal beam.

28. A microdevice manufacturing method usable with a mask having a first grating mark with an optical power and a wafer having a second grating mark with an optical power, wherein a projected radiation beam is diffracted by the first and second grating marks in sequence and, on the basis of a position of convergence on a light receiving surface of plural diffraction beams produced by the diffraction through the first and second grating marks and including a signal beam having been diffracted at a predetermined order by each of the first and second grating marks, a relative positional deviation of the mask and the wafer is determined, and wherein, a pattern of the mask is printed on the wafer for microdevice manufacture, said method comprising the steps of:

providing the signal beam by a predetermined diffraction beam, which is diffracted at an l-th order by the first grating mark, diffracted at an m-th order by the second grating mark and diffracted at an n-th order by the first grating mark, and providing the predetermined diffraction beam by a beam diffracted at an l'-th order by the first grating mark, diffracted at an m'-th order by the second grating mark and diffracted at an n'-th order by the first grating mark, wherein n and l' are equal to zero and l and n' have positive signs and m and m' have negative signs, or wherein n and l' are equal to zero and l and n' have negative signs and m and m' have positive signs;

defining a detection zone on the light receiving surface;

converging the signal beam upon the detection zone, the signal beam displacing on the detection zone in a particular direction in response to a relative positional deviation of the first and second objects; and setting the conditions of the first and second grating marks to cause the predetermined diffraction beam to have an intensity sufficiently smaller than that of the signal beam, the predetermined diffraction beam also displacing in the particular direction in response to a relative positional deviation of the first and second objects.

29. A microdevice manufacturing method usable with a mask having a first grating mark with an optical power and a wafer having a second grating mark with an optical power, wherein a projected radiation beam is diffracted by the first and second grating marks in sequence and, on the basis of a position of convergence on a light receiving surface of plural diffraction beams produced by the diffraction through the first and second grating marks and including a signal beam having been diffracted at a predetermined order by each of the first and second grating marks, a relative positional deviation of the mask and the wafer is determined, and wherein, after correction of the relative positional deviation, a pattern of the mask is printed on the wafer for microdevice manufacture, said method comprising the steps of:

providing the signal beam by a predetermined diffraction beam, which is diffracted at an l-th order by the first grating mark, diffracted at an m-th order by the second grating mark and diffracted at an n-th order by the first grating mark, and providing the predetermined diffraction beam by a beam diffracted at an l'-th order by the first grating mark, diffracted at an m'-th order by the second grating mark and diffracted at an n'-th order by the first grating mark, wherein n and l' are equal to zero and l and n' have positive signs and m and m' have negative signs, or wherein n and l' are equal to zero and l and n' have negative signs and m and m' have positive signs;

defining a detection zone on the light receiving surface;

converging the signal beam upon the detection zone, the signal beam displacing on the detection zone in a particular direction in response to a relative positional deviation of the first and second objects; and setting the conditions of the first and second grating marks to substantially prevent the predetermined diffraction beam from being converged upon the detection zone, the predetermined diffraction beam also displacing in the particular direction in response to a relative positional deviation of the first and second objects.

* * * * *

UNITED STATES PATENT AND TRADEMARK OFFICE
CERTIFICATE OF CORRECTION

PATENT NO. : 5,481,363
DATED : January 2, 1996
INVENTOR(S) : Masakazu MATSUGU, et al.

It is certified that error appears in the above-indentified patent and that said Letters Patent is hereby corrected as shown below:

COLUMN 6:

Line 39, "Which" should read --which--.

COLUMN 9:

Line 66, "describe" should read --described--.

COLUMN 10:

Line 64, "$-3.0 \leq \Delta\sigma \leq,$" should read -- $-3.0 \leq \Delta\sigma \leq 3.0,$ --.

COLUMN 11:

Line 2, "the" should read --the conditions--;
Line 4, "$S_2$" should read --$S_{22}$--.

UNITED STATES PATENT AND TRADEMARK OFFICE
CERTIFICATE OF CORRECTION

PATENT NO. : 5,481,363
DATED : January 2, 1996
INVENTOR(S) : Masakazu MATSUGU, et al.

It is certified that error appears in the above-indentified patent and that said Letters Patent is hereby corrected as shown below:

COLUMN 16:

In Equation (15-1'),

" $= \dfrac{f_1^M}{l'} - \dfrac{(f_1^M/l')^2}{\dfrac{f_1^M}{l'} \ \dfrac{\dfrac{f_1^W}{n'}\left(\dfrac{f_1^M}{m'} - g\right)}{\dfrac{f_1^W}{n'} + \dfrac{f_1^M}{m'} - g} - g}$ " should read -- $= \dfrac{f_1^M}{l'} - \dfrac{(f_1^M/l')^2}{\dfrac{f_1^M}{l'} - \dfrac{\dfrac{f_1^W}{n'}\left(\dfrac{f_1^M}{m'} - g\right)}{\dfrac{f_1^W}{n'} + \dfrac{f_1^M}{m'} - g} - g}$ --;

UNITED STATES PATENT AND TRADEMARK OFFICE
CERTIFICATE OF CORRECTION

PATENT NO. : 5,481,363
DATED : January 2, 1996
INVENTOR(S) : Masakazu MATSUGU, et al.

It is certified that error appears in the above-indentified patent and that said Letters Patent is hereby corrected as shown below:

<u>COLUMN 16</u>: (Cont.)

In Equation (15-1"), $$"\left(\frac{f_1^W}{n} + \frac{f_1^W}{m'} - g\right) - \frac{f_1^W}{n}\left(\frac{f_1^W}{m'} - g\right)"\text{ should read}$$

$$--\left(\frac{f_1^W}{n} + \frac{f_1^M}{m'} - g\right) - \frac{f_1^W}{n}\left(\frac{f_1^M}{m'} - g\right)--; \text{ and}$$

In Equation (15-1'''), $$"\left(\frac{f_1^W}{n} + \frac{f_1^W}{m} - g\right) - \frac{f_1^W}{n}\left(\frac{f_1^W}{m} - g\right)"\text{ should read}$$

$$--\left(\frac{f_1^W}{n} + \frac{f_1^M}{m} - g\right) - \frac{f_1^W}{n}\left(\frac{f_1^M}{m} - g\right)--.$$

UNITED STATES PATENT AND TRADEMARK OFFICE
CERTIFICATE OF CORRECTION

PATENT NO. : 5,481,363
DATED : January 2, 1996
INVENTOR(S) : Masakazu MATSUGU, et al.

It is certified that error appears in the above-indentified patent and that said Letters Patent is hereby corrected as shown below:

COLUMN 26:

Line 50, "lights 7" should read --light 7--.

COLUMN 38:

In Equation (53'),

" $\epsilon_o = [-L_1/(fm^M - g) fm^M \tan\theta - x^{MO'} + x_{MO}] \cdot L_2/(L_1 - g) + x_{MO}'$ "

should read

-- $\epsilon_o = [-L_1/(fm^M - g) fm^M \tan\theta - x_{MO'} + x_{MO}] \cdot L_2/(L_1 - g) + x_{MO}'$ --; and

UNITED STATES PATENT AND TRADEMARK OFFICE
CERTIFICATE OF CORRECTION

PATENT NO. : 5,481,363
DATED : January 2, 1996
INVENTOR(S) : Masakazu MATSUGU, et al.

It is certified that error appears in the above-indentified patent and that said Letters Patent is hereby corrected as shown below:

COLUMN 38: (Cont.)

In Equation (51'),

" $\beta = \left( -\dfrac{1}{f_m^M - g} \times \dfrac{1}{\dfrac{1}{f_m^M - g} + \dfrac{1}{f_n^W} - 1} \right) \times$ " should read -- $\beta = \left( -\dfrac{1}{f_m^M - g} \times \dfrac{1}{\dfrac{1}{f_m^M - g} + \dfrac{1}{f_n^W}} - 1 \right) \times$ --.

Signed and Sealed this

Thirtieth Day of July, 1996

Attest:

BRUCE LEHMAN

Attesting Officer

Commissioner of Patents and Trademarks